(12) United States Patent
Guerra et al.

(10) Patent No.: US 8,673,399 B2
(45) Date of Patent: Mar. 18, 2014

(54) BANDGAP-SHIFTED SEMICONDUCTOR SURFACE AND METHOD FOR MAKING SAME, AND APPARATUS FOR USING SAME

(75) Inventors: John M. Guerra, Concord, MA (US);
Lukas M. Thulin, Arlington, MA (US);
Amol N. Chandekar, Lowell, MA (US)

(73) Assignee: Nanoptek Corporation, Concord, MA (US)

( * ) Notice: Subject to any disclaimer, the term of this patent is extended or adjusted under 35 U.S.C. 154(b) by 1132 days.

(21) Appl. No.: 12/136,716

(22) Filed: Jun. 10, 2008

(65) Prior Publication Data

US 2008/0299697 A1    Dec. 4, 2008

Related U.S. Application Data

(63) Continuation-in-part of application No. 10/424,259, filed on Apr. 26, 2003, now Pat. No. 7,485,799.

(60) Provisional application No. 60/380,169, filed on May 7, 2002.

(51) Int. Cl.
*H01L 31/0224* (2006.01)

(52) U.S. Cl.
USPC ............. 427/309; 205/50; 205/171; 205/322; 252/62.2; 438/57

(58) Field of Classification Search
USPC ............. 427/309; 205/50, 171, 322; 252/62.2
See application file for complete search history.

(56) References Cited

U.S. PATENT DOCUMENTS

| | | | |
|---|---|---|---|
| 2,874,102 A * | 2/1959 | Wainer | 205/50 |
| 4,181,754 A * | 1/1980 | McKinzie et al. | 427/74 |
| 4,269,170 A | 5/1981 | Guerra | |
| 4,511,638 A | 4/1985 | Sapru et al. | |
| 4,528,252 A | 7/1985 | Yamazaki | |
| 4,545,646 A | 10/1985 | Chern et al. | |
| 5,306,915 A | 4/1994 | Matthews | |
| 5,327,375 A * | 7/1994 | Harari | 365/149 |
| 5,482,570 A | 1/1996 | Saurer et al. | |

(Continued)

FOREIGN PATENT DOCUMENTS

| JP | 55-002742 | 1/1980 |
|---|---|---|
| KR | 2007-0118064 | 12/2007 |

OTHER PUBLICATIONS

Bart J. Van Zeghbroeck, 1997, Chapter 4.8 (Photodiodes and Solar Cells) and Chapter Section 2.2.5 (Temperature and stress dependence of the energy bandgap) no date.

(Continued)

*Primary Examiner* — Timothy Meeks
*Assistant Examiner* — Nathan T Leong
(74) *Attorney, Agent, or Firm* — David J. Cole

(57) ABSTRACT

Titania is a semiconductor and photocatalyst that is also chemically inert. With its bandgap of 3.2 and greater, to activate the photocatalytic property of titania requires light of about 390 nm wavelength, which is in the ultra-violet, where sunlight is very low in intensity. A method and devices are disclosed wherein stress is induced and managed in a thin film of titania in order to shift and lower the bandgap energy into the longer wavelengths that are more abundant in sunlight. Applications of this stress-induced bandgap-shifted titania photocatalytic surface include photoelectrolysis for production of hydrogen gas from water, photovoltaics for production of electricity, and photocatalysis for detoxification and disinfection.

15 Claims, 33 Drawing Sheets

(56) References Cited

U.S. PATENT DOCUMENTS

| | | | |
|---|---|---|---|
| 5,578,140 | A | 11/1996 | Yogev et al. |
| 5,705,082 | A * | 1/1998 | Hinson .................. 216/95 |
| 5,910,940 | A | 6/1999 | Guerra |
| 5,964,962 | A | 10/1999 | Sannomiya et al. |
| 6,037,289 | A * | 3/2000 | Chopin et al. .................. 502/2 |
| 6,071,570 | A * | 6/2000 | Hardee et al. .................. 205/67 |
| 6,072,117 | A | 6/2000 | Matsuyama et al. |
| 6,107,563 | A | 8/2000 | Nakanishi et al. |
| 6,291,763 | B1 | 9/2001 | Nakamura |
| 6,563,041 | B2 | 5/2003 | Sugawara et al. |
| 6,623,615 | B1 | 9/2003 | Morisawa et al. |
| 6,969,472 | B2 | 11/2005 | Vezenov et al. |
| 2001/0038881 | A1 * | 11/2001 | Welsch et al. .................. 427/79 |
| 2002/0045073 | A1 * | 4/2002 | Finley .................. 428/701 |
| 2005/0217717 | A1 | 10/2005 | Faris |
| 2006/0172484 | A1 | 8/2006 | Chung et al. |

OTHER PUBLICATIONS

J. G. Mavroides et al., "Photoelectrolysis of water in cells with SrTiO3 anodes," Applied Physics Letters, vol. 28, No. 5, Mar. 1, 1976.

A. Fujishima and K. Honda, "Electrochemical Photolysis of Water at a Semiconductor Electrode", Nature 238, 37 (1972) no month.

O. Khaselev and J. Turner, "A Monolithic Photovoltaic-Photoelectrochemical Device for Hydrogen Production via Water Splitting," Science, vol. 280, Apr. 17, 1998.

P. J. Sebastian et al., "Electrodeposited CIS and CIGS thin film photocatalysts for hydrogen production by photoelectrolysis" no date.

Guerra, J. M., Photon tunneling microscopy applications, in MRS Proceedings vol. 332, M. Sarikaya et al. (eds.), p. 457 (1994).

Guerra, J.M. et al, "Embedded nano-optic media for near-field high density optical data storage: modeling, fabrication, and performance," Proceedings, Optical Data Storage Conference, SPIE, Apr. 2001.

Guerra, J. M. et al, "Near-field optical recording without low-flying heads," ISOM Technical Digest, Taipei, 2001 no month.

Guerra, J. M. et al, "Near-field optical recording without low-flying heads: Integral Near-Field Optical (INFO) Media," Jap J. Appl. Physics, vol. 41, p. 1866 (2002) no month.

J. M. Bennett et al, "Comparison of the properties of titanium dioxide films prepared by various techniques," Appl. Opt. 28, 3303-3317 (1989).

H.T. Tien et al., "Hydrogen generation from water . . . ", Current Topics in Biophysics, 2000, 25(1), 39-60 no month.

T. Gerfin, M. Graetzel and L. Walder, Molecular and Supramolecular Surface Modification of Nanocrystalline TiO2 films: Charge-Separating and Charge-Injecting Devices, Progr. lnorg. Chem., 44, 345-393 (1997).

Lalanne et al., "Design, Fabrication and Characterization of Subwavelength Periodic Structures for Semiconductor Anti-Reflection Coating in the Visible Domain", Proceedings of SPIE, vol. 2776, Developments in Optical Component Coatings, Ian Reid, Editor, Aug. 1996, pp. 300-309.

M.E. Law and S. Cea, Continuum based modeling of silicon integrated circuit processing: An object oriented approach, Comp. Mater. Sci. 12, 289 (1998).

B. E. Deal and S. Grove, General Relationship for the thermal oxidation of silicon, J. Appl. Phys. 36, 3770 (Dec. 1965).

International Search Report for International Application PCT/US2009/046531.

* cited by examiner

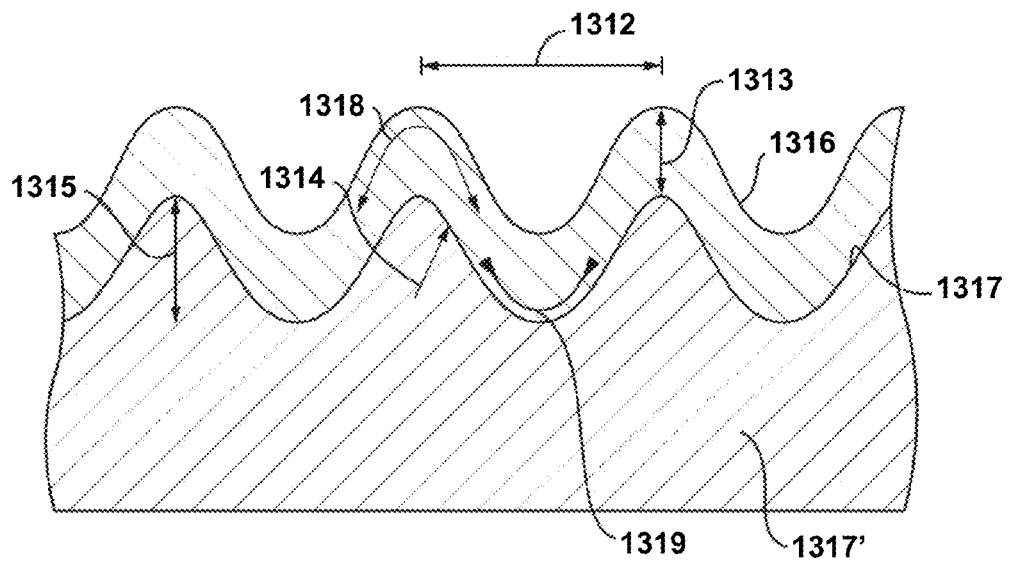
Fig. 13A
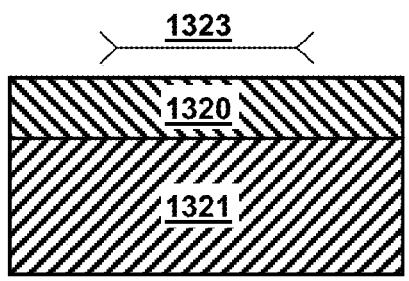 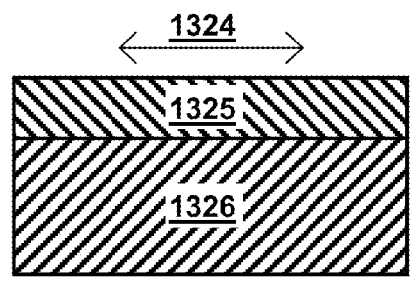
Fig. 13B          Fig. 13C

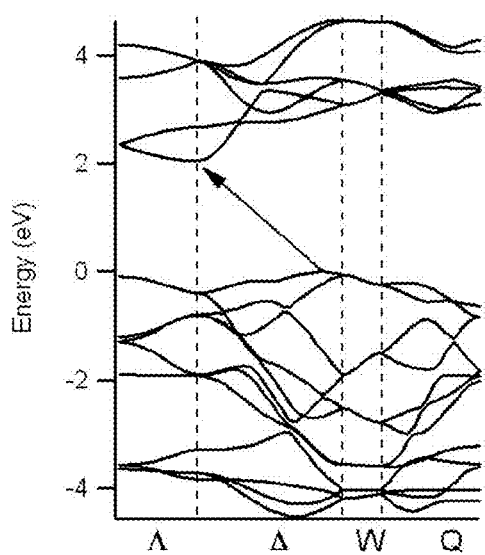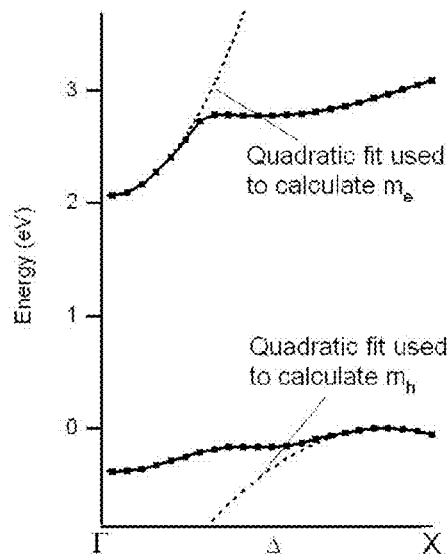
Fig. 16A                Fig. 16B
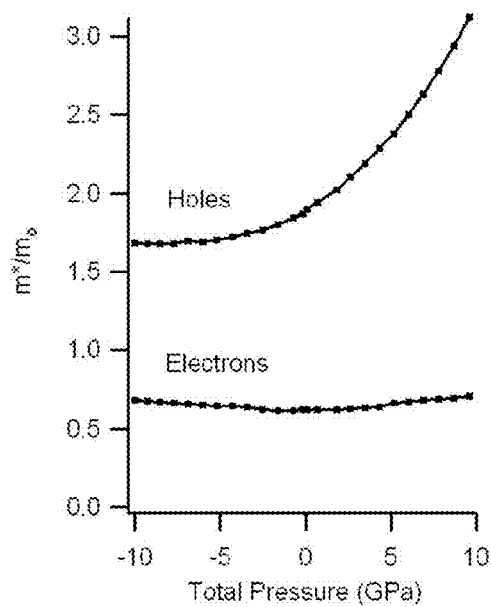
Fig. 17

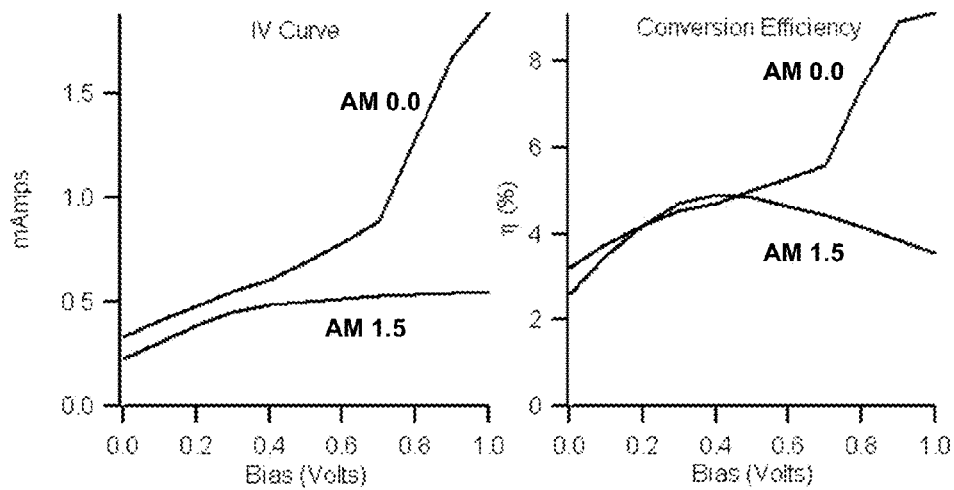
Fig. 32A  Fig. 32B
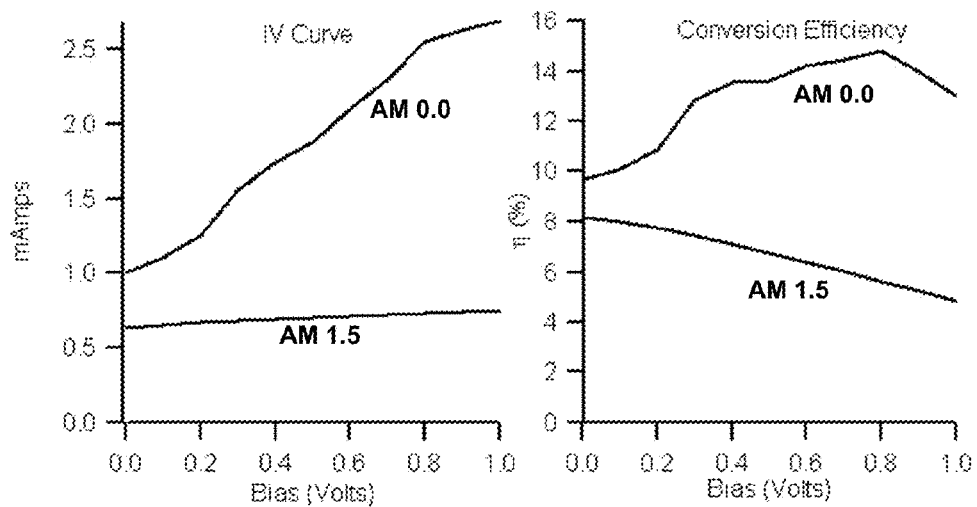
Fig. 32C  Fig. 32D

BANDGAP-SHIFTED SEMICONDUCTOR SURFACE AND METHOD FOR MAKING SAME, AND APPARATUS FOR USING SAME

REFERENCE TO RELATED APPLICATIONS

This application is a continuation-in-part of copending application Ser. No. 10/424,259, filed Apr. 26, 2003 (Publication No. 2003/0228727), which claims benefit of Provisional Application Ser. No. 60/380,169, filed May 7, 2002. The entire disclosures of both these applications are herein incorporated by reference.

BACKGROUND OF INVENTION

This invention relates to a bandgap-shifted semiconductor surface, and a method for making same. This invention also relates to photocatalytic surfaces used in the process of photoelectrolysis, photovoltaics, and photocatalysis, and more specifically to induction and management of stress in a thin titania film photocatalytic surface to match the band gap of the titania more efficiently with the solar spectrum at the earth's surface for photoelectrolysis, photovoltaics, and photocatalysis.

For general background information relating to this invention see:

1. www.colorado.edu/~bart/book/solar.htm: Bart J. Van Zeghbroeck, 1997, Chapter 4.8 (Photodiodes and Solar Cells) and Chapter Section 2.2.5 (Temperature and stress dependence of the energy bandgap).
2. J. G. Mavroides, J. A. Kafalas, and D. F. Kolesar, "Photoelectrolysis of water in cells with $SrTiO_3$ anodes," Applied Physics Letters, Vol. 28, No. 5, 1 Mar. 1976, and references therein.
3. A. Fujishima and K. Honda, Nature, 238, 37 (1972)
4. O. Khaselev and J. Turner, "A Monolithic Photovoltaic-Photoelectrochemical Device for Hydrogen Production via Water Splitting," Science, Vol. 280, 17 Apr. 1998.
5. P. J. Sebastian, M. E. Calixto, and R. N. Bhattacharya, Electrodeposited CIS and CIGS thin film photocatalysts for hydrogen production by photoelectrolysis.
6. T. Gerfin, M. Graetzel and L. Walder, Progr. Inorg. Chem., 44, 345-393 (1997), Molecular and Supramolecular Surface Modification of Nanocrystalline $TiO_2$ films: Charge-Separating and Charge-Injecting Devices.
7. Guerra, J. M., Storage Medium Having a Layer of Micro-Optical Lenses Each Lens Generating an Evanescent Field, U.S. Pat. No. 5,910,940, Jun. 8, 1999.
8. Guerra, J. M., Adsorption Solar Heating and Storage System, U.S. Pat. No. 4,269,170, May 26, 1981.
9. Guerra, J. M., *Photon tunneling microscopy applications*, MRS Proceedings Volume 332, Determining Nanoscale Physical Properties of Materials by Microscopy and Spectroscopy, M. Sarikaya, H. K. Wickramasinghe and M. Isaacson, editors. Page 457, FIG. 8b shows tensile stress fissures in diamond-like carbon coating on a silicon substrate. FIG. 9a shows adhesion failure due to compressive stresses in a magnesium fluoride thin film coating on an acrylic substrate.
10. Guerra, J. M., Storage Medium Having a Layer of Micro-Optical Lenses Each Lens Generating an Evanescent Field (application title: Optical Recording Systems and Media with Integral Near-Field Optics), U.S. Pat. No. 5,910,940, Jun. 8, 1999. Assigned to Polaroid Corp.
11. Guerra, J. M. and D. Vezenov, Method of fabrication of sub-micron spherical micro-lenses. Patent Applied For Apr. 12, 2001.
12. Guerra, J. M. et al, "Embedded nano-optic media for near-field high density optical data storage: modeling, fabrication, and performance," Proceedings, Optical Data Storage Conference, SPIE, April, 2001.
13. Guerra, J. M. et al, "Near-field optical recording without low-flying heads," ISOM Technical Digest, Taipei, 2001.
14. Guerra, J. M. et al, "Near-field optical recording without low-flying heads: Integral Near-Field Optical (INFO) Media," *Japanese Journal of Applied Physics*, scheduled publication March 2002
15. J. M. Bennett et al, "Comparison of the properties of titanium dioxide films prepared by various techniques," Appl. Opt. 28, 3303-3317 (1989)
16. H. T. Tien and A. L. Ottova, "Hydrogen generation from water using semiconductor septum electrochemical photovoltaic (SC-SEP) cells," Current Topics in Biophysics 2000, 25(1), 39-60. Modeled on nature's photosynthetic thylakoid membrane.

The ills of our carbon-based energy are well-known: pollution of land and oceans, air pollution, and the global warming that is likely caused by the latter. In addition, there is the growing dependence on foreign oil (presently at 46%, up from 27% during the Oil Embargo during the Carter administration) with the economic, political, and human costs that result from that dependence. Hydrogen has been gradually emerging as the fuel of choice for the future and perhaps even the very near future. Fuel cell technology has recently advanced exponentially, with plans for miniature fuel cells to replace batteries in the ever power-hungry personal digital devices, and for combustion engines for automobiles in which hydrogen is the fuel. This last important application has made great progress in that the hydrogen can now be safely and efficiently stored in a host of metal hydride based materials, with the hydrogen being piped to or stored at local filling stations, with the associated cost and danger. In another approach, the hydrogen is split at the engine from toxic hydrogen-bearing liquids such as gasoline and alcohols.

Ultimately, for a hydrogen-based energy to be completely beneficial, one would like to be able to split our most abundant resource, water, with a renewable energy source. Many have turned to solar cells to provide the electricity for electrolysis of water as a way to provide a stable and efficient storage for solar energy, with the stored hydrogen (adsorbed in a metal hydride, Ovshinsky et al) later used to create electric power in a fuel cell. However, the losses of the solar cell in converting sunlight to electricity, combined with the losses in the electrolytic splitting of water into hydrogen and oxygen, make for low efficiency overall. Further, the cost of the apparatus and lifetime of the components make the economic viability dim at this time.

A promising path and highly sought-after goal is to use sunlight directly to split water. The free energy required for decomposing water into gaseous $H_2$ and $O_2$ is just 1.23 eV, so this seems possible given that the peak of the solar spectrum is about 2.4 eV (ref. Mavroides). However, the threshold energy for this reaction is 6.5 eV, so direct photodissociation is not possible. However, Honda and Fujishima (Nature 238, 37 (1972)) showed that the threshold energy required can be greatly reduced by introducing a photocatalytic semiconductor surface, such as titania. Immersing single crystal titania (n-type) and Pt electrodes in an aqueous electrolyte, connected externally to form an electrolytic cell, they observed development of gaseous oxygen at the titania electrode and gaseous hydrogen at the Pt electrode when the cell was illuminated. (In other photoelectrolytic cells, hydrogen collects at the semiconductor cathode and oxygen collects at the conducting anode, with a membrane preventing their recombining.) However, while they succeeded in activating titania as a photocatalyst, they required artificial light, such as a xenon lamp, with a photon energy of greater than 3.2 eV, the lowest energy gap of titania. Even so, their energy conversion efficiencies were low. Further, such light is in the ultraviolet part of the spectrum, and very little is present in sunlight at the surface of the earth (sunlight integrated over the 3 eV to 4 eV range is only 4 mW per square cm, compared to the 100 mW per square cm total in visible sunlight), so that titania photoelectrolysis with sunlight has less than 1% efficiency, and the photoelectrolysis quantum efficiency, independent of the solar spectrum, is only 1-2% unless a bias voltage is applied. For photoelectrolysis, as it is known, to spontaneously occur in sunlight, and with a practical efficiency, therefore requires the semiconductor to have a bandgap of about 1.7 electron volts (eV) in order to (1) have the energy required to split the water into hydrogen and oxygen gases, and (2) absorb at the peak of the solar spectrum for highest efficiency.

Following this work, others (Turner and Warren) have investigated semiconductor alloys or compounds with lower bandgaps. For example, p-type $GaInP_2$ has a bandgap of 1.8 to 1.9 eV, which would work adequately in sunlight to produce a photocurrent that can be used to break down water into hydrogen and oxygen. However, they found that surface treatments in the form of metallated porphyrins and transition metals, such as compounds of ruthenium, were necessary to suppress the bandedge migration and allow bandedge overlap to occur. Without this treatment, hydrogen and oxygen cannot be produced because the conduction band and the Fermi level of the semiconductor do not overlap the redox potentials of water, i.e. when light shines on the semiconductor, electrons build up on the surface, shifting the bandedges and Fermi level further away from the overlap of the water redox potentials. The long term surface stability of these surface treatments are not known.

Other attempts at photoelectrolytic cells with lower bandgap semiconductors typically (1) are corrosive in water, and (2) require a bias voltage, supplied by a conventional power source or by a photovoltaic cell or photodiode. The corrosion problem has been reduced by using platinum as the anode, and/or by combining different semiconductors. This again reduces economic viability.

The titania electrode in the Honda/Fujishima cell has the important advantage that it does not undergo anodic dissociation in water, and titania is much less expensive than other semiconductors. Mavroides, Kafalas, and Kolesar demonstrated somewhat higher efficiency titania cells using n-type $SrTiO_3$ for its smaller electron affinity, after having confirmed the Honda/Fujishima results with titania in earlier work. They achieved 10% maximum quantum efficiency, an order of magnitude higher than for titania, but with light with energy hυ (where h is Planck's constant and υ is the light frequency) at 3.8 eV, compared to 3.2 eV required for the anatase form of titania. They believed this increase in efficiency was the result of band bending at the anode surface that is about 0.2 eV larger than for titania, resulting from the smaller electron affinity of $SrTiO_3$. In their energy-level model for photoelectrolysis, the semiconductor serves as only the means for generating the necessary holes and electrons, without itself reacting chemically. In their model, the low quantum efficiency of titania is not due to inefficient carrier transfer, as others had shown that this was close to 100% with platinized —Pt cathodes and illuminated titania anodes, but rather to insufficient band-bending at the titania surface to cause efficient separation of the electron-hole pairs. The complete process, according to their model as in Ref. 2, (which is in substantial agreement with models of other researchers), is that photoelectrolysis occurs because electron-hole pairs generated at the semiconductor surface upon absorption of illumination with the required photon energy are separated by the electric field of the barrier, in the form of the energy-band bending at the surface, preventing recombination. The electrons move into the bulk of the anode and then through the external circuit to the cathode. There, they are transferred to the $H_2O/H_2$ level of the electrolyte and hydrogen gas is released:

$$2e^- + 2H_2O \rightarrow H_2 + 2OH^- \qquad (1)$$

Oxygen is produced at the same time as holes are transferred from the anode surface to the $OH^-/O_2$ level of the electrolyte, as:

$$2p+ + 2OH^- \rightarrow \tfrac{1}{2}O_2 + H_2O \qquad (2)$$

In other work that is farther a-field from this application, Graetzel invented a titania solar photovoltaic cell in which the functions of absorption of light and the separation of the electric charges ("electrons" and "holes") are not both performed by the semiconductor (titania in this case). Instead, the light absorption is performed by a dye monolayer that is adsorbed onto titania particles, in one case, and onto titania nano-crystals, in another case. In this way he avoids the problem of titania's 3.2 eV bandgap. This technology is now being commercialized by, for example, Sustainable Technologies International. Others have followed his lead and replaced the dye absorber with quantum dot particles attached to the titania particles, where the quantum dots perform the light absorption (QD Photovoltaics, The University of Queensland). In all of this work, however, there is no attempt to alter the bandgap of the titania. Also, the titania layer is required to be microns thick, and is applied as a sol-gel. Such a process requires solvents and temperatures incompatible with polymer substrates. Further, an electrolyte is required to fill the porous gaps in the titania matrix and complete the cell. This electrolyte is non-aqueous and somewhat volatile, so packaging, cell lifetime, and effect on the environment remain problematic. Efficiencies are reported to be around only 5% at this point. Most importantly, such a device provides no direct access to the titania photocatalytic surface, and so cannot be used for hydrogen production, detoxification, or disinfection.

Still further a-field is work by researchers at Oxford's Physics and Chemistry Departments, who are devising "inverted" photonic bandgap (PBG) crystals comprising polycrystalline titanium dioxides (titania), while earlier researchers achieved the same with self-assembled titania nano-spheres. Here, the bandgap is determined by the relative indices of refraction of the titania spheres and the empty or lower index media around and in between the spheres, the size of the spheres, and their geometrical arrangement. Again, there is no attempt to alter the bandgap of the titania spheres themselves, and the application is for directing, absorbing, and otherwise controlling light of a certain wavelength. The titania is used for its high refractive index of 2.4 to 2.6, which provides the desired index ratio of greater than 2 to if the immersion medium is air with in index of unity.

So, titania has also been shown to have use in photovoltaic devices. And in addition to photoelectrolysis for hydrogen production, titania's photocatalytic properties have been shown to have beneficial application to disinfection by killing biological organisms, and detoxification by breaking down toxic chemicals. It will be seen that the invention disclosed herein, by enabling titania to function well in visible light, such as sunlight, also applies to photovoltaics, disinfection, and detoxification.

In all of the above work, titania is either in the form of a slab cut from a crystal, and can be either of the most common polymorphs rutile or anatase, or is a thick film resulting from a sol gel process, or else are small particles of crystalline titania either in suspension or hot-pressed into a solid. No one is using, to our knowledge, titania in the form of a thin film deposited in a vacuum coating process.

SUMMARY OF THE INVENTION

One would like a semiconductor photocatalyst with a bandgap that is better matched to the solar spectrum and/or artificial illumination for higher efficiency or even to work at all. In this invention, the bandgap of the known chemically-inert photocatalyst titania ($TiO_2$) is shifted and broadened to be active at wavelengths more prevalent in sunlight and artificial light by inducing and managing sufficiently high stress in titania by vacuum coating a thin film of titania onto a substrate, preferably of a different Young's modulus, with bending undulations on the surface of a spatial radius similar to the film thickness. The undulated coating also serves to self-focus and concentrate the incident light required for the process, increase photocatalytic surface area, and prevent delamination of the film from the substrate. The electrical activity so induced in the band-shifted titania subsequently by visible light is applied to photoelectrolysis (hydrogen production from water and light), photovoltaics (electrical power from sunlight), photocatalytic disinfection and detoxification, point-of-use photoelectrolysis for use in internal combustion engines, for example, and stress-induced tunable bandgap components for communications. In addition, the same stress-induced thin film bandgap shifting works with other semiconductors such as amorphous silicon, and with similar benefits.

Accordingly, this invention provides for shifting, lowering, or reducing the size of, the optical bandgap of a semiconductor into optical wavelengths predominant in the illuminant by stressing (specifically straining) the semiconductor, where the semiconductor is a thin film, and/or where the stress is caused by conditions under which the thin film is formed, and/or where the stress is caused by the shape of the substrate on a nano scale, and/or where the stress is caused by the mechanical, chemical, and thermal properties of the substrate.

In such a semiconductor, the bandgap may be shifted into longer wavelengths by heating. The semiconductor may be titania. The bandgap may be shifted into wavelengths that are abundant in the solar spectrum. The semiconductor may be a photocatalyst. The stress-inducing template profiles may also provide a mechanical lock to the coating so that the stress can exist without causing delamination of the coating from the substrate. The stress-inducing template profiles may create additional surface area without increasing the width or length of the surface, for additional efficiency in photocatalytic action.

The photocatalyst may be used to split an aqueous solution into hydrogen gas and oxygen gas when irradiated. The illumination may be from the sun, or from artificial light. The stress-inducing profiles in the substrate may be one-dimensional, such as cylinders, or two-dimensional, such as spheres. The thickness of the titania layer may be chosen to be ¼ of the wavelength of the desired illumination, thereby acting as an anti-reflection filter and increasing absorption and decreasing reflection.

The additional effective surface created by the substrate stress-inducing profiles facilitates and improves heat dissipation. The semiconductor may be formed by heat oxidation, or by anodizing. The semiconductor may be a contiguous film. The semiconductor may be a matrix of particles such as spheres. The substrate can be polymer, glass, silicon, stainless steel, copper, aluminum, or substrate material.

The photocatalyst may be used to detoxify a medium in contact with it. The photocatalyst may also be used to disinfect a medium or biological agent in contact or proximal with it.

The substrate may be transparent or reflective, and can be flexible. The substrate and titania formation are compatible with a roll-to-roll web manufacturing process. The substrate profiles may be embossed into the substrate with a stamper from a master, or molded into the substrate with a stamper from a master, or caused by reticulation in the substrate or in a layer applied to the substrate.

The semiconductor used in the present invention can be titania, silicon, or other semiconductor.

The titania-coated substrate(s) of the present invention can function as the anode in a photoelectrolytic cell, which further comprises some or all of the following: a housing, an aqueous electrolyte, a gas separation septum, a cathode, and a bias source.

The present invention may be used in photovoltaic applications, for which the stress is enabling (titania) or improving (amorphous silicon), in photoelectrolysis, detoxification, disinfection, and point-of-use photoelectrolysis. The present invention may also be used for continual tuning of stress and bandgap properties for telecommunication applications, to alter and improve magnetic properties of thin films applied to hard drive disks for data storage, and to provide a corrugated substrate to which a desired titania or other thin film will adhere under stress but will not cause scatter or diffraction due to its sub-wavelength spatial period.

The present invention may also be used in apparatus for utilizing different parts of the solar spectrum simultaneously to carry out photo-induced reactions and to generate electricity, the apparatus comprising:

a primary reflector arranged to concentrate radiation incident thereon to a primary focus;

a secondary reflector disposed at or adjacent the primary focus and arranged to direct radiation incident thereon to a secondary focus;

photovoltaic means for converting radiation to electricity; and photo-reactor means for carrying out at least one photo-induced reaction, the photo-reactor means comprising at least one photoactive electrode, wherein one of the photovoltaic means and the photo-reactor means is disposed at or adjacent the primary focus, and the other of the photovoltaic means and the photo-reactor means is disposed at or adjacent the secondary focus.

In such apparatus, the photovoltaic means may use a first wavelength range for converting radiation to electricity and the photo-reactor means may use a second wavelength range at least part of which differs from the first wavelength range, and the secondary reflector may comprises a wavelength selective reflector arranged to reflect one of the first and second wavelength ranges to the secondary focus. The photo-reactor means may comprise a counter-electrode in addition to the photoactive electrode, and the apparatus may further comprising conductors connecting the photovoltaic means to the counter-electrode and photoactive electrode so that the voltage generated by the photovoltaic means is applied as a bias voltage across the counter-electrode and photoactive electrode. The photoactive electrode may comprise titania, desirably titania which is stressed such that at least part of the titania has its bandgap shifted to longer wavelengths in any of the ways taught herein. For example, the titania may have been produced by acid etching of titanium metal, followed by at least one of anodizing and heat oxidation of the acid etched titanium to convert at least part of the titanium to anatase.

Also, in such apparatus, the photo-reactor means may comprise a counter-electrode and a liquid-tight container surrounding the counter-electrode and the photoactive electrode, the container containing an aqueous medium capable of being electrolyzed to produce hydrogen and oxygen. The apparatus may further comprise a substantially tubular inner vessel disposed within the container and having apertures extending therethrough through which the aqueous medium can pass through the tubular inner vessel, the counter-electrode being disposed within the inner vessel, and the photoactive electrode having the form of a sheet outside and extending partially around the tubular inner vessel.

In one form of such apparatus, the photo-reactor means is disposed at or adjacent the secondary focus, and the photoactive electrode has substantially the form of a hollow tube having an aperture through which radiation can enter the tube, the inside surface of the photoactive electrode being photoactive.

As an alternative to the use of tubular inner vessel, the apparatus may comprise a septum disposed within the container and essentially dividing the interior of the container into two chambers, with the photoactive electrode disposed in one chamber and the counter electrode in the other chamber. At least one portion of the septum adjacent the container may be provided with grooves which extend between, and provide ionic conduction pathways between, the two chambers. Alternatively, the septum may be formed of an open cell material, the open cells providing ionic conduction pathways between the two chambers.

The apparatus may comprise drive means for rotating the primary reflector around an axis to enable the primary reflector to track the sun.

This apparatus may be used to carry out a method for bringing about a photoinduced chemical reaction in a liquid. Such a method comprises:
  providing an apparatus comprising:
    a primary reflector arranged to concentrate radiation incident thereon to a primary focus;
    a secondary reflector disposed at or adjacent the primary focus and arranged to direct radiation incident thereon to a secondary focus;
    photovoltaic means for converting radiation to electricity; and
    photo-reactor means for carrying out at least one photo-induced reaction, the photo-reactor means comprising at least one photoactive electrode in contact with the liquid,
    wherein one of the photovoltaic means and the photo-reactor means is disposed at or adjacent the primary focus, and the other of the photovoltaic means and the photo-reactor means is disposed at or adjacent the secondary focus
  allowing electromagnetic radiation to fall on the primary reflector, to be reflected therefrom to the secondary reflector, and to be again reflected to the secondary focus, whereby at least part of the radiation falls on the photoactive electrode, thereby causing the photoactive electrode to bring about the reaction in the liquid, and a second part of the radiation falls on the photovoltaic means, thereby causing the photovoltaic means to generate an electric potential.

In this method, the photovoltaic means may be electrically connected to the photoactive electrode so that the electric potential generated by the photovoltaic means is applied between the photoactive electrode and a counter electrode. The liquid may be an aqueous solution such that the reaction effected is the generation of hydrogen and oxygen gases from the liquid.

This invention provides a process for producing a titania electrode comprising primarily anatase (with possibly a minor proportion of rutile) having a bandgap lower than that of unstressed anatase, the process comprising:
  (a) subjecting titanium metal to an etchant (which may be an acid etchant); and
  (b) oxidizing at least part of etched titanium to anatase by at least one of (i) anodizing the titanium in an acid or other anodizing solution, and (ii) heating the titanium in an oxygen-containing atmosphere.

In this process, the titanium metal used may be an impure form containing not more than about 99.6 percent titanium by weight, for example Grade 1 titanium having the following specification by weight:
  C 0.1% maximum
  Fe 0.2% maximum
  H 0.015% maximum
  N 0.03% maximum
  O 0.18% maximum
  Ti 99.5% minimum, up to about 99.6%.
or Grade 2 titanium having the following specification by weight:
  C 0.1% maximum
  Fe 0.3% maximum
  H 0.015% maximum
  N 0.03% maximum
  O 0.25% maximum
  Ti 99.2% minimum, up to about 99.6%.
The titanium metal used may be in the form of a foil, sheet or film from about 0.1 to about 1 mm thick.

Step (a) of the process, in which the nano-structures are formed, may be effected using sulfuric acid having a concentration of at least about 93 percent by weight at a temperature of about 60 to about 100° C. In a preferred from of the process, the sulfuric acid has a concentration in the range of about 93 to about 98 percent by weight and the acid etching is effected at a temperature of about 75 to about 85° C. The acid etching may be carried out for a period of from about 60 to about 600 seconds from the onset of visible bubbling.

Step (b) of the process, in which the titania of substantially anatase morphology is formed, may be effected by anodizing in an aqueous medium having a pH in the range of about 1.5 to about 2.5 and at a temperature of about 60 to about 100° C. The anodizing may be effected at a maximum voltage of from about 70 to about 100 Volts. The anodizing may also be effected at a voltage which increases with time, for example the voltage may increase with time substantially according to the equation:

$$V = V_{Final}(1 - e^{-at})$$

where a is an arbitrary constant.

Alternatively, the titania formation in step (b) may be effected by heat oxidizing the titanium at a temperature of at least about 630° C. for a period of not more than about 300 minutes, and preferably at a temperature of about 635 to 735° C. for a period of about 300 to about 10 minutes. The variation of the photoactivity of the resultant titania electrode with the time and temperature used in the heat oxidation step is somewhat complex and is discussed in detail below with reference to FIG. 31. The heat oxidation may be effected in air to which additional oxygen has been added.

Other features of the invention will be readily apparent when the following detailed description is read in connection with the drawings.

BRIEF DESCRIPTION OF THE DRAWINGS

The structure and operation of the invention, together with objects and advantages thereof, may best be understood by reading the detailed description to follow in connection with the drawings in which unique reference numerals have been used throughout for each part and wherein:

FIGS. 13A to 13C are schematic cross-sections through three stressed titania films of the invention and the underlying substrate, showing the stress in the coated titania layer.

FIG. 16A shows a full band structure plot for the anatase structure, while FIG. 16B shows an enlarged view of the portion of FIG. 16A indicated by the arrow therein and containing only the top of the valence band and the bottom of the conduction band, together with the quadratic fits used to calculate the effective mass of the charge carriers.

FIG. 17 is a graph showing the variation of the effective mass of the electrons and holes in anatase with pressure, as calculated from quadratic fits similar to those shown in FIG. 16A.

FIGS. 32A to 32D are graphs showing the rate of hydrogen generation of solar conversion efficiency of an apparatus as shown in FIGS. 1, 2 and 7 under varying conditions of temperature, illumination and bias voltage.

DETAILED DESCRIPTION

Figure 1:
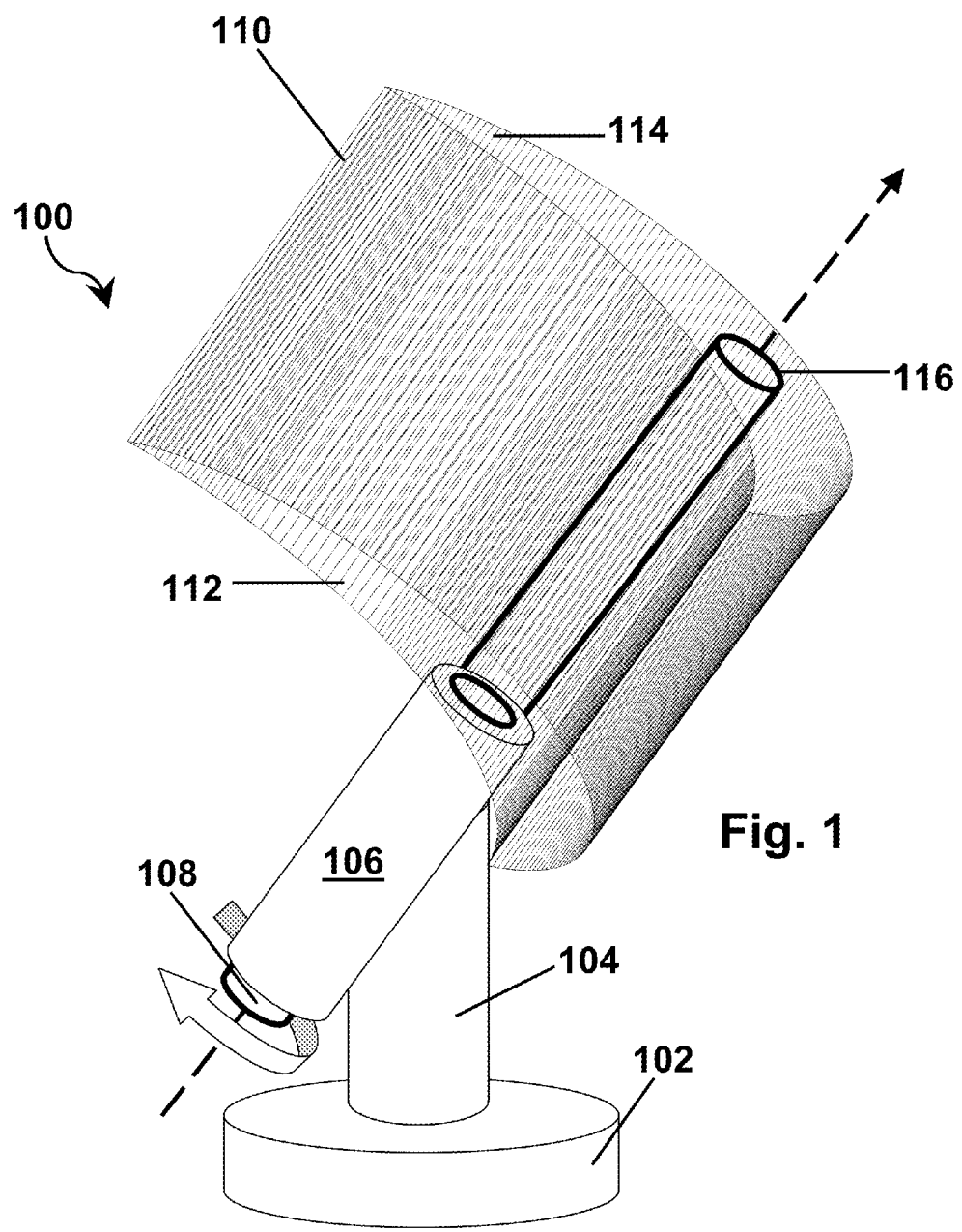
FIG. 1 is a perspective view of a preferred apparatus for generating hydrogen by photolysis of water using a titania electrode of the present invention, or various types of prior art photoactive electrodes.

FIG. 1 of the accompanying drawings illustrates a first photolysis apparatus (generally designated 100) using a titania electrode of the present invention (although other known photoactive electrodes can also be used) for the production of hydrogen and oxygen from water. The apparatus 100 comprises a squat cylindrical base 102; when the apparatus is installed in a fixed location, this base 102 may be installed directly on the ground or, for example, on a concrete pad, which may be equipped with power lines for driving the apparatus 100 as described below. Alternatively, if it is desired to make the apparatus 100 mobile, the base 102 may be mounted on a wheeled platform (not shown) which may be equipped with jacks or chocks (also not shown) for holding the wheeled platform stable at any desired location.

A cylindrical support member 104 extends vertically upwardly from the base 102, and a polar housing 106 runs across the upper end of support member 104, the housing 106 being inclined so that its axis is parallel to that of the earth at the location where the apparatus 100 is being used. For simplicity, the housing 106 is shown as fixed relative to the support member 104. However, since the optimum angle of inclination of the housing 106 to the support member 104 will vary with the latitude at which the apparatus 100 is to be used, in the case of a mobile apparatus 100 it may be desirable to provide means for varying the inclination of the housing 106 to the support member 104.

The polar housing 106 has the form of a hollow cylinder, and a polar shaft 108 is rotatably mounted with the housing 106 by means of radial bearings (not shown), so that the shaft 108 can rotate about the axis of the housing 106, as indicated by the arrow in FIG. 1. Rotation of the shaft 108 relative to the housing 106 is effected by a electric motor (not shown) located within the support member 104. A reflector assembly 110 provided with end caps 112, 114 and core assembly 116 are mounted via thrust bearings (not shown) on the shaft 108, so that by rotating the shaft 108, which is pointed at the North star and thus extends parallel to the axis of the earth, the reflector can follow the motion of the sun during the day. The reflector assembly 110 concentrates solar radiation on the core assembly 116 in a manner well known to those skilled in solar technology.

The single-axis mount shown in FIG. 1 is the presently preferred mount; adjustments for the seasonal variation in solar elevation can be made by using an oversized photocatalyst, which can accommodate changes in focus with the seasons, within the core assembly 116, as described in detail below. A two-axis mount can alternatively be used to allow direct adjustment of the position of the reflector assembly 110 to allow for seasonal variation in solar elevation.

The core assembly 116 will now be described in more detail with reference to FIGS. 2A and 2B. As most easily seen in FIG. 2A, the core assembly 116 comprises inner and outer hollow concentric tubes 202 and 204 respectively, which are formed of borosilicate glass, and polycarbonate respectively, although quartz or ultraviolet-transmissive acrylic polymer could alternatively be used for the outer tube 204, and other materials can be used for the inner tube 202 depending on the desired operating temperature and pressure. The lower ends of the tubes 202 and 204 are received within a cylindrical recess in a lower endcap 206, formed of poly(vinyl chloride); an annular seal 208, formed by injecting silicone rubber around the tube 204, extends around the outer tube 204 within the recess in the endcap 206 to provide a liquid-tight seal around the tube 204. The upper end of outer tube 204 is received within a cylindrical central aperture in a flange member 210, and an annular seal 212, similar to the seal 208, provides a liquid-tight seal around the tube 204.

The upper end of inner tube 202 extends beyond the upper end of outer tube 204 and is solvent welded within shallow cylindrical recess in a top plate 214, which lies parallel to and adjacent flange member 210. The top plate 214 is secured to flange member 210 by multiple bolts 216, only two of which are visible in FIG. 2A. An O-ring 218 is disposed between top plate 214 and flange member 210 radially outwardly of the upper end of outer tube 204.

The core assembly 116 further comprises a counter electrode 220 provided with a contact 222, in the form of a titanium screw, which extends through the center of the top plate 214 to provide a negative terminal for the core assembly 116. The counter electrode 220 is cylindrical and extends along the axis of the inner tube 202. The counter electrode 220 is formed of carbon or graphite, although any material which is inert to the hydrogen generated at this electrode when the apparatus 100 is operating may be used, for example reticulated glassy carbon, or stainless steel, such as stainless steel 316; obviously, it is desirable to keep the counter electrode 220 as simple and inexpensive as possible. However, it may be desirable to roughen or otherwise increase the surface area of this electrode to improve the efficiency of the apparatus 100. A hydrogen tube 224 extends from the upper end of inner tube 202 through the top plate 214 to provide a route for the hydrogen generated at the counter electrode 220 to leave the core assembly 116.

The second electrode of the core assembly 116 is a bandgap-shifted titania coated electrode 226 of the present invention, although as noted above other photoactive electrodes can be substituted. As best seen in FIG. 2B, the titania coated electrode 226 has the form of a thin titanium sheet curved into substantially the form of an arc of a hollow cylinder, the curved sheet extending the full length of, and being wrapped around a portion of, the inner tube 202 so as to leave a small gap between the electrode and the inner tube (this gap is somewhat exaggerated in FIG. 2B for ease of illustration). The electrode 226 is in electrical contact with a titanium screw 228 (FIG. 2A), which is generally similar to the screw 222 previously described, extends through the top plate 214, and acts as the positive terminal for the core assembly 116. When the core assembly 116 is operating, oxygen is evolved at the electrode 226, and this oxygen passes through the chamber formed by the facing surfaces of the flange member 210 and the top plate 214 and the O-ring 218, and leaves the core assembly via an oxygen tube 230 similar to and extending parallel to the hydrogen tube 224 already described. The top plate 214 is also provided with an electrolyte supply tube (not shown) used for filling and refilling the core assembly 116 with electrolyte (described below). For reasons discussed below, the hydrogen and oxygen tubes 224 and 230 are provided with pressure relief valves (not shown) at locations further from the top plate 214 than is capable of being illustrated in FIG. 2A.

Figure 2A:
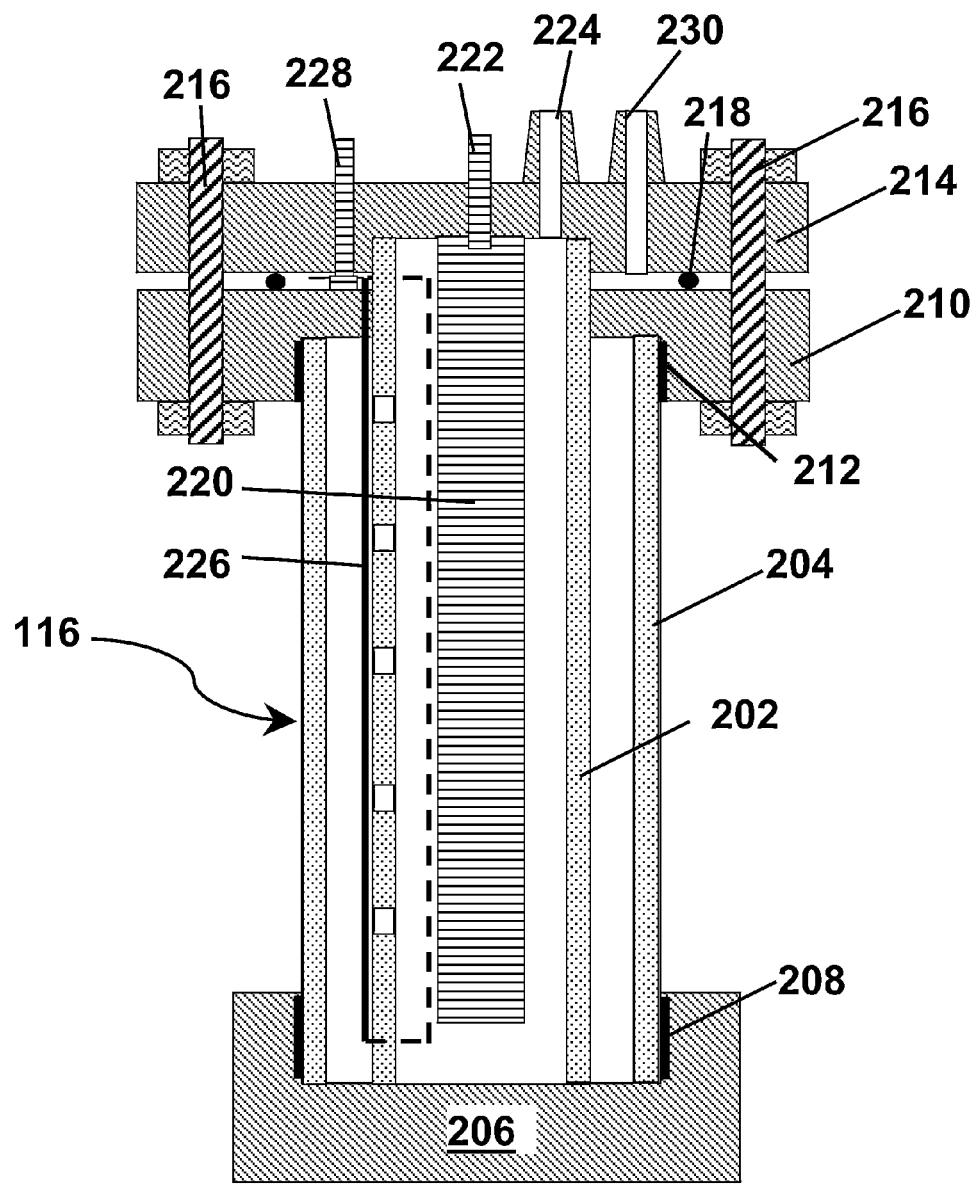
FIG. 2A is a schematic cross-section through the cylindrical core of the apparatus shown in FIG. 1, the cross-section being taken in a plane including the axis of the cylindrical core.
Figure 2B:
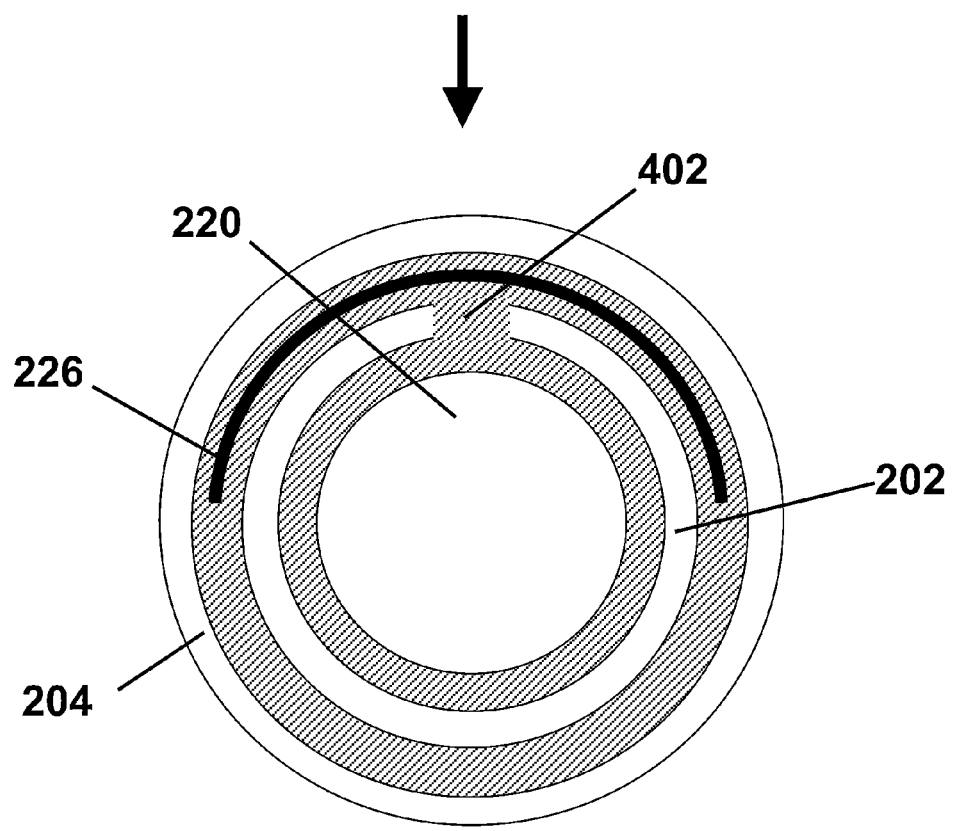
FIG. 2B is a schematic cross-section through the cylindrical core shown in FIG. 2A, the cross-section being taken in a plane perpendicular to the axis of the cylindrical core.

FIG. 2B shows a cross-section perpendicular to the central axis of the core assembly 116 shown in FIG. 2A, with the arrow indicating the face of the assembly which is intended to face the concentrated sunlight. The carbon counter electrode 220 has an outside diameter of 1 inch (25 mm). One provider is NAC Carbon Products, Inc., Elk Run Ave., Punxsutawney, Pa. The inner tube 202 has an internal diameter of 1.5 inch (38 mm) and an external diameter of 1.76 inch (45 mm). The outer tube 204 has an internal diameter of 2.18 inch (56 mm) and an external diameter of 2.365 inch (59 mm). The photoactive electrode 226 has a thickness of 0.010 inch (0.254 mm) and in practice fits somewhat more tightly around the inner tube 202 than is illustrated in FIG. 2B. Apertures 402 (discussed in more detail below with reference to FIG. 2C) passing through the inner tube 202 are 0.575 inch (15 mm) in diameter and disposed on 2 inch (51 mm) centers.

Figure 2C:
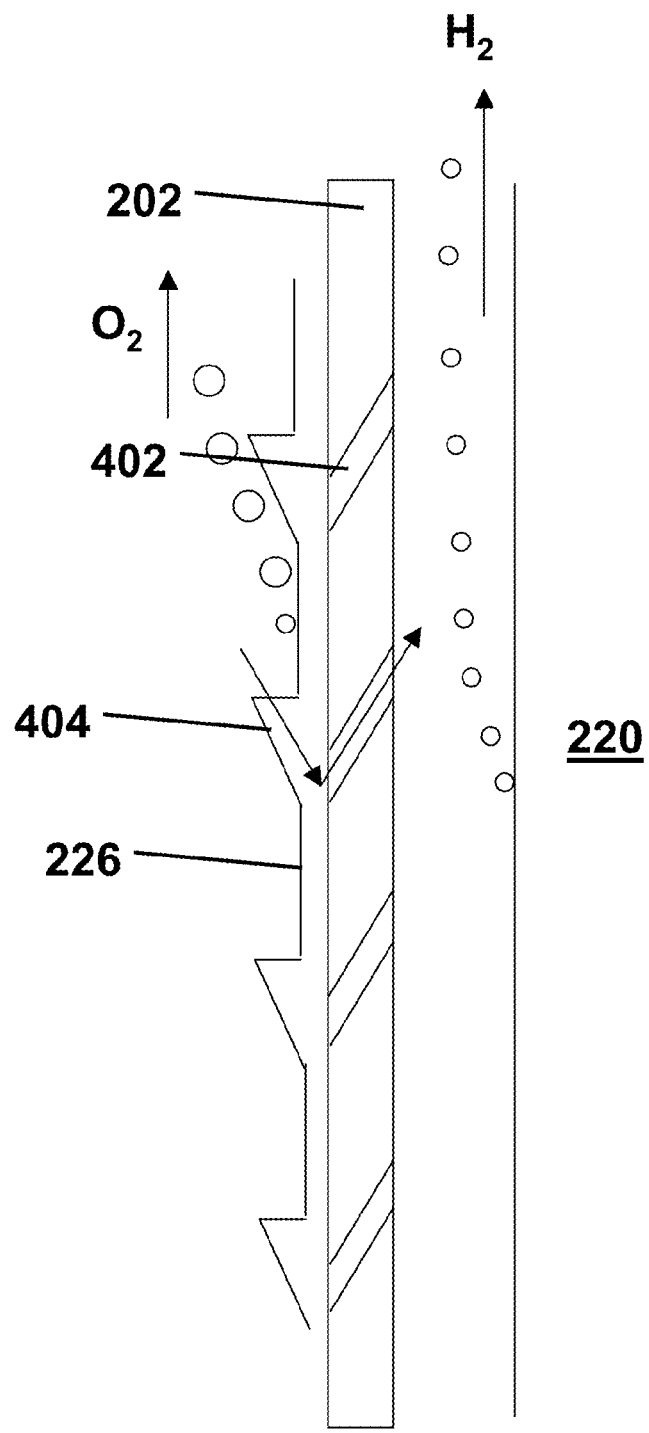
FIG. 2C is an enlarged cross-section taken in the same plane as FIG. 2A and illustrates the electrodes of the core, and the apertured tube lying between these electrodes, with this tube having louvered apertures.

In operation, the tubes 202 and 204 are completely filled with an electrolyte solution capable of being photolyzed to hydrogen and oxygen. As shown in FIG. 2C, to enable ions to flow between the electrodes 220 and 226, while keeping the hydrogen and oxygen evolved at these electrodes separate, the inner tube 202 is provided with a series of apertures 402 lying beneath the electrode 226, these apertures extending downwardly and radially outwardly, while the electrode 226 itself is provided with a series of vent louvers 404. As indicated by the diagonal arrows in FIG. 2C, the combination of the louvers 404 and apertures 402 provides a short, large effective cross-section path for ion flow between the electrodes 226 and 220 through the inner tube 202, while keeping the evolved hydrogen and oxygen flowing separately upwardly, as indicated by the vertical arrows in FIG. 2C, separated by the inner tube 202. For additional insurance that the hydrogen and oxygen are kept separate, the apertures 402 may be covered by a fluoropolymer membrane, such as that sold commercially by E. I. du Pont de Nemours & Co. under the Registered Trade Mark "NAFION". Such a membrane may be wrapped around the inner tube 202 and sealing, especially if hydrogen and oxygen pressures are equalized. Microporous materials such as ceramic or glass frits or a methacrylate (contact lens plastic) permeable to oxygen may alternatively be used, and such microporous materials can sustain substantial pressure differences between the two tubes. However, it has been found that satisfactory separation of gas can be achieved without providing such a membrane over the apertures.

Figure 3A:
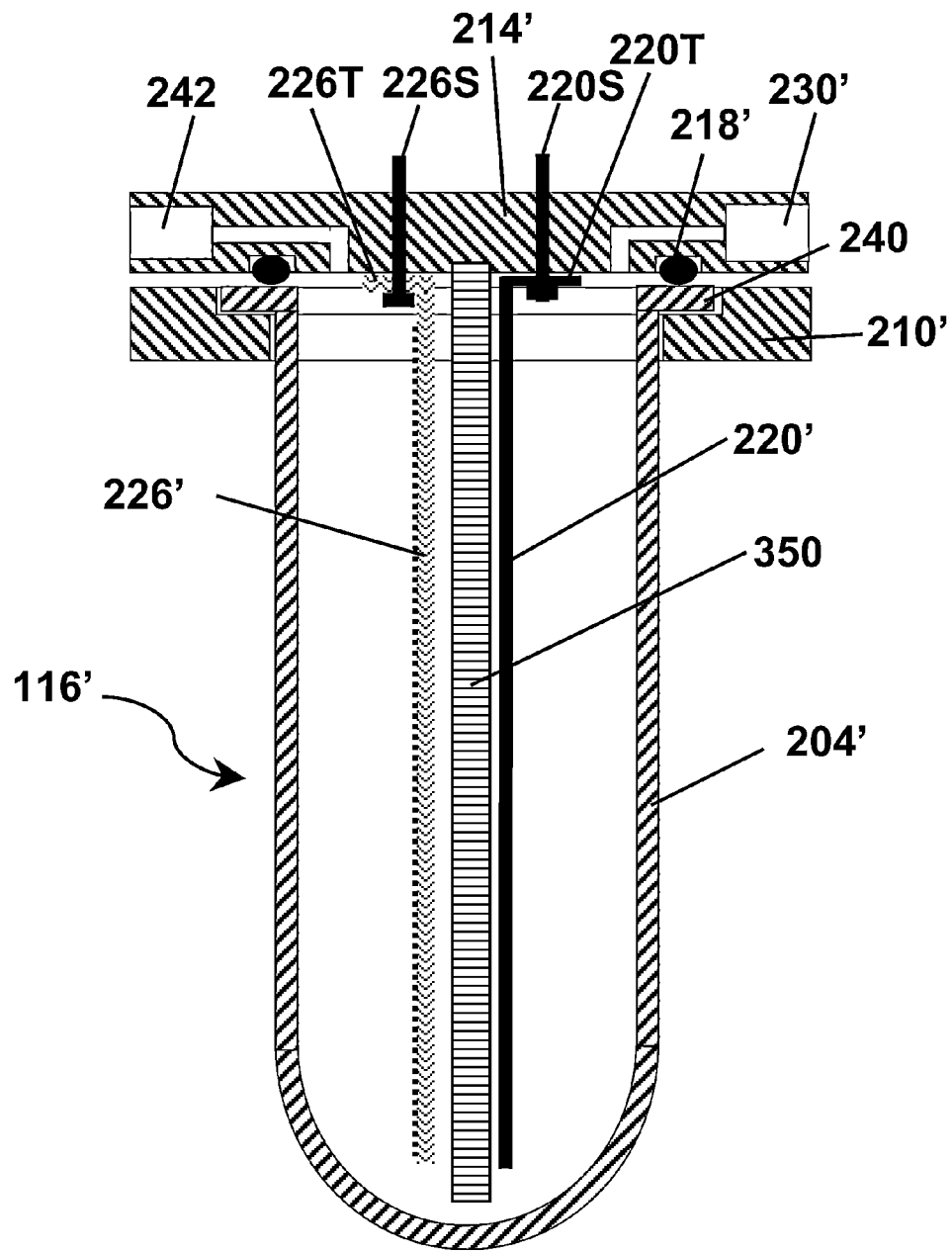
FIG. 3A is a schematic cross-section similar to that of FIG. 2A through an alternative cylindrical core which can be substituted for the core shown in FIG. 2A.

FIG. 3A shows as modified version (generally designated 116') of the core assembly 116 shown in FIG. 2A. In this modified version, the outer glass tube 204' has a rounded, sealed lower end and is provided at its upper end with an outwardly-extending flange 240, which is ground flat to accept an O-ring seal 218'. An annular backplate 210' with threaded holes is positioned below the flange 240, and an upper plate 214', having a groove which receives the O-ring seal 218' is bolted to the backplate 210' to form a seal. The upper plate 214' provided with an entrance port 242 for electrolyte and exit ports (only one exit port 230' is shown in FIG. 3A) for gases generated.

Figure 3B:
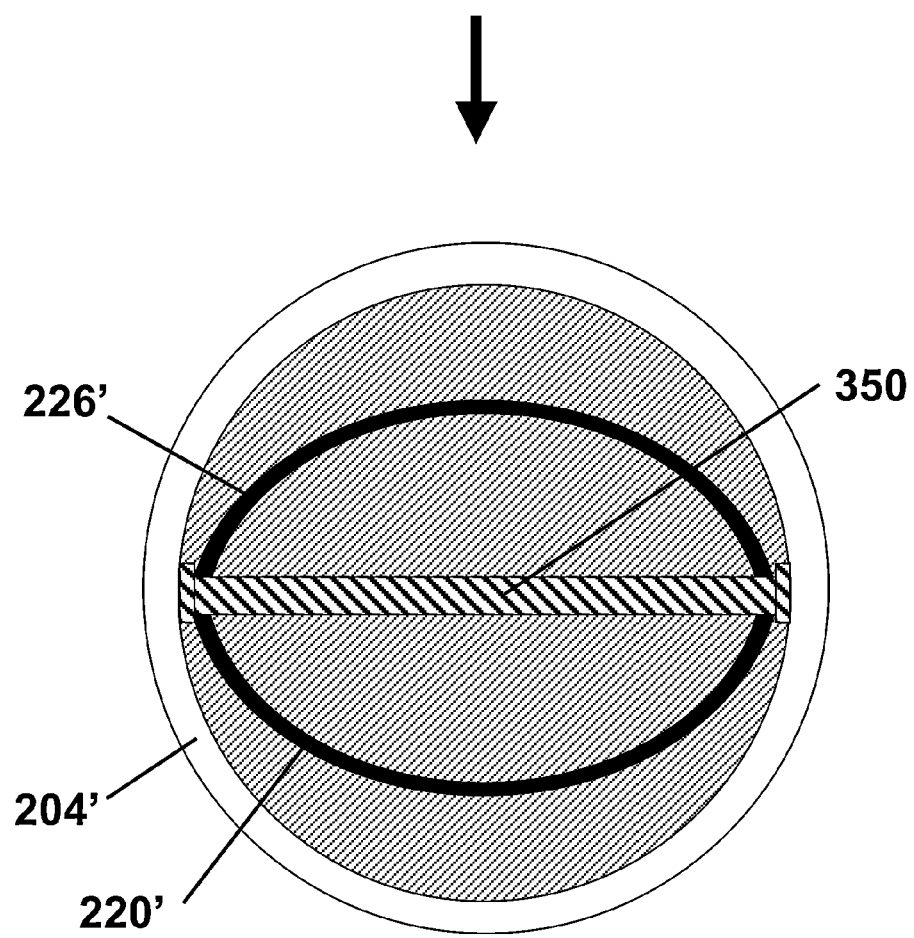
FIG. 3B is an enlarged cross-section, similar to that of FIG. 2B, through the alternative core shown in FIG. 3A showing the forms of the electrodes, which are substantially planar but are oppositely curved and are separated by a flat septum.

In the core assembly 116' of FIG. 3A, the inner tube 202 present in the core assembly 116 shown in FIG. 2A is eliminated, and instead a planar central septum 350, extends diametrically across the tube 204', effectively dividing this tube into two substantially hemi-cylindrical chambers, as most easily seen in FIG. 3B. Note that the septum 350 does not make sealing contact with the lower end of the tube 204'. A titania/titanium electrode 226' and a counter-electrode 220' are mounted on opposed sides of the septum 350. (For ease of illustration, FIG. 3A does not accurately represent the forms of these electrodes, which will be explained below with reference to FIG. 3B.)

Each of the electrodes 220' and 226' is provided at its upper end with a tab (designated 220T and 226T respectively), each tab extending horizontally and thus perpendicular to the main part of the electrode. Titanium screws 220S and 226S respectively pass through the tables 220T and 226T respectively and the secure the electrodes 220' and 226' respectively to the upper plate 214'. To ensure proper sealing around the screws 220S and 226S, O-rings or other sealing means may be provided where the screws pass through the upper plate 214', but such conventional sealing means are omitted from FIG. 3A for clarity. The upper ends of the screws 220S and 226S protrude above the upper surface of the plate 214' and are shaped and spaced to form a standard male plug size. This male plug may be connected via a female plug and cable to a photovoltaic strip (described below with reference to FIG. 7) in order that the photovoltaic strip can provide a bias or over-voltage to the electrodes 220', 226'.

The planar septum 350 isolates the electrodes 220', 226' from each other to prevent a short circuit and also, as already noted, effectively divides the interior of the tube 204' into two substantially hemi-cylindrical chambers, with one electrode being present in each chamber. The upper end of the septum plate is received within a groove in, and sealed to the upper plate 214'. The necessary seal to the polycarbonate upper plate 214' may be formed by solvent welding, ultrasonic welding, heat welding, or a mechanical seal with or without silicone rubber adhesive sealant. The septum can be made of polycarbonate, polytetrafluoroethylene, silicone rubber, silicone rubber foam (closed or open cell) or other high temperature and inert material or plastic or combinations thereof, such as a polycarbonate septum with a sealing edge comprising silicone rubber tube that is split along its length and applied to the polycarbonate edges, or silicone rubber foam.

As shown in FIG. 3B, the electrodes 220', 226' have substantially the form of parts of thin, hollow cylinders, with the vertical edges of the electrodes in contact with the septum 350 but with the central portions of the electrodes spaced from the septum.

The counter electrode 220' shown in FIGS. 3A and 3B (and the similar counter electrode shown in FIG. 4) will typically not be formed of the carbon, as is the counter electrode shown in FIGS. 2A-2C; instead the counter electrode 220' will typically be formed of a planar electrode material such as stainless steel mesh, titanium mesh (platinized or not), TDA carbon strip or reticulated glass carbon. The TDA carbon strip is made from sheets that are reinforced with conducting carbon fiber and were obtained from TDA Research, 12345 W. 52$^{nd}$ Ave., Wheat Ridge, Colo. The edges of the septum 350 make contact with the inside wall of the tube 204' by press-fit. The photoactive electrode 226' and the counter-electrode 220' are formed into the illustrated arch shape by making the electrodes with a width slightly larger than the inside diameter of the tube 204'. However the electrodes can also lie adjacent to the septum surface and even be bonded to the septum for ease of replacement of the entire assembly comprising septum, both electrodes, and top plate 214'. The arches of the electrodes can be concave or convex as it faces the concentrating reflector.

Figure 3C:
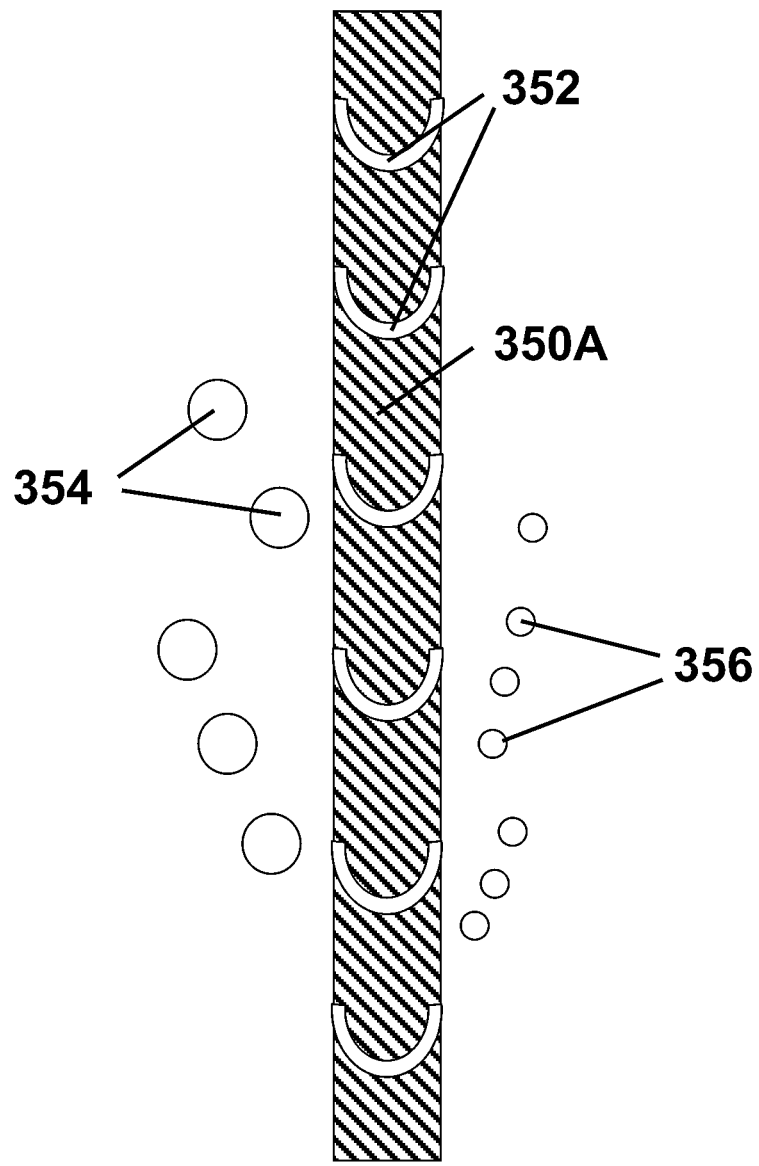
FIG. 3C is a detailed view of one side faced of the flat septum shown in FIG. 3B showing the grooves provided in the side faces of the septum.

Obviously, it is necessary to provide for ionic conduction pathways between the electrodes 220' and 226'. However, unlike the inner tube 202 shown in FIG. 2C, the main part of the septum is not provided with apertures. The ionic conduction pathway provided by the gap between the lower end of the septum 350 and the lower end of the tube 204' is not, by itself, adequate for this purpose. Accordingly, to provide additional ionic conduction pathways, the side faces (designated 350A in FIG. 3C) of the septum 350 in contact with the inner wall of the tube 204', are interrupted periodically by slots or grooves 352 that are cut into the side faces 350A. The grooves 352 may be substantially semi-circular, as illustrated in FIG. 3C, "V"-shaped or linear and cut at an angle, preferably of 45° or more. The grooves 352 create a short ionic conduction pathway, similar to that provided by the apertures 402 shown in FIG. 2C, while preventing the oxygen and hydrogen gases (indicated schematically at 354 and 356 respectively in FIG. 3C) from mixing due to buoyancy. Further, the grooves 352 can be alternating such that they impart a helical or screw effect to the flow of the electrolyte for enhanced convective flow.

Alternatively, if the septum 350 is formed of (for example) a silicone rubber open cell foam strip 0.25-0.5 inch (6 to 13 mm) thick; the grooves 352 are not needed to create ionic conduction pathways since the open cell structure of the foam allows ionic communication to occur without allowing mixing of the gaseous products. In all cases the septum material must be capable of surviving temperatures of at least 100° C. and electrolytic solutions containing salts, acids, or bases. All of the materials discussed herein meet these requirements. Where adhesive is used to bond the titanium to the septum, acrylic adhesive is used. The titanium/titania electrode 220' can also itself act as a septum, if edge guides are provided that effect a seal to the tube 202' except in the area of the grooves 352.

Figure 4:
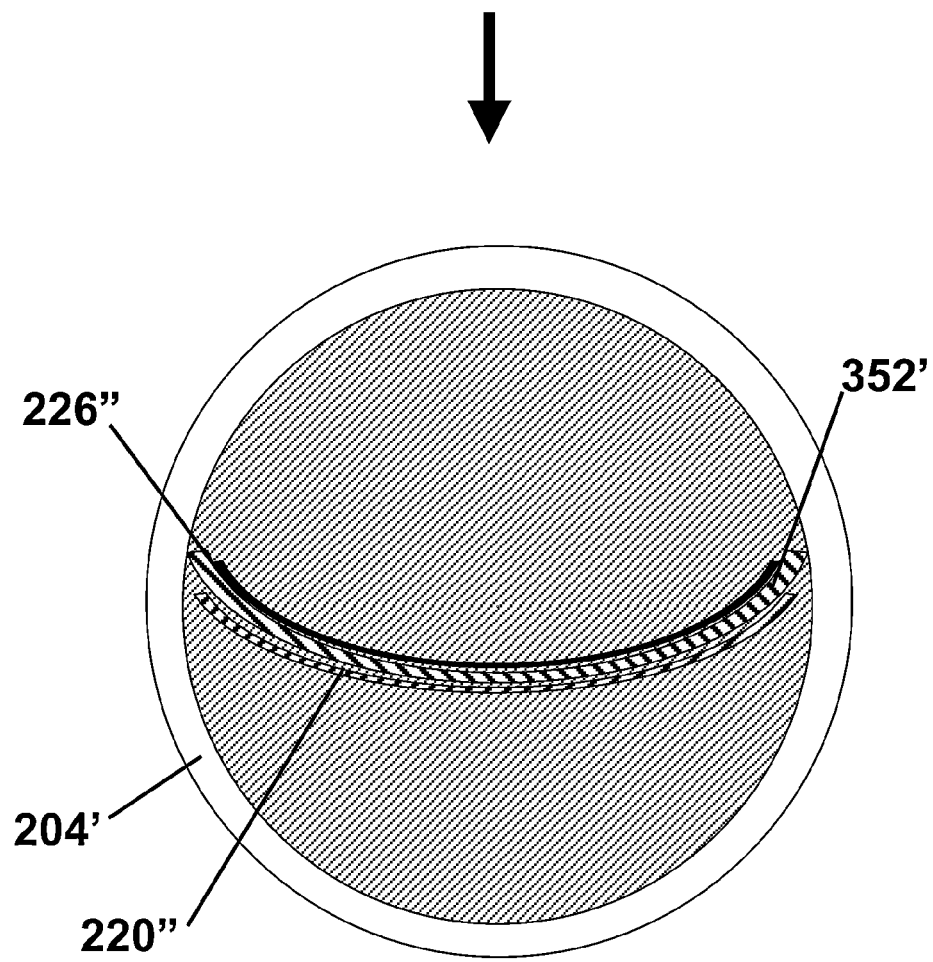
FIG. 4 is a schematic cross-section, similar to that of FIGS. 2B and 3B through a third core assembly, in which the electrodes are substantially planar but are together curved the same way with the septum so as to better form a seal with the inside of the tube.

FIG. 4 illustrates a radical cross-section, similar to that of FIG. 3B, through a modified version of the apparatus of FIGS. 3A-3C in which the septum (designated 352') is a flexible strip that seals to the inside wall of the borosilicate glass tube 204' by intimate contact. The titania/titanium electrode 226" and the counter electrode 220" are of substantially the same arcuate form as the septum 352' and are laminated thereto. Angled grooves (not shown in FIG. 4) providing ionic conduction pathways are again formed into the edges of the septum 352'. This embodiment allows for a lighter core assembly that can have higher aspect ratios (i.e., the length to diameter ratio of the core assembly can be much higher) which is preferred for roof-top mountings, where the reflectors can be smaller in width for overall lower profile height.

Figure 5:
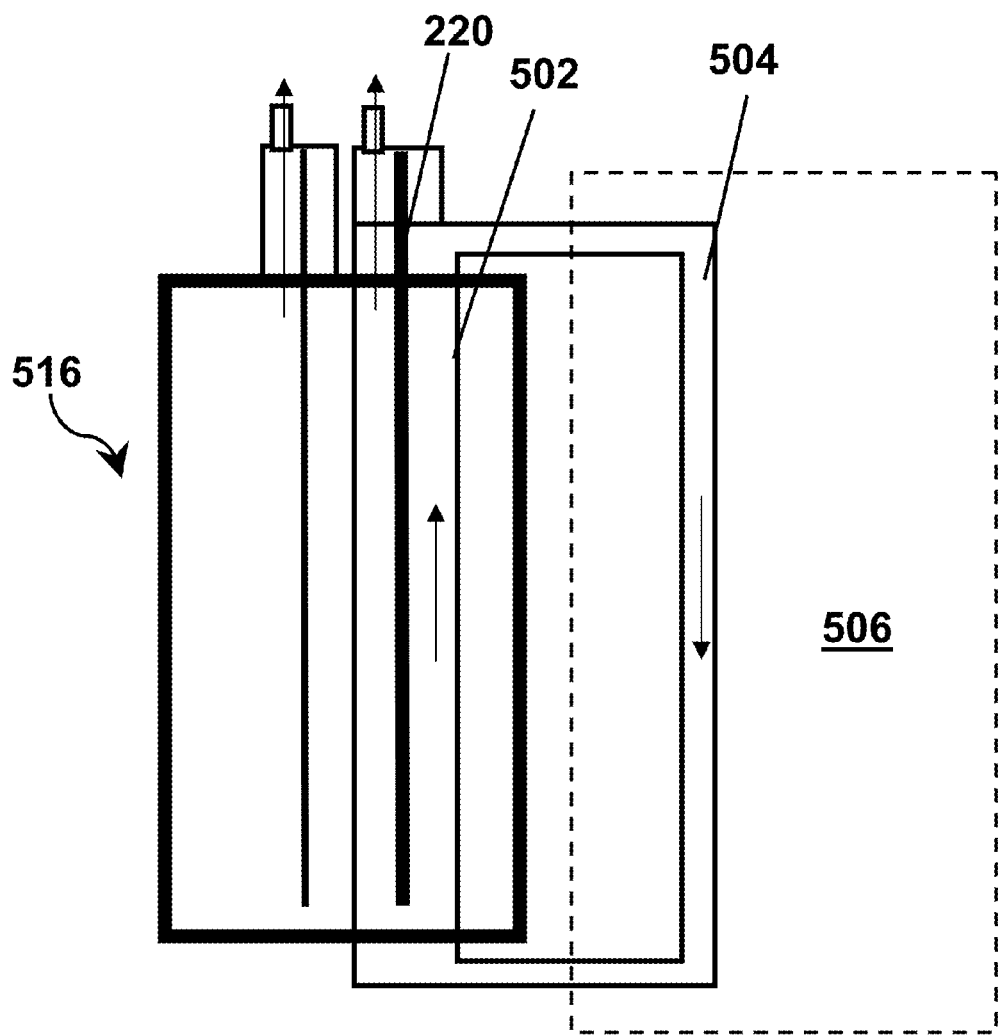
FIG. 5 is a schematic side elevation of a modified cylindrical core and associated apparatus for making use of excess heat generated within the core during operation and for reducing temperature gradients along the core axis.

When any of the apparatus shown in FIGS. 1-4 is operating, there is a natural convective flow of electrolyte parallel to the axis of the core assembly. This convective flow can be used to cool the electrolyte in order to maintain a desired operating temperature and/or to remove from the core assembly heat which can usefully be employed elsewhere, for example in space heating, thus improving the overall efficiency of use of the radiation incident upon the apparatus 100. FIG. 5 illustrates schematically a modified core assembly (generally designated 516) having the same central carbon anode 220 as previously described. However, the inner tube 502 of the modified core assembly 516 has a U-shaped external tube 504 joining its upper and lower ends. As indicated by the arrows in FIG. 5, electrolyte circulates upwardly through the inner tube 502 and downwardly through the external tube 504, being cooled within the external tube 504 by a heat withdrawing apparatus indicated schematically at 506. The external tube 504 can be formed of Grade 2 titanium tubing for resistance to corrosion, for increased tolerance to heat, and for increased hydrogen pressure. By a further modification of the apparatus shown in FIG. 5, the external tube 504 could be continuous with the titania electrode 226 (FIG. 2) with the relevant portion of the titanium tube being treated to form a titanium photocatalyst of the present invention. This arrangement allows for reducing the temperature gradient along the photoactive portion of the titanium tube for more even operation along the length of this photoactive portion. Obviously, the core assemblies shown in FIGS. 3A-3C and 4 can also be modified as illustrated in FIG. 5.

A closed convective loop is also present within the tube containing the carbon electrode and where the hydrogen is produced; this convection circulates the electrolyte in the "carbon" chamber past the interface with the "titania" chamber. As already noted, the interface between the two chambers can be a series of open holes, grooves, or a microporous material such as ceramic, fritted glass, or an ion exchange membrane such as fluoropolymer. This architecture enables higher differential pressures between the hydrogen and oxygen, in addition to increasing the rate of production and the production efficiency. The output is restricted by a ceramic frit to the pressure required, but keeps the aqueous electrolyte contained and circulating. Gas separation is achieved by common ports between the two electrolyte chambers that may be open holes, or the aforementioned microporous materials. The hydraulic pressure at the ports is substantially equal between the chambers so as not to damage the separation membrane, or if open holes are present, to avoid liquid flow across the holes.

Although not shown in FIG. 1, the apparatus 100 also comprises a photovoltaic strip disposed along the axis of symmetry of the reflector assembly 110, and the apparatus is designed so that each of the core assembly 116 and the photovoltaic strip can make maximum use of the wavelengths of incident radiation which they are best equipped to use; as discussed in more detail below, the photolysis reaction carried out by the electrode 226 (FIG. 2A) makes use of near ultraviolet and shorter wave visible (blue-green) wavelengths of radiation, whereas the photovoltaic strip makes use of wavelengths from about green in the visible range through red. For reasons explained below, in the preferred apparatus 100, it is important that the outer tube 204 (FIG. 2A) transmit radiation of all the wavelengths used by both the electrode 226 and the photovoltaic strip, and this is one reason for forming the outer tube 204 of Type 3 borosilicate glass, which transmits radiation of all frequencies from infra-red to ultraviolet.

Figure 6:
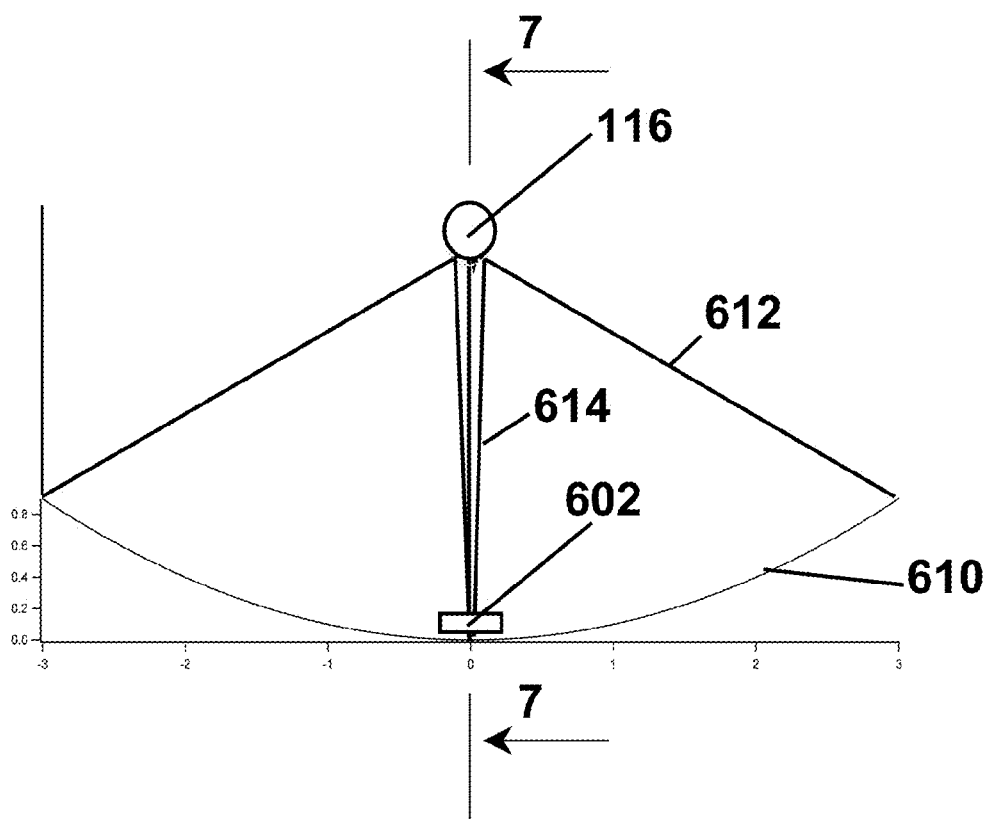
FIG. 6 is a schematic cross-section, taken perpendicular to the axis of the cylindrical core, through the reflector and core of the apparatus shown in FIGS. 1-4 to show the location of a photovoltaic strip.
Figure 7:
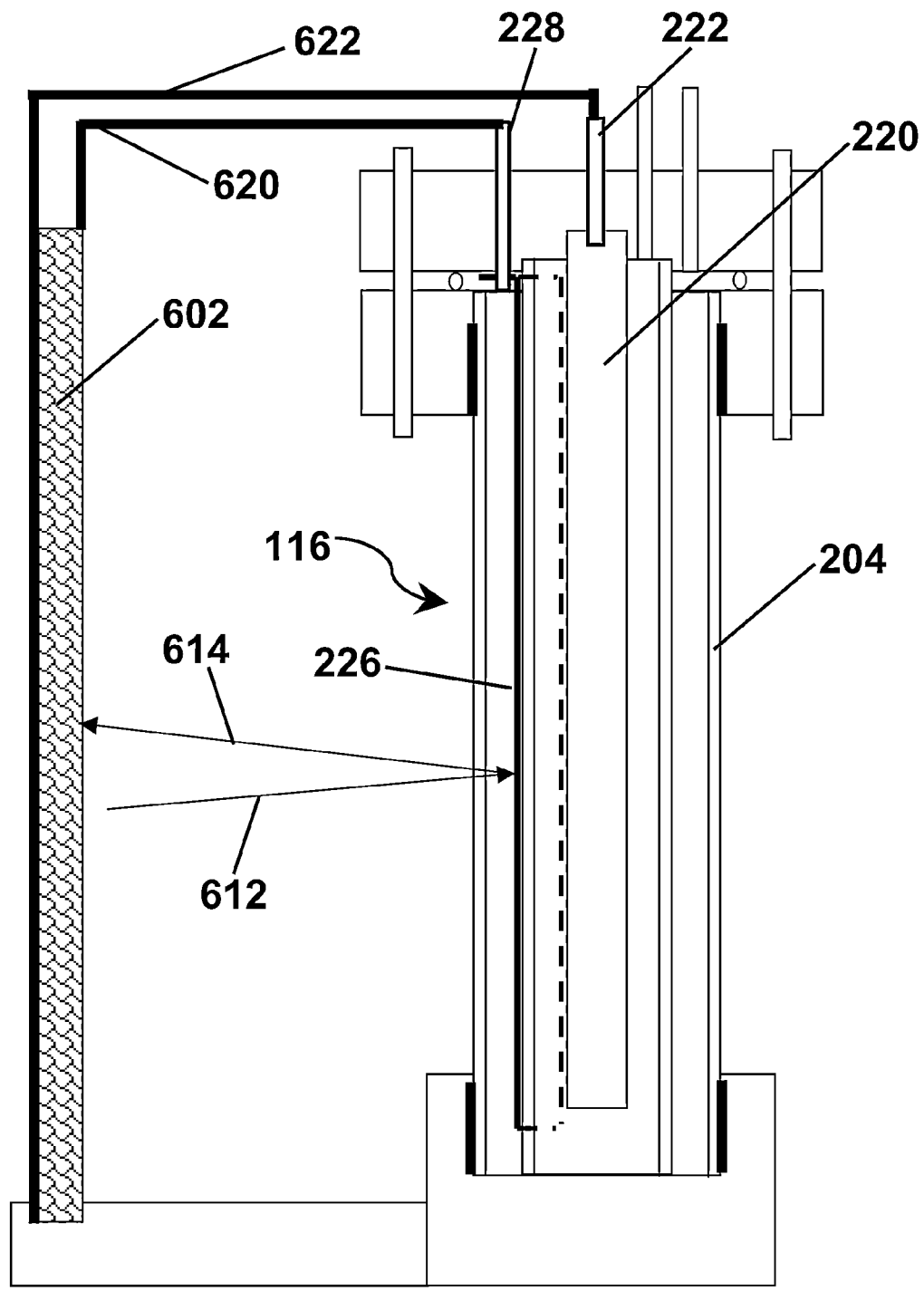
FIG. 7 is a schematic cross-section along the line 7-7 in FIG. 6, with part of the reflector omitted for clarity.

As may be seen from FIGS. 6 and 7, the photovoltaic strip 602 is disposed along the axis of symmetry of the reflector assembly 110 and is mounted on a mirrored elliptical reflector member 610 which reflects solar radiation. Solar radiation from the reflector member 610 travels, as indicated at 612, to the core assembly 116, where the ultraviolet and short wave visible radiation is absorbed, while the remaining radiation is again reflected and travels, as indicated at 614, to a secondary focus at the photovoltaic strip 602.

The reflection of the "unused" radiation (i.e., radiation not used by the titania electrode 226) from the core assembly 116 can be achieved in various ways, and one such way is illustrated schematically in FIG. 7, where the radiation 612 from the reflector member 610 passes through the outer tube 204 (hence the need for this tube to transmit all the wavelengths used by both the electrode 226 and the photovoltaic strip 602) and strikes the electrode 226. The longer wavelength (green through red) radiation is reflected from the part-cylindrical electrode 602, passes back through the outer tube 204 is travels, as indicated at 614, to a secondary focus at the photovoltaic strip 602. Although, as described in more detail below, the electrode 226 has minor undulation or other surface roughness needed for its photovoltaic efficiency, its surface is still sufficiently smooth to reflect and focus most of the unabsorbed longer wavelength radiation used by the photovoltaic strip 602. For greater efficiency, the photovoltaic strip 602 may be covered by a coating which reflects the shorter wavelength radiation as well as the near-infra red used by the core assembly 116 to that core assembly.

Placing the photovoltaic strip 602 on an "outrigger" (the reflector member 610) to the core assembly 116, as shown in FIG. 7, ensures that the strip 602 does not occlude reception by the titania photoelectrode 226 of any of the concentrated light from the collector, so that the strip 602 is in the shadow of the core, while being close enough to receive substantially all of the diffuse reflection of un-absorbed solar radiation from the core. In this way, the cost of a dichroic spectral separator is eliminated, and the titania electrode itself reflects unused parts of the spectrum to the photovoltaic strip, which is optimized for the unused solar spectrum parts. The core assembly 116 shown in FIG. 7 may of course be the core assemblies shown in FIGS. 3A, 3B and 4.

As already indicated, it is not essential that the back reflection of the radiation to the photovoltaic strip be effected by the electrode 226. Reflection may, for example, occur at the outer surface of the outer tube 204, by coating this surface with either a dichroic mirror or filter comprising a thin film optical stack (typically alternating layers of high refractive index and low refractive index metal oxide layers, such as titania and magnesium fluoride or silicon dioxide) coated directly onto the outer tube, or a holographic mirror. Obviously, whatever reflective coating is used on the outer tube 204 should be wavelength selective such that the wavelengths required by the electrode 226 pass into the core assembly 116 through the outer tube 204 and only the longer wavelengths needed by the photovoltaic strip 206 are back reflected on to this strip. Alternatively, the necessary wavelength selective reflector can be coated on to an additional tube surrounding the core assembly 116; the provision of such an additional tube may also be useful for preventing mechanical damage to the core assembly and/or protecting persons or apparatus near the core assembly 116 from injury should the pressurized core fail during operation.

As already indicated, the apparatus 100 uses a Dall-Kirkham reflective design, with an elliptical primary reflector, the reflector member 610, and a cylindrical secondary reflector, the electrode 226. In practice, this type of reflective design allows radiation concentration of about 30 suns without the need for precise optics, thus allowing a low cost, robust, light weight apparatus. Similar results can be achieved with a Cassegrain reflective design, with a parabolic primary reflector and a hyperbolic secondary reflector. The apparatus of the present invention may also may use of Newtonian (spherical primary and flat secondary reflectors, or a refractive concentrator, for example a Fresnel lens in preferably lenticular form that is manufactured from a UV-transparent material such as UVT (ultra violet transmitting) acrylic or borosilicate 3.3 glass.

As shown in FIG. 7, the photovoltaic strip 602 is used to apply a bias voltage as well as over voltage across the electrodes 220 and 226. Bias voltage is required for the hydrogen production to proceed vigorously, while the over-voltage overcomes the various electro-chemical resistances in an electrolysis cell. For this purpose, opposed sides of the photovoltaic strip 602 are connected via conductors 620 and 622 to contacts 228 and 222 respectively and thence to the electrodes 226 and 220 respectively, with the positive conductor going to the electrode 226 and the negative conductor to the electrode 220. Under typical practical conditions, the photovoltaic strip 602 will apply a bias voltage plus over-voltage varying from about 0.5 V to 8 V (direct current) across the electrodes 220 and 226; as demonstrated below, it has been found that a bias voltage plus over-voltage of about 5.5 V provides optimum efficiency for solar assisted photolysis of water.

Obviously, a bias voltage and over-voltage can be applied to the electrodes 220 and 226 from a source other than a photovoltaic strip. Mains electricity can be used for non-solar electrolysis, or for solar-assisted electrolysis, after conversion of the high voltage AC mains electricity to low voltage direct current, which can then be supplied to the core assembly using the same conductors as for the photovoltaic strip. In this way, low cost over-capacity nighttime mains power can be used produce hydrogen; to generate hydrogen in the absence of illumination, the core assembly must be supplied with electricity at a voltage greater than the diode breakdown voltage of the core assembly, which is typically about 12 V. The mains electricity could, for example, be supplied by a wind farm (most wind farms produce the majority of their electricity at night), tidal generator or other generating apparatus the output of which varies with environmental conditions, thus providing a way to store the intermittent output from such a generating apparatus in the convenient form of hydrogen (with optional output of oxygen).

In the apparatus 100 described above, the core assembly 116 is disposed at the primary focus of the reflector assembly 110 and the photovoltaic strip 602 at the secondary focus. It will readily be apparent to those skilled in radiation collection systems that the locations of the core assembly and photovoltaic strip could be reversed. Moreover, placing the core assembly at the secondary focus allows (optional) mounting of the core assembly within the reflector assembly. An apparatus (generally designated 800) of this type will now be described with reference to FIGS. 8 and 9.

Figure 8:
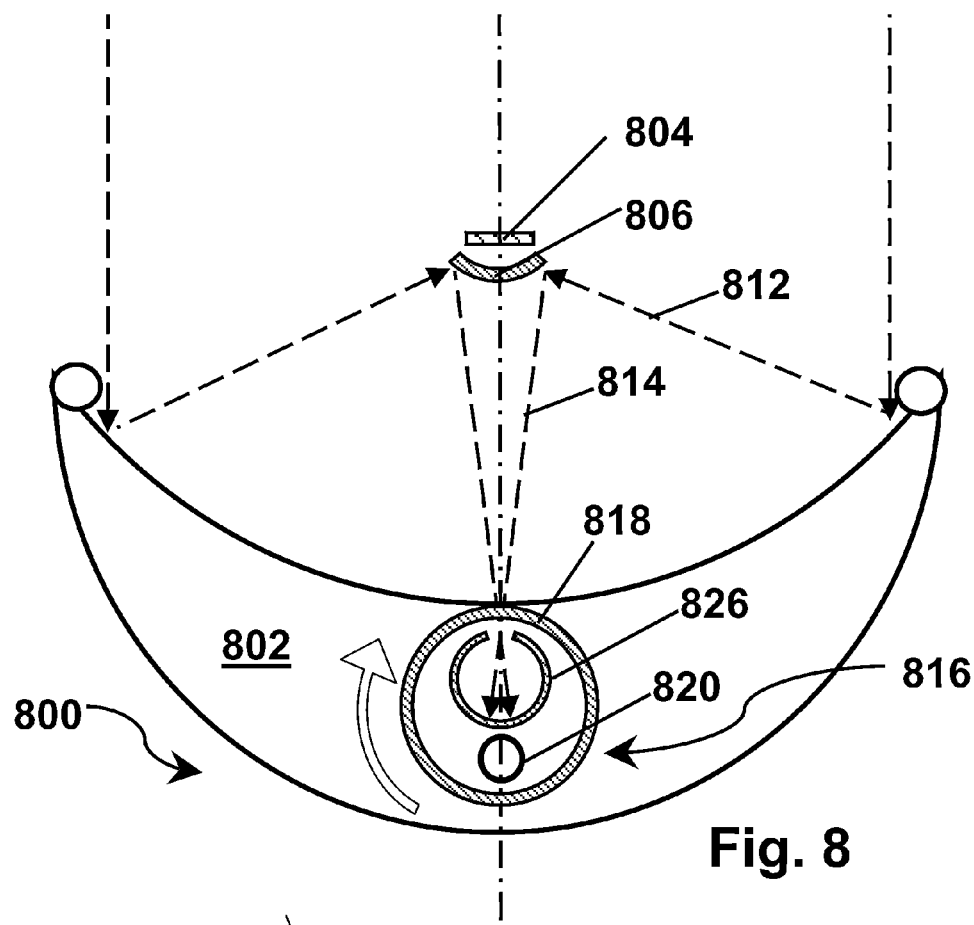
FIG. 8 is a schematic cross-section, similar to that of FIG. 6, through a second modified form of the apparatus shown in FIG. 1; in this second modified form, the core is disposed within the reflector.
Figure 9:
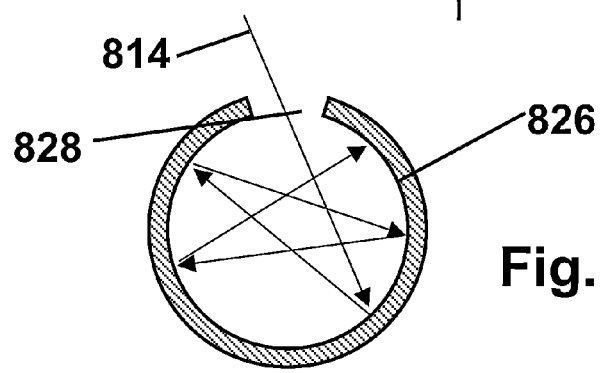
FIG. 9 is an enlarged cross-section through the photoactive electrode of the apparatus shown in FIG. 8, in which the optical integrating cylinder feature is seen in more detail.

As shown in FIG. 8, the apparatus 800 is of the Cassegrain type, with a parabolic main reflector assembly 802 and a hyperbolic secondary reflector 806, which is wavelength selective to reflect only shorter wavelengths and which overlies a photovoltaic strip 804. As indicated by the broken lines in FIG. 8, incoming solar radiation is reflected from the main reflector assembly 802 as indicated at 812 and (if of appropriate wavelength) is further reflected from the secondary reflector 806 as indicated at 814 to a core assembly (generally designated 816) mounted within the reflector assembly 802. This arrangement allows the core assembly 816 to be placed close to or within the main reflector assembly for easier access and interconnection, and enables easier, lower energy solar tracking with very little need for counter-balancing; the core assembly can be co-axial with the rotation axis of the main reflector assembly.

Placing the core assembly at the secondary focus also allows for an advantageous modification of the form of this assembly. As schematically indicated in FIG. 8, the core assembly 816 comprises a transparent outer tube 818 similar to outer tube 204 (FIG. 2) of apparatus 100, but the internal arrangement of the core assembly 816 differs from that of the core assembly 116 of apparatus 100; in core assembly 816, there is no inner tube and the electrodes 820 and 826 extend parallel to but spaced from each other. As most easily seen in the enlarged view of FIG. 9, the photoactive electrode 826 is formed as an "integrating cylinder", that is to say the photoactive electrode 826 is substantially cylindrical with the photoactive surface on the inside, and having a slit 828 running axially along to cylinder such that the tightly focused light 814 from the secondary reflector enters the cylinder and is able to undergo multiple reflections within the cylinder multiple times until substantially completely absorbed by the photoactive surface. This increases the efficiency of photon conversion by the electrode 826.

The apparatus 800 is well adapted for construction as an extruded or molded plastic ribbed reflector design, with all feature for mounting the core assembly 816 and other components molded in. The main reflector assembly can, for example, use a rear-surface silver ultra-violet reflecting layer on ultra-violet transmissive acrylic polymer, and be epoxy-overcoated. Acrylic polymers can be flexed into the parabolic or hyperbolic main reflector shape, as required, and provide a smooth optical surface which is durable against hail and other weather.

The main reflector assembly is typically one of two main types. In the first type, the end caps or end wings determine the shape of the mirror. The two end caps are connected to each other by a series of tubes, with one tube at each tip of the end caps, and one or more tubes in between. The tubes are solvent-cemented or otherwise secured connected to the end caps, and a tension rod can run down the center of the tube for added strength. Cross bracing between the tubes can be added for additional stiffness under wind loading. A slotted guide is attached to the facing inside surfaces of the end caps to define the shape of the main reflector. The main reflector material is inserted into the slotted guides. The main reflector material is made sufficiently flexible that it follows the shape determined by the guides faithfully, while also smoothing out any irregularities in the manufacture of the end caps or guides. The end caps are typically blow-molded of recycled plastic, and the molding process allows for many features to be easily integrated into the end caps, including the guides, mounting flanges, stiffening ribs, product identification, and safety and other information. The main reflector mounting material may, as already indicated, be ultra-violet resistant plastic, or may be powder coated or painted to resist ultra-violet degradation. The main reflector material can be an ultra-violet transmitting acrylic polymer such as poly(methyl methacrylate), known commercially as Plexiglas, with a mirror coating applied to its rear surface, this coating being optimized for reflection of ultra-violet as well as the visible and infra-red radiation. Alternately, the main reflector material can be an acrylic or polycarbonate sheet about ⅛ inch (about 3.2 mm) thick with a layer of sheet metal reflector adhered to its front surface facing the sun. The metal reflector in this case can be an anodized polished aluminum product, for example MIRO produced by Alanod GmbH. This product is overcoated with silicon dioxide and then titanium dioxide for improved ultra-violet reflection, the titanium dioxide also provides self-cleaning properties and ruggedness, since the hydrophilic nature of titanium dioxide causes rain to remove accumulated dirt from the surface, thereby reducing maintenance and improving lifetime. The metal dents easily, so in case of hail, the main reflector assembly is inverted, so that the acrylic polymer absorbs and deflects shocks caused by impact of hail.

In the second type of reflector assembly, the assembly is an form or molded form having the cross section seen in FIG. 8, typically formed of a recycled plastic, and has edge receivers built in to receive either the mirror or the metal mirror sheet. For reflectors about 2 meters wide and 3 meters long, the acrylic backing mirror material should be about ⅛ inch to 3/16 inch (about 3.2 to 4.7 mm) thick, providing the optimum ratio of flexibility to stiffness for a smooth continuous optical curve.

The apparatus 100 and 800 previously described are free-standing units provided with their own supporting members and intended to be disposed in open areas away from other structures. However, the apparatus of the present invention can also be designed to be mounted on a building wall or roof, and FIGS. 10 and 11 illustrate two different embodiments of this type.

Figure 10:
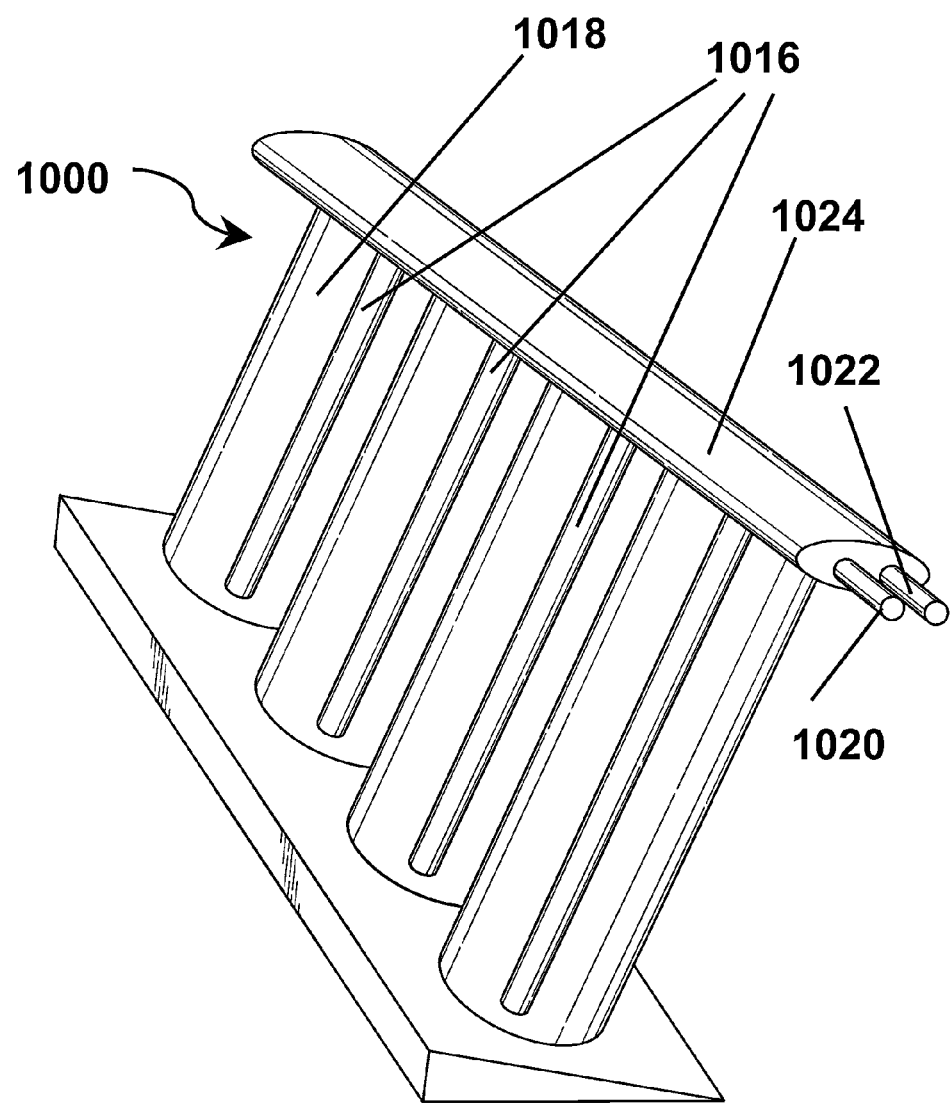
FIG. 10 is a perspective view of a multiple core photolysis apparatus, optimized for vertical installation against a building wall or for use with heliostats.
Figure 11:
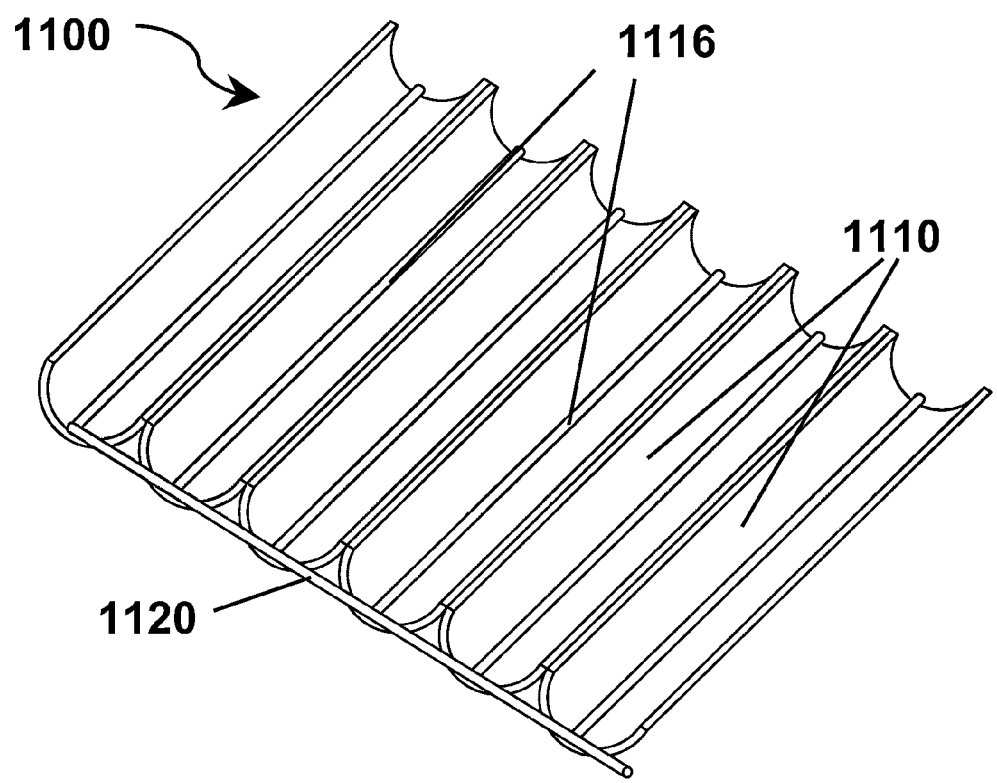
FIG. 11 is a perspective view of a second multiple core photolysis apparatus suitable for mounting on the roof of a commercial or residential building.

The apparatus (generally designated 1000) shown in FIG. 10 is of a "tower" type intended to be supported on a building wall. The apparatus 1000 comprises a plurality of elongate parallel core assemblies 1016, each similar to the core assembly 116 shown in FIGS. 2 and 7; for simplicity, FIGS. 10 and 11 do not show the internal components of their core assemblies. Each core assembly 1016 extends along the axis of an outer cylinder 1018, which is formed of an acrylic polymer capable of transmitting ultra-violet and visible radiation. Each outer cylinder 1018 is sealed at its lower end and its upper end is covered, and the cylinder is filled with water, so that is acts as a focusing lens concentrating sunlight on to the core assembly 1016 running along its axis. Advantageously, the water within the outer cylinders 1018 is mixed with sufficient glycerol to raise its refractive index from the 1.33 of pure water to match the 1.45 refractive index typical of acrylic polymers, thus improving the performance of the cylinder in concentrating solar radiation on the core assembly 1016. The glycerol also acts as an antifreeze to prevent damage to the apparatus 1000 if the apparatus is exposed to freezing temperatures. Alternatively, a Fresnel lens formed of an ultra-violet transmitting polymer can replace the fluid-filled cylinder 1018, and the use of such a Fresnel lens may be advantageous when the apparatus is to be mounted in a location (for example, on a roof which is not capable of supporting large loads per unit area) where the weight of the fluid-filled cylinders may be a problem. The outer cylinders 1018 also act as containment vessels should a core assembly fail during use, and thus allow operation of the core assemblies 1016 at higher pressures than would be safe if the outer cylinders were not present. Oxygen and hydrogen are removed from the apparatus 1000 via tubes 1020 and 1022 respectively, these tubes being housed within a protective manifold 1024.

In the apparatus 1000, it is advantageous for the photoactive electrode to occupy a greater proportion of the hollow cylinder than the less than hemicylindrical electrode 226 shown in FIG. 2; using a photoactive electrode which occupies more than a hemicylinder allows good use of solar radiation without the need for solar tracking such as that carried out by the apparatus 100 described above. For the same reason, the apparatus 100 typically does not incorporate a photovoltaic strip, since if such a strip is included the apparatus 1000 needs to be modified to allow the photovoltaic strip to remain at the secondary focus of the optical system.

So far as possible consistent with the mounting location being used, the axes of the cylinders 1018 shown in FIG. 10 should be tilted so as to parallel to the earth's axis, in the same way as the axis of the polar housing 106 of the apparatus 100 shown in FIG. 1. The cylinders 1018 should also be spaced apart so that they do not shadow each other.

In a variant of the apparatus 1000 shown in FIG. 10, the fluid-filled cylinders 1018 are modified by inserting a second sheet of ultra-violet transmitting polymer within each cylinder, this second sheet being solvent welded to the inside surface of the main cylinder 1018 so as to form a meniscus focusing lens, which is filled with an optical oil or glycerol having a refractive index close to that of the ultra-violet transmitting polymer. The external form of the cylinder 1018 is unchanged but the core assembly 1016 is moved from the axis of the cylinder 1018 to adjacent the back surface thereof (i.e., adjacent the surface on which the apparatus 1000 is mounted) where the new primary focus is located. A photovoltaic strip may be mounted in the center of the rearward surface of the meniscus focusing lens. This form of the apparatus does require solar tracking, but such tracking is readily achieved by mounting the cylinders 1018 on rollers which can be rotated by an appropriate motor.

The cylindrical tower apparatus 1000 shown in FIG. 10 is more resistant to high winds than the apparatus 100 shown in FIG. 1, and is more easily integrated into a building design. The apparatus 1000 may also be considered more architecturally attractive than the freestanding apparatus 100.

FIG. 11 illustrates a further multi-core apparatus (generally designated 1100) of the present invention which is generally similar to the apparatus 1000 shown in FIG. 10 but is adapted for roof mounting. The apparatus 1100 comprises a plurality of elongate parallel cores 1116 joined by a common manifold 1120; obviously, if desired, a second common manifold could be provided at the opposed ends of the cores 1116 from the manifold 1120. However, in the apparatus 1100, concentration of radiation is provided by a plurality of hemicylindrical, mirrored reflectors 1110; alternatively, a multiple Fresnel top sheet overlying the cores 1116 could be substituted for the reflectors 1110.

Figure 12:
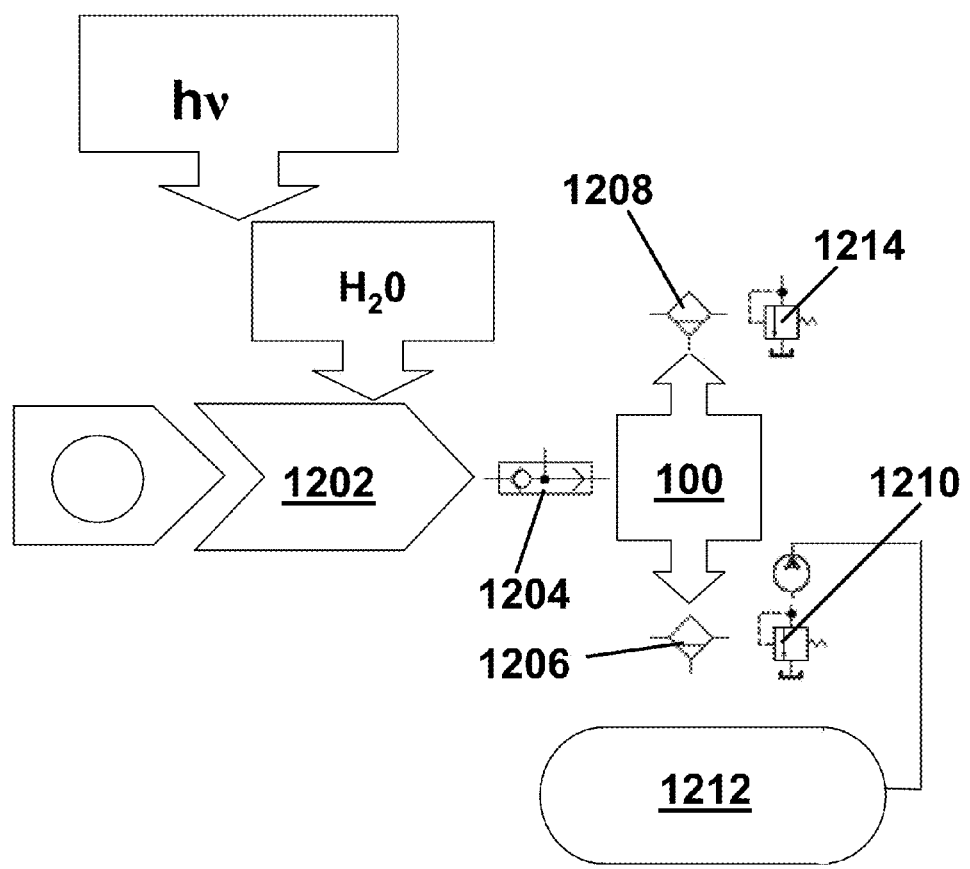
FIG. 12 is a block diagram showing various auxiliary apparatus used in conjunction with the apparatus shown in FIG. 1.

FIG. 12 illustrates schematically the various auxiliary apparatus which is used in conjunction with the apparatus 100 described above to collect and store the hydrogen and oxygen gases produced and to refill the apparatus with water to replace that electrolyzed. Although not shown in FIG. 2, the apparatus 100 is in fact provided with an additional tube extending through the top plate 214 through which additional way can be introduced into the apparatus, as schematically illustrated by "$H_2O$" in FIG. 12. As already described, the apparatus 100 is also supplied with solar (or other) radiation, as schematically illustrated by "hυ" in FIG. 12. The additional water ("feedstock") can be ocean water. While the electrochemical potential for forming chlorine gas is very close to that of oxygen formation, it is still higher, so oxygen is formed preferentially over chlorine gas at low brine concentrations. Ocean water is only 3.5% sodium chloride by weight, which is a low concentration, and so chlorine is not formed. However, if ocean water is the sole replacement water, the salt concentration will grow within the apparatus 100 until it reaches saturation, or about 21% by weight, after which salt would precipitate out within the apparatus as sediment which have to be removed. However, because typically the formation of chlorine gas is not desired, the core assembly 116 (FIG. 2) is flushed with ocean water at intervals (at least annually) to keep the salt concentration low. As indicated schematically at 1202 in FIG. 12, the apparatus includes provisions for filtering incoming water to remove algae, rust, iron, chlorine, fluoride, and other contaminants. After filtration, the water passes through a float valve system 1204 during cool, low pressure condition of the core assembly 116 at night or at other times of low pressure within the core assembly.

As schematically indicated in FIG. 12, the hydrogen and oxygen gases leaving the apparatus 100 pass through pressure relief valves, 1206 and 1208 respectively, that provide both backpressure with the core assembly 116 and safety pressure release. The hydrogen then passes through compression apparatus 1210 and is stored under pressure in a tank 1212; the oxygen may be similarly compressed as indicated at 1214 and stored (storage tank not shown), or, depending upon the location of the apparatus 100 and commercial demand, may simply be vented to atmosphere. Those skilled in the art of gas collection will understand that a variety of additional apparatus may be included which is not shown in FIG. 12, for example thermal probes to monitor gas temperatures, and condensers and desiccants to conserve electrolyte and remove water vapor from the output gases.

In this connection, it should be noted that, in the multiple core apparatus of FIGS. 10 and 11, the pipeline connections to individual core assemblies are arranged in parallel rather than serially, so that a leak in one core assembly only affects the leaking core assembly and not the entire apparatus.

Although the apparatus has been described above principally as used to generate hydrogen and oxygen from water, the chemistry of the electrolyte can be altered to produce different electrolysis products that may be useful for manufacturing processes. For example, if the electrolyte is a brine with high salt concentration, the products will be hydrogen gas, chlorine gas, chlorine water (water containing dissolved chlorine gas) and sodium hypochlorite, a bleach. If sodium carbonate or bicarbonate are used, the gaseous products are hydrogen and carbon dioxide. Additionally, if carbon dioxide bearing electrolytes are used, such as carbolic acid and/or carbonated electrolyte, the product can be carbon monoxide. In this way, carbon dioxide from fossil fuel plants or other production can be sequestered in an electrolyte and then converted with sunlight to carbon monoxide. The carbon monoxide is then used as the feedstock to produce methane or even gasoline-like liquid fuels by adding hydrogen, as is well known. Such processes are Fischer Tropsch or variants of them. But in this case the carbon monoxide and the hydrogen are produced with sunlight and a photolytic reaction. A liquid fuel produced in this way is carbon neutral, in that it sequesters as much carbon as it releases upon being combusted. Further, the infrastructure for handling, transporting, and using liquid fuels already exists.

As already mentioned the preferred forms of the apparatus can use any photoactive electrode capable of photolysis of water to hydrogen and oxygen, or of the other photolytic reactions discussed in the preceding paragraph. However, this invention also provides preferred photoactive electrodes for use in the apparatus described above or similar apparatus; more specifically, this invention provides photoactive electrodes containing bandgap shifted titania (or a similar ceramic) and two different processes for the production of such photoactive electrodes; in the first process, a thin film of titania is formed on a substrate which is already provided with the sharply curved surfaces necessary to shift the bandgap of the deposited titania, while in the second process an acid etch of a titanium film (which can be a film of the relatively impure and inexpensive Grade 1 or Grade 2 titanium) is followed by conversion of the etched titanium film to titania by anodization or heat oxidation.

It is known that the bandgap of a semiconductor can be altered by (1) doping, (2) adding stress, and (3) adding heat. The present invention makes use of the stress that is inherent in thin films, and specifically the tensile stress, to shift the bandgap of a semiconductor further into the visible spectrum. Bandgap-shift from local heating caused by self-focusing of radiation within the film also contributes to the bandgap-shift effect, but appears to be of secondary importance in this invention. For example, the energy bandgap of gallium arsenide (GaAs) requires a 900° C. change in temperature to drop only 0.4 eV, from 1.5 eV at 100° C. down to 1.1 eV at 1000° C. On the other hand, significantly higher magnitude changes in stress can be achieved in this invention, and hence stress is the predominant factor in the lowering of the bandgap energy.

When tensile stress is applied to or caused in a semiconductor, the inter-atomic spacing increases directly. An increased inter-atomic spacing decreases the potential seen by the electrons in the material, which in turn reduces the size of the bandgap. The same effect occurs with increased temperature, because the amplitude of the atomic vibrations increases with increased thermal energy, thereby causing increased inter-atomic spacing. In the present invention, accordingly, stress is carefully controlled to achieve the desired bandgap shift. The stressed titania film of the present invention may or may not be formed on substrate separate from the titanium/titania layer itself. If the titania (or similar) film is formed on a substrate, the stress is further managed to prevent delamination, by introducing periodic three-dimensional nano-scale surface features into or on to the substrate. These features act as a template such that the film that is grown on to the template takes on a similar shape. FIG. 20B is a schematic side elevation of a titania film grown on to a polycarbonate template comprising a close-packed three dimensional sinusoidal surface, much like an egg carton, with a spatial period of 300 nanometers (nm) or 0.3 microns. The resulting titania features or nanostructures are adjacent hemi-cylinders, at the apex of which the titania is in very high tensile stress (otherwise known as strain). It should be noted that there are essentially no gaps between adjacent nanostructures.

FIG. 13A is a cross-section showing a substrate 1317' having undulations 1317 on its surface that transfer to a titania coating 1316 applied by a vacuum technique as taught in the parent application. The titania coating has a film thickness 1313 of about 200 nm, although it can be thinner or thicker depending on the coating conditions and the geometry of the substrate. As shown in FIG. 13A, the titania coating undulations can be made conformal, i.e. they can follow the curves in the substrate exactly, but they can also be made non-conformal, more like adjacent hemi-cylinders, with sharp cusps in between, depending on the coating film growth conditions and target to sample geometry, and the substrate undulation geometry: peak to valley height 1315, radius of curvature 1314, and pitch 1312. With a polycarbonate substrate 1317', the thermal contraction of the polycarbonate after coating is larger than of the titania thin film, resulting in very high stresses in the titania layer, namely tensile stress (indicated at 1318) at the apices of the undulations, and compressive stress (indicated at 1319) in the troughs. Such compressive and tensile stresses are present in thin film coatings on planar substrates as well, depending on whether the substrate grows or shrinks, respectively, relative to the film after coating, and such surfaces are within the scope of this invention when applied to stress-induced bandgap shifting, particularly of titania.

FIG. 13B is a cross-section through such a planar substrate 1321 and titania coating 1320, in which the stress (indicated at 1323) is compressive, while FIG. 13C is a similar cross-section through a planar substrate 1326 and planar coating 1325 in which the stress (indicated at 1324) is tensile stress. The undulations in the preferred embodiments create much higher tensile stresses because of the introduction of very small localized bending radii, such as the radius 1314 in FIG. 13A. In addition, in some embodiments of the invention the undulations provide a mechanical lock between the substrate and the coating, which allows high stresses to exist without delamination.

The resulting bandgap-shifted semiconductor, titania in the preferred embodiment, is then applied to photoelectrolysis for hydrogen production, or for photovoltaic electricity production, or photocatalysis for detoxification and disinfection, as described below. Other semiconductors, including but not limited to strontium titanate, amorphous silicon, hydrogenated amorphous silicon, nitrogenated amorphous silicon, polycrystalline silicon, and germanium, and combinations thereof, will also exhibit a shift in their respective band-gaps toward a more favorable part of the solar spectrum with this applied stress.

Thin films, whether for optical, magnetic, semiconductor, or other application, and whether of dielectric, metallic, semiconductor, or other material, are typically inherently stressed as applied. Stress in thin films can lead to delamination of the film from an adjacent layer, also known as adhesion failure, and can also change the optical, magnetic, or electronic properties of the film. Therefore, stress in thin films is normally thought of as something to be managed or tolerated rather than as something useful. In films produced by one process described in the parent application, in which the film is formed by vacuum coating onto a shaped substrate, stress is controlled by, and herein also induced by, the following non-limiting factors: (1) film thickness; (2) rate of application (film growth) measured in angstroms/second; (3) mean free path and vacuum level; (4) e-beam energy; (5) match of film and substrate mechanical and thermal coefficients; (6) shape of the substrate on both a nanometer and macro level; (7) target material from which the film is evaporated; (8) distance of the substrate to the source (tooling factor); (9) the presence or absence of mitigating layers; and (10) implanting ions during or after deposition to change the material and stress. Stress in the film can be made to be either tensile or compressive, and is induced also by bending. Stress in the film can also be photo-induced, especially if the film is self-formed into internally or self-focusing optics.

The films described both here and in the parent application are contiguous thin films, rather than particles. However, it is known in the art than on a nano and micro scale all thin films exhibit some crystalline structure, particulate aggregation, and porosity. Also, small polymer or other particles, such as titanium in the present application, can be coated with titania or have the titania grown into and onto them to cause the stress-inducing band-gap shifting on a particle level, and these particles can be applied through, for example, a spray, or in a suspension applied by inkjet, or simply painting them on, suspended in a binder. Further, a titania coating can be applied to fibers, especially polymer fibers, to achieve the same stress-induced benefits. These fibers can then be woven into protective fabrics for garments, into air filters, or into paper for antibiotic envelopes.

As taught in the parent application, titania films can be formed with chemical vapor deposition, sol-gel, or vacuum coating, for example. With chemical vapor deposition, the material is deposited as an ash, which then coalesces into a contiguous film upon application of heat from, typically, a gas flame. Sol gel coatings have the titania particles in a solvent that is spun coated or dipped or otherwise applied to a substrate. If the solvent is driven off, the film that remains is a porous matrix of titania particles. This is done typically for the dye-adsorbed solar application of titania. The film can be several microns thick, and the dye within the porous cavities increases the amount of surface area for interaction. If this film is baked, the titania particles will coalesce into a reasonably contiguous film.

While it is possible to induce the required stress with the above coating approaches, thin film vacuum deposition is preferred for inducing the highest stress and with the lowest amount of material. Typical vacuum deposition methods include sputtering, electron-beam, and ion deposition, for example. The inventors' earlier work with these structures, which at this size are nano-optics, for the application of increasing optical data storage density, has shown that they indeed focus incident light and increase the power density at their focal plane (rigorous electromagnetic modeling, thermal finite element modeling, and empirical results with phase change materials placed at the focus plane all corroborate this). Further, their sinusoidal to cylindrical shape naturally gives rise to significant tensile stress. One or both of these factors cause the bandgap to drop to a level at which spontaneous photoelectrolysis of water can occur in a spectral region that is abundant in sunlight. Stress in thin films can be controlled by a combination of film thickness, substrate-to-film match or mismatch of thermal and mechanical coefficients, micro or nano-scale shape, and by the addition of other thin films.

While there is certainly a benefit to having the stress-inducing shape perform also as a light concentrator, it will be clear that other stress-inducing template profiles may be used, even if they do not also act as light concentrators.

Stress in thin films can be as low as 2 MPa (MegaPascal), but is more typically up to 100 MPa, and can reach into the GigaPascal region depending on the coating conditions, the thin film or thin film stack, and the substrate. The stresses can be so high that a thin dielectric film only a couple of hundred nanometers thick can cause a substrate as thick as a millimeter to be noticeably distorted by bending, and in fact this distortion is used to monitor stress optically by observing deflection of light from such a bending substrate during coating.

The stress in the thin film $\sigma$ can be expressed to first order as the intrinsic film stress $\sigma_i$ caused by the coating conditions plus stress $\sigma_e$ from an external bending force F (in Newtons N):

$$\sigma = \sigma_i + \sigma_e \quad (3)$$

where it is assumed that the Young's moduli of film and substrate are equal. However, additional stress can be induced in the thin film when Young's moduli of film and substrate are decidedly unequal. Moreover, if the substrate/film interface is undulating on a spatial scale of the same order of magnitude to the thickness of the coating, such unequal moduli result in significant bending forces on the film. The relation of the external stress $\sigma_e$ to the bending force F is:

$$\sigma_e/F = 12 \text{ MPa/N} \quad (4)$$

It can be seen from Equation (4) therefore, that even small external forces are leveraged into large stresses in the film. A film of titania only 125 nm thick, deposited on a thick polycarbonate substrate having a surface embossed or otherwise formed into a sinusoidal, hemispherical, or hemi-cylindrical geometry with a spatial period of 370 nm, can experience stress in the GigaPascal range or higher, sufficient to significantly alter the bandgap. Such stresses in planar thin films can cause the films to crack and even delaminate from the substrate, where in the compressive stress case the film behaves much like the earth's crust in plate tectonics, and literally explodes away from the surface, leaving a gaping crack (see FIG. 9a in the aforementioned Guerra, "Photon Tunneling Microscopy Applications"). In the tensile stress case, the film pulls away from itself, leaving a crack in the coating that scatters light (see FIG. 8b in Guerra, "Photon Tunneling Microscopy Applications"). Scientists in the thin film coating world usually strive to reduce stress in thin films, accordingly. However, it is recognized that some level of stress will always be present in a thin film, and so when stresses cause delamination, they refer to this as adhesion failure, in recognition that controlling and increasing adhesion between the layer and the substrate will allow the layer to remain intact in the presence of modest internal stress if the adhesion is high enough. In one aspect of this invention, the corrugated substrate not only causes the film to be in a highly stressed state, but also locks the film to the substrate and prevents delamination, even though in a highly stressed state.

As described above with reference to FIG. 13A, titania at the apex of a sinusoidal surface experiences tensile stress, while the titania in the trough of the sinusoidal surface experiences compressive stress. Thus, in photoelectrolysis, detoxification, and disinfection, the desired photocatalytic activity is induced in the titania at the part of the surface (apex) closest to the object of photocatalysis. Because the stress varies continuously from tensile to compressive, the bandgap is not only shifted but broadened as well. Further, more of the film is in a beneficially stressed state than would be the case for a bulk form of the titania, where the stress would be largely near the surface and a comparatively much smaller percentage of the bulk volume of the semiconductor.

In the prior art discussed in the introductory part of this application, when titania was used as the photocatalyst, it was typically in the rutile form, and n-type, and in the form of a wafer cut from a rutile crystal. Others have used hot pressed titania in a polycrystalline form, or in the anatase form, reporting a slightly better efficiency. No prior art known to the inventors discloses the use of titania in the form of a vacuum deposited thin film, and none discloses thin films of titania deposited onto plastic substrates with or without corrugations on the surface. In such a vacuum deposited thin film of titania, the film can have several material states: polycrystalline, amorphous, anatase polymorph, and rutile polymorph. How many and what kind of states exist and coexist in the film, and in fact even the stoichiometry, are determined by how the film is deposited (e.g. e-beam), what substrate it is deposited on to, and what conditions are used in the coating process (substrate temperature, deposition rate, pressure, and starting target, for example). These same conditions also control the level of stress in the film. For example, titania films deposited with e-beam evaporation are typically amorphous, with higher refractive index than titania films deposited by, say, ion assisted deposition. On the other hand, energetic ion- and plasma-based deposition produces denser titania films that are also less rough than those deposited with e-beam. It is further known that substrate temperatures above 380° C. result in polycrystalline titania films of primarily the rutile phase, while substrate temperatures of between 310° C. and 380° C. produce polycrystalline titania with both anatase and rutile phases. Titania can be formed with a TiO or even Ti target and oxygen bleed-in during the deposition, and this reactive evaporation results in predominantly rutile titania, while starting with a $Ti_3O_5$ target results in anatase titania. Other features of the titania film, such as density, roughness, resistance to water adsorption, and stress are also highly dependent on the starting target material. For example, the $Ti_3O_5$ target is chosen because films made from it are lower stress, which is not a desirable feature in this application. Optical absorption is another property controlled by the starting material, and is reduced by a factor of 10 with TiO as the target material, and by a factor of 100 with $Ti_2O_3$ or $Ti_3O_5$ as the target. Of course, the science of coating, and in particular the coating of titania films, is very complex and not completely predictable. Nevertheless, titania films useful in the present invention can be formed by a number of different coating techniques, coating parameters, and starting materials. The present discussion is only by way of example to indicate some of the controls that are available and possible to form titania with a specified material state or states.

Figure 19:
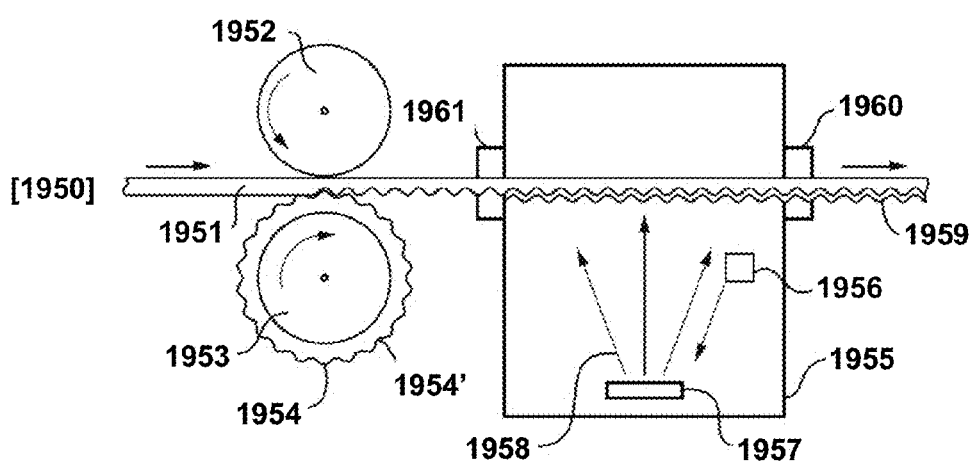
FIG. 19 shows an embossing and vacuum coating process for forming the nano-structures and the titania, from the aforementioned application Ser. No. 10/424,259.

FIG. 19 illustrates schematically one method for large scale manufacture of photoactive electrodes of the present invention comprising titania films on undulating substrates.

In FIG. 19, a polycarbonate substrate or a titanium foil (also known as a coil in the industry) 1951 is delivered from a roll (indicated at 1950) into an embossing machine, in which a stamper 1954 containing the desired undulation shape and pattern 1954' and wrapped around roller 1953, is embossed into the polycarbonate or the titanium coil using known embossing techniques that may include heat and/or solvents to varying degrees. The stamper is typically a nickel replica grown from a master, and may be coated with a harder material such as diamond-like carbon coating when working with titanium coil. The master is typically a photoresist or photoablative polymer on a glass or silicon substrate, into which the desired undulations have been formed by one of the following methods: contact lithography, projection lithography, interferometric lithography, or laser beam recording. Finally, the embossed polycarbonate web is coated in a vacuum chamber 1955 with e-beam 1956 (the preferred method, although others can of course be used) sputtering, ion-assisted deposition, or thermal evaporation, from a target 1957. Material 1958 from the target then deposits onto the web 1951. The result is that the polycarbonate or titanium emerges from the chamber coated with, in this example, titania 1959. In FIG. 19, sealing means 1960 and 1961 are provided to maintain a vacuum lock on the web, but the entire roll can alternatively be in the coater at one time. Sol gel or chemical vapor deposition are also possible means of coating. Also, instead of roll manufacture, the polycarbonate substrates can be injection/compression molded to the stamper. All of these techniques are known in the optical data storage and other industries. It is an important advantage of the present invention that bandgap-shifted titania can be manufactured with existing infrastructure in low-cost mass production methods, because any solar energy conversion application requires large area, low cost devices. However, in the case where the base material is titanium foil, it will be seen that it is advantageous to use a titania forming method other than vacuum coating.

The second main method for the formation of photoactive electrodes of the present invention will now be discussed, this second method, as already mentioned, comprising etching of titanium metal to form nano-structures in the titanium, followed by anodizing or oxidation, or both, to convert the etched titanium to titania, preferably in the anatase form. As a preliminary matter, some theoretical discussion of the variation of titania bandgap with physical parameters will be given; this theoretical discussion is of course also applicable to nano-structured titania coatings produced by the first method of the present invention.

As already mentioned, it is well known that the bandgap of a semiconductor changes with change in volume of its lattice, this change of volume being caused by, inter alia, temperature change or applied pressure. To understand how this general principle applied to the anatase form of titania, changes in the bandgap of this material were modeled as a function of biaxial strain. To achieve quantitatively accurate results, the GW approximation was used to calculate the bandgap. The GW approximation (GWA) is an approximation made in order to calculate the self-energy of a many-body system. The approximation is that the expansion of the self-energy Σ in terms of the single particle Green function G and the screened interaction W can be truncated after the first term. We used ABINIT software to achieve the GW approximation (ABINIT is a free software package for physicists, distributed under the GNU General Public License, whose main program allows the total energy, charge density, and electronic structure of systems made of electrons and nuclei (molecules and periodic/crystalline solids) to be calculated within Density Functional Theory (DFT), using pseudopotentials, and a plane wave basis.)

It was also important to determine the effective mass of the charge carriers in the semiconductor, since large effective mass charge carriers can lead to higher recombination of photogenerated electron-hole pairs and hence to reduce efficiency of the electrode. Accordingly, density functional theory modeling was used to produce complete band structure plots which could be used to estimate the effective mass of the charge carriers. Theoretically, the bands follow a quadratic relationship around the conduction band minimum and valance band maximum energies. The curvature of this quadratic is inversely proportional to the effective mass. Integrating ASTM International (originally known as American Society for Testing and Materials) solar irradiance data and assuming 100% photon conversion efficiency leads to the maximum achievable solar-to-hydrogen conversion efficiency. Using the GW modeling result from above further allows us to model this maximum efficiency as a function of total pressure. The band gap of anatase at zero pressure was assumed to be 3.2 eV, corresponding to a maximum efficiency of about 3.7%.

Figure 14:
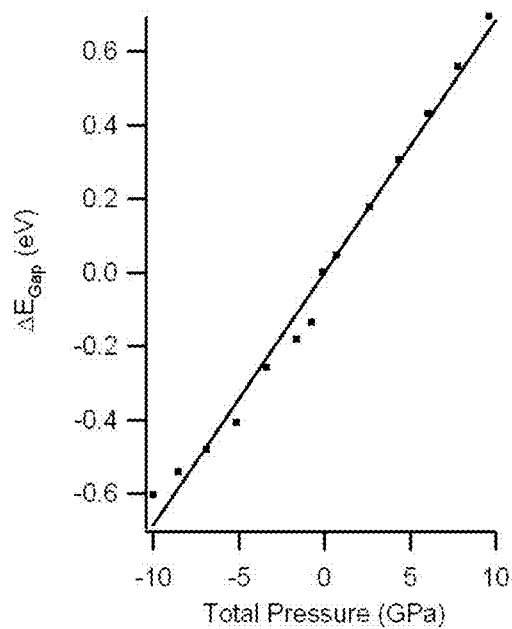
FIG. 14 is a graph showing the variation of the bandgap of anatase with applied pressure as calculated in the theoretical modeling described below.
Figure 15:
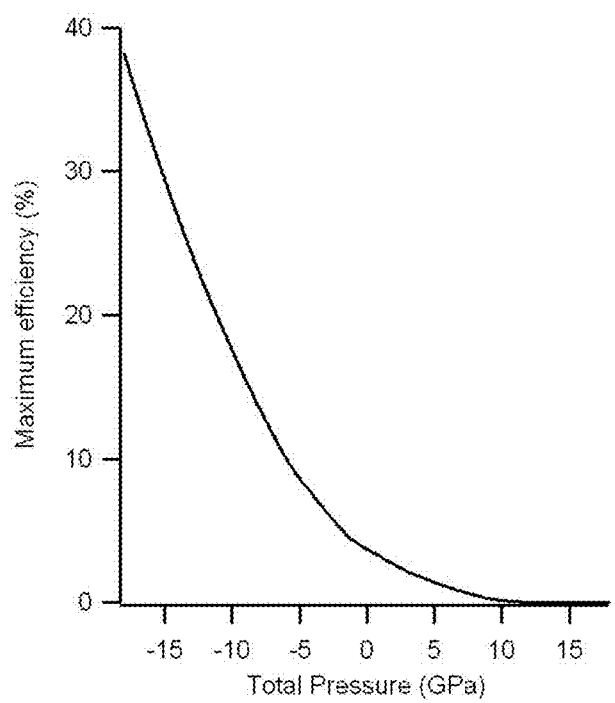
FIG. 15 is a graph showing the variation of efficiency of an anatase electrode with applied pressure resulting from the bandgap variation shown in FIG. 14.

FIG. 14 shows the change in bandgap $\Delta E_{Gap}$ with pressure derived from the GW approximation. The calculation indicates that the bandgap is expected to change linearly as a function of the applied pressure at a rate of 0.0686 eV/GPa. Thus, a pressure of about −10 GPa (a negative pressure denoting a material in tension) reduces the bandgap of anatase from 3.2 to about 2.5 eV. FIG. 15 shows the expected increase in photolytic efficiency resulting from the bandgap reductions with pressure shown in FIG. 14; it will be seen from FIG. 15 that negative pressure of about −10 GPa is expected to increase the efficiency of the electrode about five-fold, from about 3.7 percent to about 20 percent.

From the anatase structure, there can be derived the full band structure plot shown in FIG. 16A. FIG. 16B shows an enlarged view of the part of FIG. 16A indicated by the arrow, and shows only the top of the valance band and the bottom of the conduction band. FIG. 16B also shows the quadratic fits used to calculate the effective mass of the holes and electron charge carriers, denoted $m_h$ and $m_e$ respectively.

Figure 18:
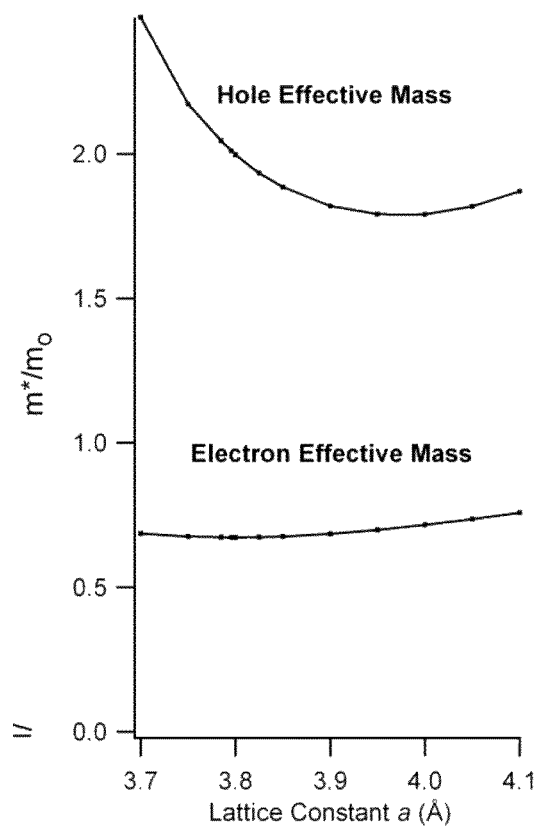
FIG. 18 is a graph showing the variation of the effective mass of the electrons and holes in anatase with lattice constant, as calculated from quadratic fits similar to those shown in FIG. 16A.

From plots such as those shown in FIG. 16B, the variation of the effective mass of the holes and electrons with applied pressure can be calculated, and the result is shown in FIG. 17 (FIG. 18 shows the results versus lattice constant); note that in FIG. 17 the total pressure is non-uniform to induce biaxial strain. From this Figure, it will be seen that (as expected) the effective mass of the electrons varies very little with pressure within the pressure region of practical interest, but the effective mass of the holes varies markedly with pressure. From FIG. 17, it will be seen that anatase subjected to negative pressures (i.e., placed until tensile stress) exhibits lowered effective mass of the holes. For reasons mentioned above, lowered effective mass of the charge conductors is desirable since it reduces recombination of electron-hole pairs, and thus further enhances the efficiency of the electrode.

The foregoing theoretical calculations can also show why titania formation, which is the second step of the present process, either by anodizing or thermal oxidation of metallic titanium normally results in titania having its bandgap shifted to higher values, corresponding to the ultra-violet portion of the spectrum. Both types of oxidation essentially force oxygen atoms into the metallic lattice, resulting in a lattice under compressive stress, with a consequently increased bandgap, requiring shorter wavelength radiation for photoactivity and essentially rendering the resulting titania useless for solar radiation based processes.

However, the first step of the present process is to wet etch the titanium substrate to form nanostructures of the desired geometric shape and size. These nanostructures form geometric boundaries that constrain the growth of the titania in the second step, thus giving rise to alternating regions of compression and tension in the resulting titania layer. The present invention is further to control this second step so that the final surface of the titania exposed to the electrolyte is in tension (strain). In this way, we are able to produce in a second step, by anodizing or heat oxidation of metallic titanium, titania having a bandgap shifted toward longer, visible wavelengths.

The aforementioned parent application Ser. No. 10/424,259 teaches nanostructures that are substantially hemispherical or hemicylindrical, as shown in the schematic cross-section in FIG. 20A, where one way of forming the nanostructured template for such geometry is the embossing and coating method shown in FIG. 19. FIG. 20C is a photomicrograph showing actual titania nanostructures that we formed in this way.

However, we have now found that higher aspect ratio nanostructures spaced from one another so that they are not touching produce much higher levels of strain in the subsequently formed titania layer, and so the bandgap is lowered substantially more than with the hemispherical structures. We have determined this experimentally by forming such structures as are seen in FIGS. 23A, 23B, 24A and 24B and measuring their bandgap.

Further, we have used The Florida Object Oriented Process Simulator (FLOOPS) to calculate the actual strain levels in various structures including that shown in FIG. 20B. FLOOPS (release 2002 (see M. E. Law and S. Cea, Comp. Mater. Sci. 12, 289 (1998).)) is a finite element analysis tool for simulating many of the process steps typically employed for the development of silicon-based integrated circuit devices (Copyright Mark Law, University of Florida Electrical and Computer Engineering department). Of particular interest to us is the stress computation during simulation of the thermal oxidation of silicon. The thermal oxidation model described in B. E. Deal and S. Grove, J. Appl. Phys. 36, 3770 (1965) forms the basis of the FLOOPS simulation. Although this model was developed for the thermal oxidation of silicon, it can be applied to titanium for temperatures greater than 500° C. Titanium oxidizes at a much higher rate than silicon, but the functional time dependence is very similar. Therefore, adaptation of the model to simulate thermal oxidation of titanium is largely a change in the rate constants of the model. The stress computations in FLOOPS relate stress and strain through a viscoelastic constitutive equation. This is essentially achieved by modification of Hooke's law to include a temperature dependent viscosity, or damping, term. Hooke's law relates stress and strain by a stiffness matrix that is a function of the material crystal symmetry and mechanical properties (Young's modulus and Poisson's ratio). Simply changing the mechanical parameters from the default silicon and silicon dioxide values to the appropriate values for titanium and titanium dioxide provides a simple first order means to adapt stress computations to our system. Stress computations within the oxide layer are reported using a Young's modulus of 204.06 GPa and a Poisson's ratio of 0.31. To our knowledge there exists no reported experimental measurement of the Poisson's ratio(s) for the anatase polymorph of titania, but our results to date indicate that the stress computation is not strongly dependent on this parameter. The stress is reported as a total pressure by using the standard definition of averaging the longitudinal components (familiar extension and compression components of the stress matrix as opposed to shear terms).

Figure 21A:
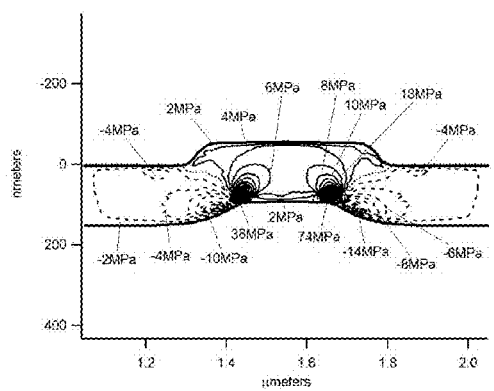
FIGS. 21A to 21D shows strain calculations and thermal oxide titania growth modeling obtained with FLOOPS.
Figure 21B:
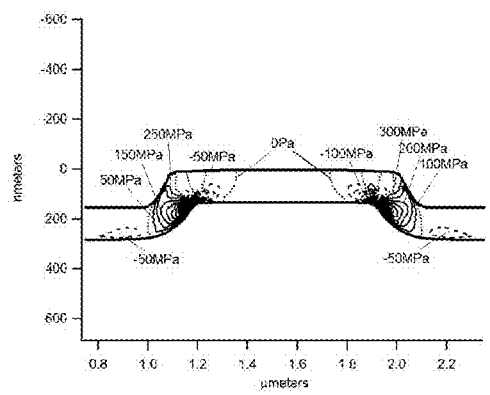
Figure 21C:
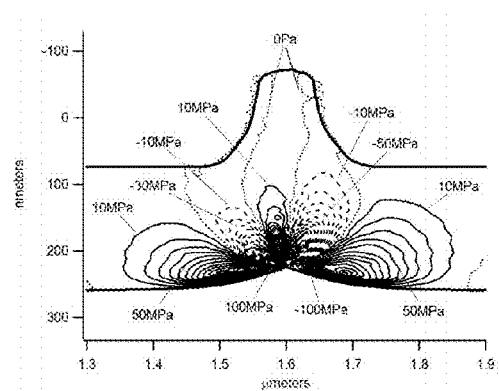
Figure 21D:
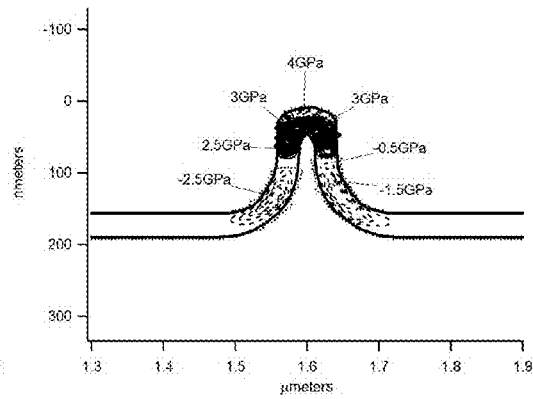

We simulated the thermal oxidation process using FLOOPS with the modifications to the mechanical parameters as described. Our investigation characterizes how non-planar geometric features on the titanium substrate introduce stress into the titania thin film formed during the thermal oxidation process. FIGS. 21A-21D show some key calculations. In particular, FIG. 21D shows a nanostructure that resulted from a 100 nm wide starting point, very similar to the nano-structures that have been produced experimentally. As expected, alternating regions of tension and compression are generally formed. Large tensile stress is typical around outer corners while compressive regions are characteristic of inner corners. As in FIG. 21D, substrates with small features in the range of 100 nm and short oxidation times are predicted to be highly stressed. Tensile stresses on the order of 4 GPa are seen near the apex of the structure. The stress is predicted to decrease dramatically as the film thickness increases and for features with low aspect ratio. Also, because the stress is concentrated around corners, or transitions, in the substrate, wider features will have fewer transitions and concomitantly less overall stress throughout the film. Final optimizations, including the introduction of periodicity, sharpness of the corners, and 3-dimensional hexagonal arrays are expected to further enhance the magnitude of the stress.

As already mentioned, the first step of this process is formation of nano-structures by wet etching of titanium metal, preferably in the form of a thin sheet, typically having a thickness in the range of about 0.07 to 0.5 mm. Since only a small depth of the titanium surface is converted to photoactive titania on the titanium electrode, an excessively thick sheet wastes titanium metal; however, too thin a sheet may be easily damaged during processing and is more costly due to the extended rolling process required to make it thin. As discussed in more detail below, the presently preferred commercial titanium film is 0.25 mm thick.

Figure 22:
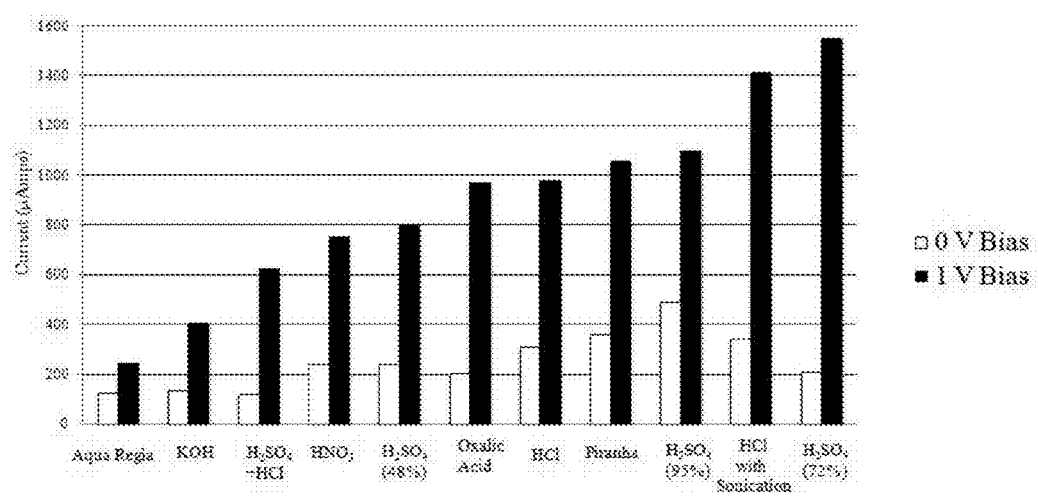
FIG. 22 is a bar graph comparing the performances of titania photocatalysts prepared using various different etchants in the etching step.

The goal of the wet etching is to produce in the titanium sheet nano-structures having these desired features: mean diameter of about 100 nm, high aspect ratio of at least 1:1, and some space between adjacent nano-structures. Further, it is desired to have a tight distribution of sizes. The acid etching may, so far as is presently known, be effected using any strong acid capable of rapidly etching titanium metal, although obviously acids which deposit insoluble titanium salts of the film should be avoided. FIG. 22 is a bar chart showing the photocurrent at zero volts bias (black outlined white bars) and at 1 volt bias (black filled bars). All samples were Grade 1 titanium and were all heat oxidized in the same way, but were first etched in various etching acid solutions as indicated. Because it yields the highest photocurrent (i.e., hydrogen production) at 1 volt bias with good photocurrent at zero volts bias, the presently preferred acid is sulfuric acid, which may be used at concentrations above about 93 percent, and preferably in the range of about 93 to about 98 percent. The sulfuric acid etch may be carried out at a temperature in the range of about 60 to about 100° C., and preferably about 75 to about 85° C. To ensure accurate control of the etching process, the process should be carried out for a predetermined period beginning with the onset of active etching as indicated by visible bubble formation. The optimum etching period for any particular combination of etchant type and concentration, temperature and specific titanium film may readily be determined empirically, but etching times will typically be in the range of about 60 to 600 seconds. In the presently preferred etching process, sulfuric acid is used for etching at a concentration of temperature of 93 to 98 percent at 80° C. for 210 seconds from the onset of bubble formation.

It is generally preferred to avoid the use of hydrochloric acid in the wet etching step. Although hydrochloric acid produces satisfactory nano-structures and, as can be seen in the bar chart in FIG. 22, good resulting photocurrent as well, it leaves the titanium surface blackened due to the formation of a titanium hydride layer, which should be removed prior to anodization or heat oxidation since it interferes with formation of an oxide layer, and reduces adhesion of the oxide layer to the underlying titanium metal. Although the hydride layer can readily be removed by etching with the sulfuric acid, the resultant two-step process is unnecessarily complex as compared with the preferred one step sulfuric acid etch. It is also possible to form the hydride layer with sulfuric acid, but the resulting layer is either dissolved subsequently by the same sulfuric acid, or is easily wiped off. Therefore, our preferred embodiment is to use the sulfuric acid etch as described above, with other satisfactory etchants including the "Piranha" solution, oxalic acid, weaker sulfuric acid such as 48% concentration, and even nitric acid. However, potassium hydroxide and Aqua Regia gave unfavorable photocurrent results.

Hitherto, it seems to have been assumed that very pure titanium was required for the formation of high efficiency titania photoactive electrodes. The present inventors have found this not only to be untrue, but that "commercially pure" forms of titanium metal are preferred for use in the etching and titania forming processes of the present invention because they react with the etchant to naturally give rise to the desired spacing between the nanostructures as illustrated in FIG. 20B and imaged in FIGS. 23A, 23B, 24A, and 24B. However, of the commercially pure grades, only Grade 1 titanium having the following specification by weight:

C 0.1% maximum
Fe 0.2% maximum
H 0.015% maximum
N 0.03% maximum
O 0.18% maximum
Ti 99.5% minimum, up to about 99.6% or "Grade 2 titanium", which are orders of magnitude less costly than pure titanium, give the desired results. Grade 2, which is available commercially from a variety of suppliers is defined (see for example ASTM B863-06a) as meeting the following specification by weight:

C 0.1% maximum
Fe 0.3% maximum
H 0.015% maximum
N 0.03% maximum
O 0.25% maximum
Ti 99.2% minimum, up to about 99.6%

It appears that the impurities in Grade 1 or Grade 2 titanium actually improve the formation of nano-structures during acid etching because the impurities work with the etching process to create lands between the nano-structures that were not attainable with pure titanium foil, which in turn increases stress and pushes the bandgap edge further into the visible. In addition, the aspect ratio of the nano-structures is much improved, being taller than they are wide, with a nearly triangular cross section. Achieving such desired structures with pure titanium foil, and with any other process, would be very difficult, very costly, or would not lend itself to mass manufacturing. Furthermore, the electrodes produced by the second process of the present invention are expected to have a lifetime of decades, and this second process is less costly and has lower energy requirements than prior art processes.

Figure 20A:
FIGS. 20A and 20B are schematic side elevations showing nano-structures formed on a preformed substrate (FIG. 20A) and by acid etching of a titanium metal film (FIG. 20B).
Figure 20C:
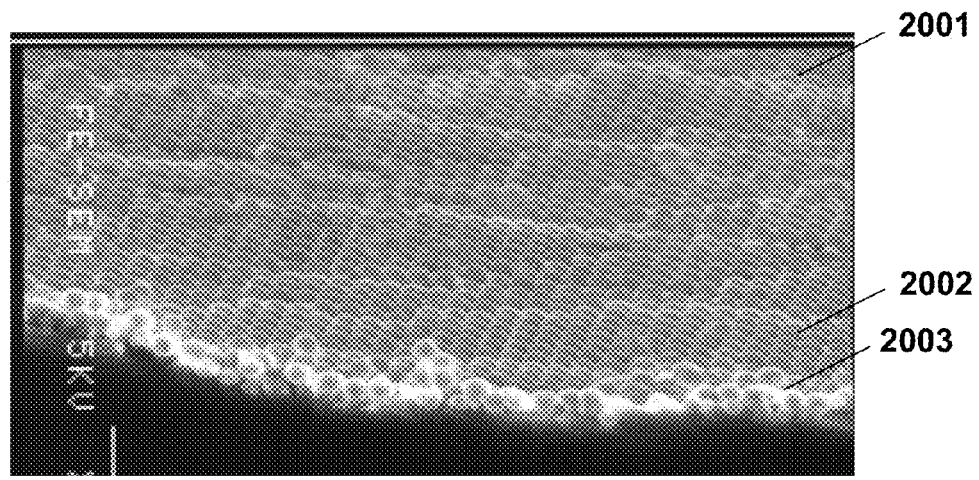
FIG. 20C is a scanning electron micrograph showing a section through titania coated on to a nano-hemispherical polycarbonate embossed template by the embossing and coating process shown in FIG. 19.
Figure 20B:

The differences between the types of nano-structures produced by the first and second processes of the present invention for production of photoactive electrodes is illustrated in FIGS. 20A and 20B. FIG. 20A shows a typical profile of a titania layer formed by deposition on to a shaped substrate having a continuous series of hemicylindrical ridges. The nano-structures are substantially hemicylindrical with no gaps between adjacent ridges. In contrast, FIG. 20B shows a typical profile of a titania layer formed by the acid etching/oxidation second process of the invention. The nano-structures have the form of narrow high aspect ratio, even triangular prisms in some cases, separated by wide lands (scanning electron micrographs of such actual structures are seen in FIGS. 23A, 23B, 24A and 24B).

As discussed, the presently preferred titanium film for use in the first and second processes of the invention is the Grade 1 titanium that is also sold as "99.5% purity annealed titanium foil" 0.25 mm thick by Alfa Aesar, 26 Parkridge Road, Ward Hill Mass. 01835 under Stock No. 10385. Both Grade 1 and Grade 2 foils were also obtained from Allegheny Technologies Incorporated, 1000 Six PPG Place, Pittsburgh, Pa. 15222-5479.

As in many other etching processes, to achieve consistent results in the etching step of the second process of the invention, it is necessary to ensure that the titanium surface is clean and free from grease and other materials which might hinder the etching process. The preferred procedure for ensuring a clean titanium surface is, in this order, a soap and water scrub, an acetone soak, a methanol soak and a distilled water rinse. Ultrasonic cleaning is also used in this procedure.

Figure 23A:
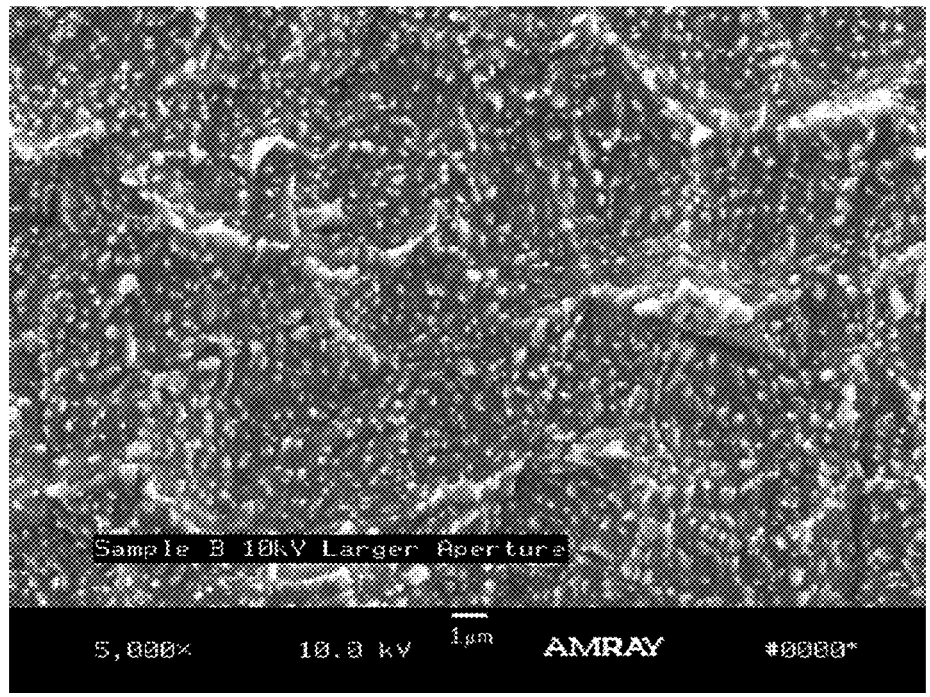
FIGS. 23A and 23B are scanning electron micrographs of nanostructures obtained in the process of the present invention.
Figure 23B:
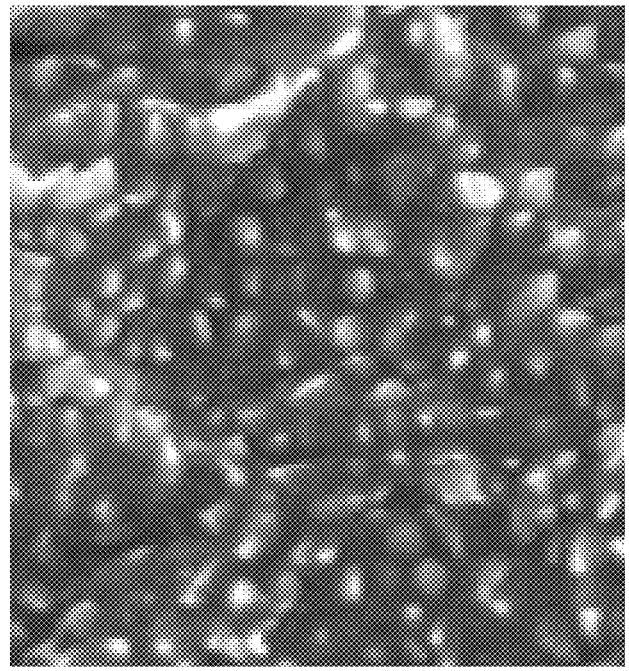
Figure 24A:
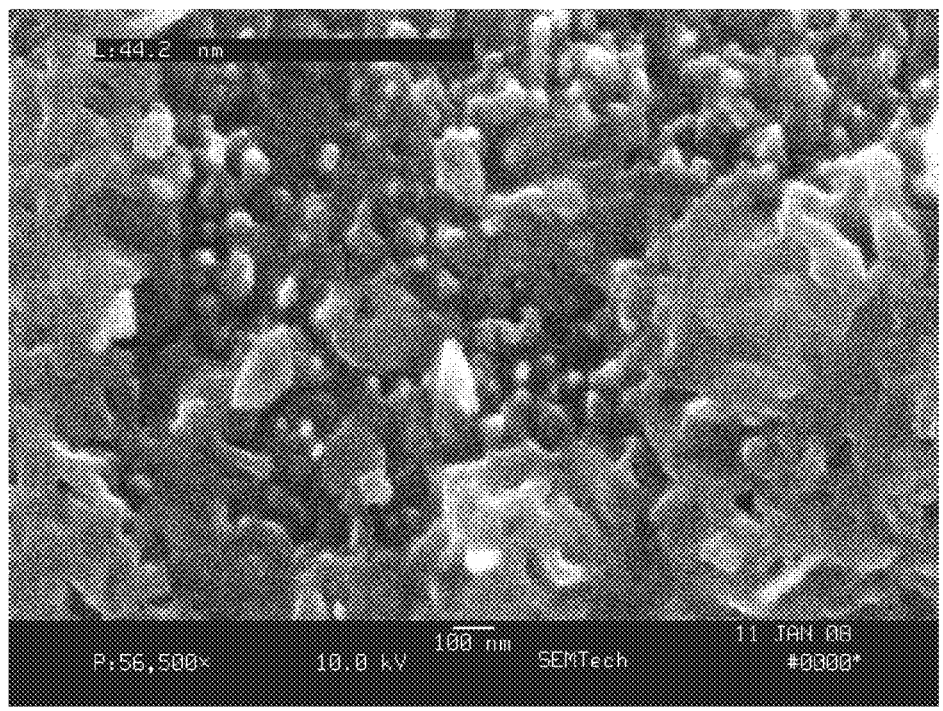
FIGS. 24A and 24B are scanning electron micrographs of nanostructures obtained in the process of the present invention but using a different etching medium from that used to prepare the nanostructures shown in FIGS. 23A-23C.
Figure 24B:
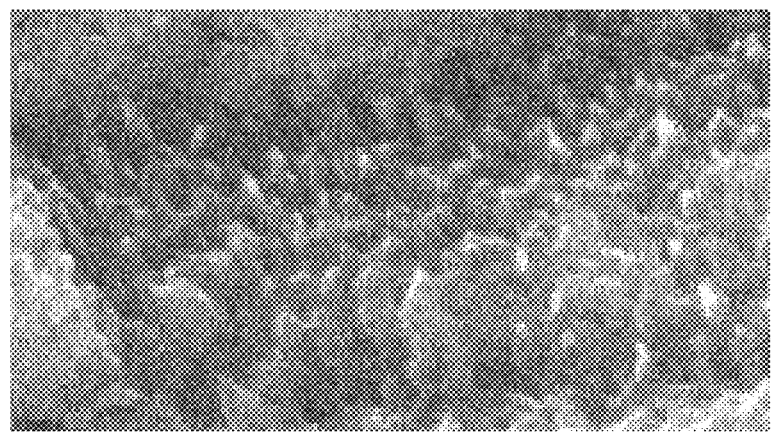

FIG. 22 compares the peak photocurrent, which indicates peak hydrogen production, for titania electrodes produced using several different etching compositions. The photocurrent is shown at zero bias voltage as well as 1 volt bias (direct current) for each recipe. All etching was performed at the optimum temperature and time for that particular etchant, which is typically 80° C. and about 3 minutes for sulfuric acid and 10-15 for hydrochloric acid; the second step of thermal oxidation was constant for all of the samples. It can be seen from FIG. 22 that the best performance is obtained with a sulfuric acid etch at 72% concentration, with the sample etched with hydrochloric acid a close second at 1 VDC bias but better at 0 VDC bias. It is important to ultrasonically clean the hydrochloric acid-etched substrate to obtain best results. Other good etching compositions include etching with sulfuric at 95% concentration, Pirhana etch, and hydrochloric and oxalic acid etches without sonification. FIGS. 23A and 23B show the resulting nanostructures with the sulfuric acid etch, and FIGS. 24A and 24B show the resulting nanostructures with the hydrochloric acid etch. It is important to note that obtaining these particular structures is not random but is the result of substantial empirical work, as it is quite easy to produce nano-tubes and other structures that do not work in the second step of the process of the present invention.

Figure 25:
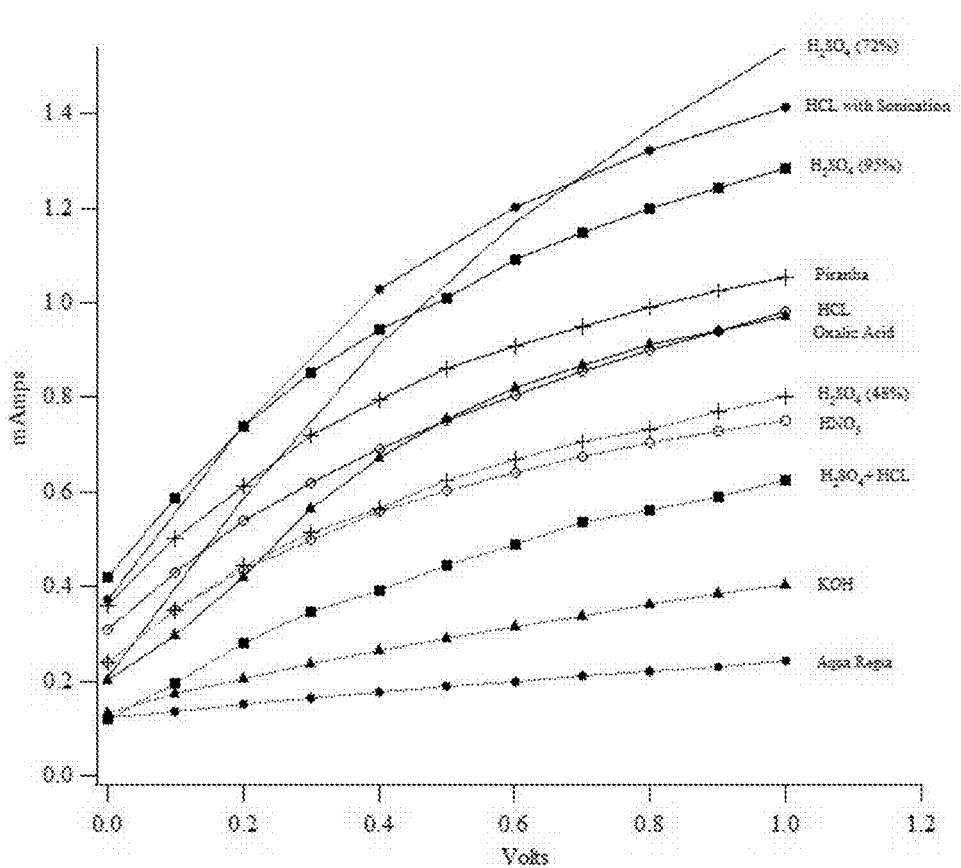
FIG. 25 shows current-voltage curves for the experimental samples graphed in FIG. 22.

FIG. 25 shows the complete IV curves, or current versus voltage plots, for each of the etching compositions used in FIG. 22.

The second step of the process of the present invention is, as already mentioned, at least partial conversion of the titanium film to titania, desirably by a process which ensures at least a significant proportion of the anatase form of titania. This conversion of titanium to titania may be effected by anodizing (i.e., making the titanium the anode in an acid solution) or by oxidation. Although thermal oxidation is presently preferred, the anodizing process is useful in applications where the nano-structured substrate cannot be made heat resistant enough to withstand the thermal oxidation process, and the anodizing process will be described first.

Although electrochemical anodizing of titanium metal to form titania coatings is known, the form of titania produced is typically not the anatase photoactive form. Therefore, in the prior art a titania layer has been formed by anodizing, and then heated to form anatase. This process cannot be carried out on many substrates, and is very energy-consuming. It has now been found that anodizing can produces significant anatase in the resultant titania film, as verified with X-ray diffraction analysis, while not exceeding 80° C.

Although, as in the acid etching step, any acid capable of anodizing titanium metal may be used, the preferred acid is sulfuric acid, used at a dilution such that the pH is in the range of about 1.5 to about 2.5, and preferably about 2. The anodizing may be carried out at a temperature about 60 to about 100° C. and preferably about 80° C. Satisfactory anodization typically requires the use of a voltage in the range of about 70 to about 100 Volts. A voltage of this order is not a problem when anodizing the surface of thick titanium samples. However, for some applications for this invention, such as air or water purification, it is preferred to apply a thin coating or film of titanium to a nano-structured substrate. This is because the large areas required for lining air ducts, for example, for air purification would be cost-prohibitive even using Grade 1 or Grade 2 titanium foils. On the other hand, the roll-to-roll manufacturing process can economically coat a web of polycarbonate with a thin film of titanium in a box vacuum coater. That titanium coated substrate can then be run through an anodizing bath to effect the titania film atop the titanium base film. When that substrate is polycarbonate, for example, or other electrically insulating and non-heat resistant substrate, anodizing this preferred thin titanium film with the present process often damaged the substrate by resistance heating and/or arcing during anodizing, the heat from which in turn would damage the substrate (cracking glass substrates or melting polycarbonate substrates). It was found that damage to thin films caused by arcing or other undesirable effects caused by rapid voltage changes could be avoided by ramping the voltage to its final value, rather than increasing the voltage stepwise. Alternatively, a short power ramped step could be followed by a longer duration voltage ramped step. An optimum voltage ramp followed the formula:

$$V = V_{Final}(1 - e^{-at})$$

where a is an arbitrary constant.

The presently preferred anodizing step uses a voltage ramp of this type with:

$$V_{Final} = 80 \text{ Volts}$$

$$a = 0.4$$

total time=1 hour.

The electrolyte was dilute sulfuric acid, pH 2.0 at 80 degrees C. $V_{Final}$ equal to 80 Volts was optimum, but a range between 70-95 Volts resulted in samples not significantly lower in quality for use as photoactive electrodes. Above 90 Volts, the "a" parameter was typically reduced to 0.05 to slow down the voltage rise time to prevent current limitation with the power supply used, which was a KEPCO ATE 150-7M power supply (available from Kepco, Inc. 131-38 Sanford Avenue, Flushing N.Y. 11355).

Substrate pretreatment was found to have only a minor impact on the final topography of the anodized films. AFM (Atomic Force Microscopy) results indicated that the final surface looked nearly identical regardless of pretreatment, whether etching, mechanical polishing, or electro-polishing. (The mechanical polishing and electro-polishing in this case were not alternatives to acid etching for forming the nano-structures, but were rather included as an experimental control, which was a smooth surface). Nevertheless, the substrate pretreatment did improve the band-gap shift for this application by shifting it into the visible.

Figure 26A:
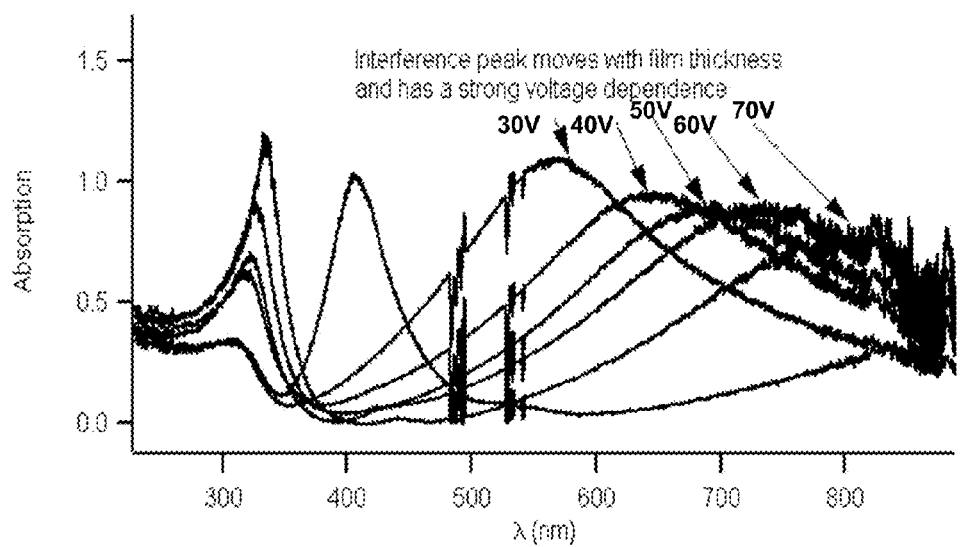
FIG. 26A is a graph showing the change in absorption over the range of 250 to 900 nm with anodizing at varying voltages of a titanium film.
Figure 26B:
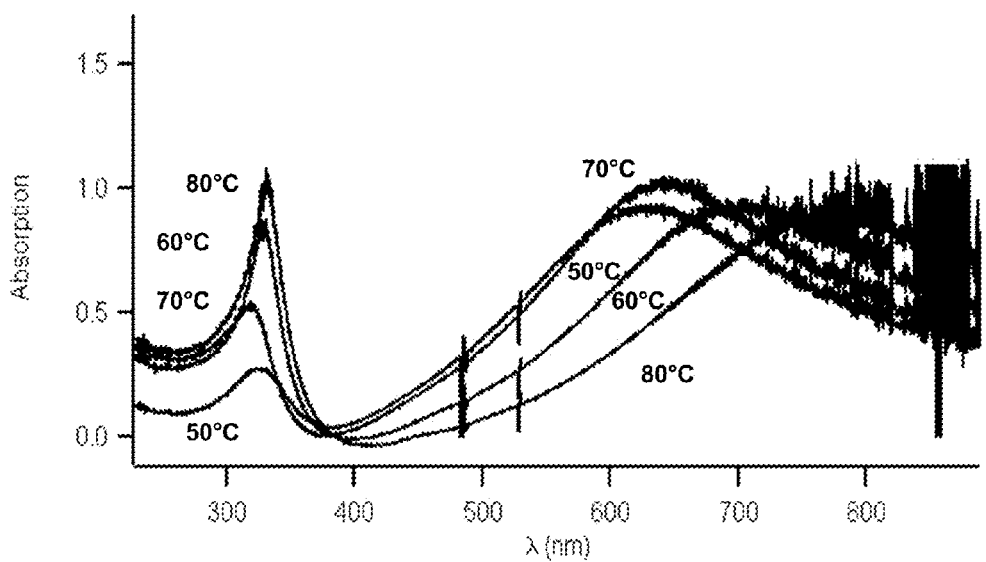
FIG. 26B is a graph similar to that of FIG. 26B but showing the change in absorption at varying anodizing temperatures.
Figure 27:
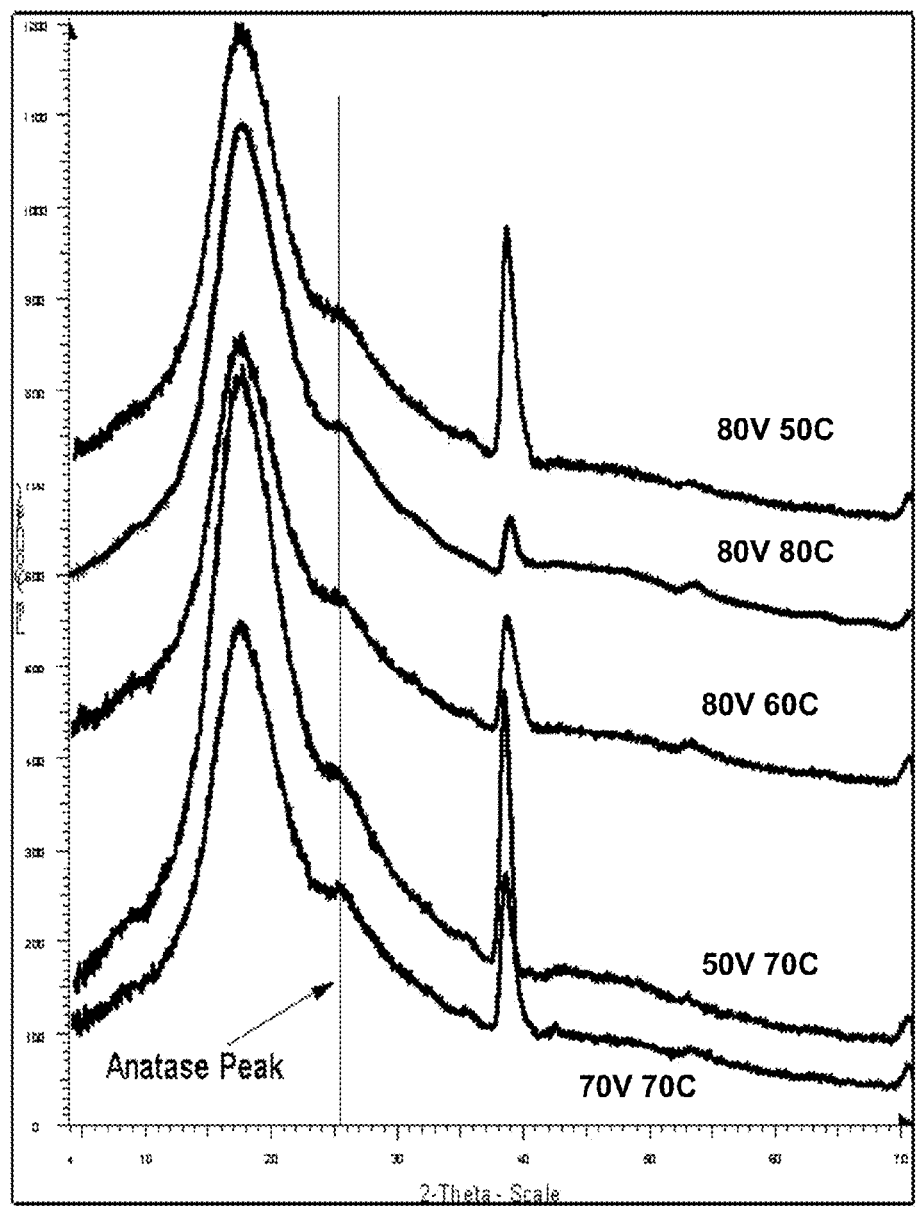
FIG. 27 is a graph showing the growth of the anatase peak with varying combinations of anodizing voltage and temperature.

The effects of anodizing temperature and voltage are illustrated in FIGS. 26, 27 and 28. The aforementioned Alfa Aesar titanium films were acid etched using the preferred sulfuric acid etch described above, and were then anodized using the preferred sulfuric acid medium and ramped operating voltage, but with varying final voltages. The optical absorption of each film was then measured over the range of 250 to 900 nm. FIG. 26A shows the results obtained using final voltages of 30, 40, 50, 60, 70 and 80 V, all at a temperature of 70° C. FIG. 26B shows the results obtained using temperatures of 50, 60, 70 and 80° C., all at a final voltage of 80 V. From FIG. 26A, it will be seen that as the final voltage is increased, the absorption interference peak, which depends upon the thickness of the titania film produced by anodizing, increases in height and shifts to shorter wavelengths. Similarly, FIG. 26B shows that as the temperature increases the absorption interference peak increases in height and shifts to shorter wavelengths. The resultant ability to control the absorption peak by control of the temperature and final voltage of anodizing allow fine tuning of the absorption peak to coincide with the bandgap of the titania produced by anodization, thus improving the efficiency of the photoactive electrode.

FIG. 27 shows X-ray diffraction patterns of titanium films anodized at various temperatures and voltages as noted in the Figure; the anatase peak (or rather shoulder) is marked. FIG. 27 indicates that the amount of anatase produced increases with increases in anodizing temperature and voltage.

Figure 28A:
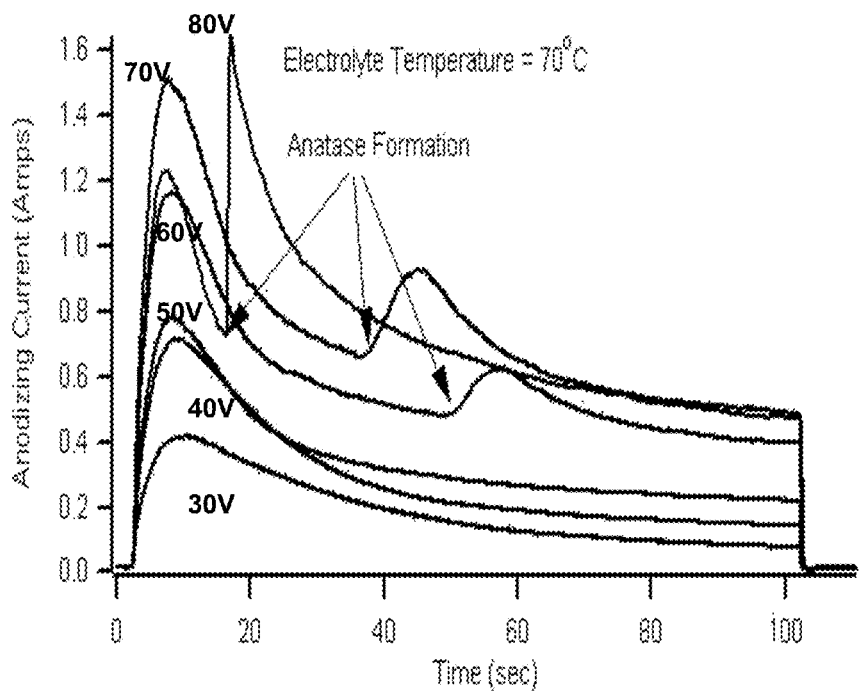
FIG. 28A is a graph showing the onset of anatase formation at varying voltages of a titanium film.
Figure 28B:
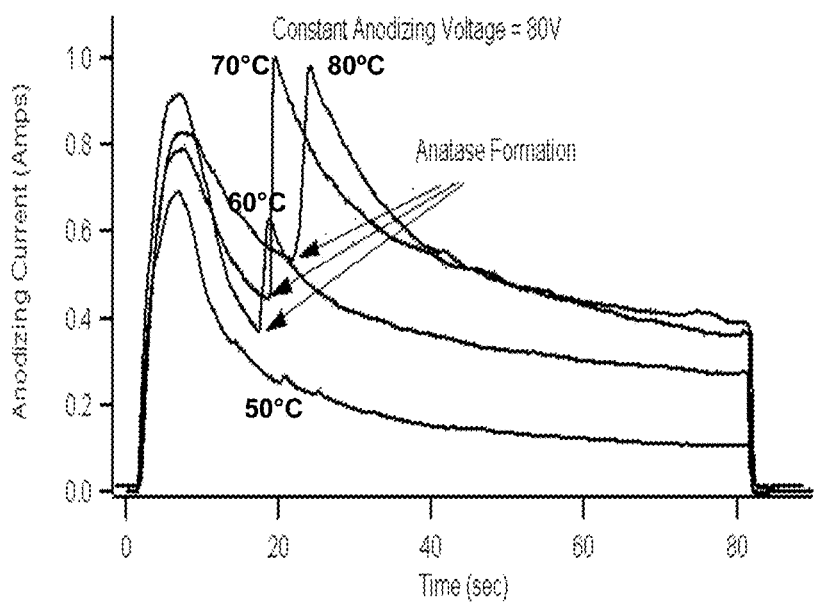
FIG. 28B is a graph similar to that of FIG. 28A but showing the onset of anatase formation at varying anodizing temperatures.

FIGS. 28A and 28B are graphs showing the variation of anodizing current with time for (in FIG. 28A) a constant electrolyte temperature of 70° C. and various applied voltages, and (in FIG. 28B) a constant voltage of 80 V and various electrolyte temperatures. The onset of anatase formation is indicated by a sudden increase in anodizing current, and is marked by the arrows in FIGS. 28A and 28B. FIG. 28A shows no anatase formation at 30, 40 and 50 V, and shows that at higher voltages the onset of anatase formation begins more quickly the higher the applied voltage. FIG. 28B shows no anatase formation at 50° C., and that at higher temperatures anatase formation begins more slowly with increasing temperature.

Figure 29:
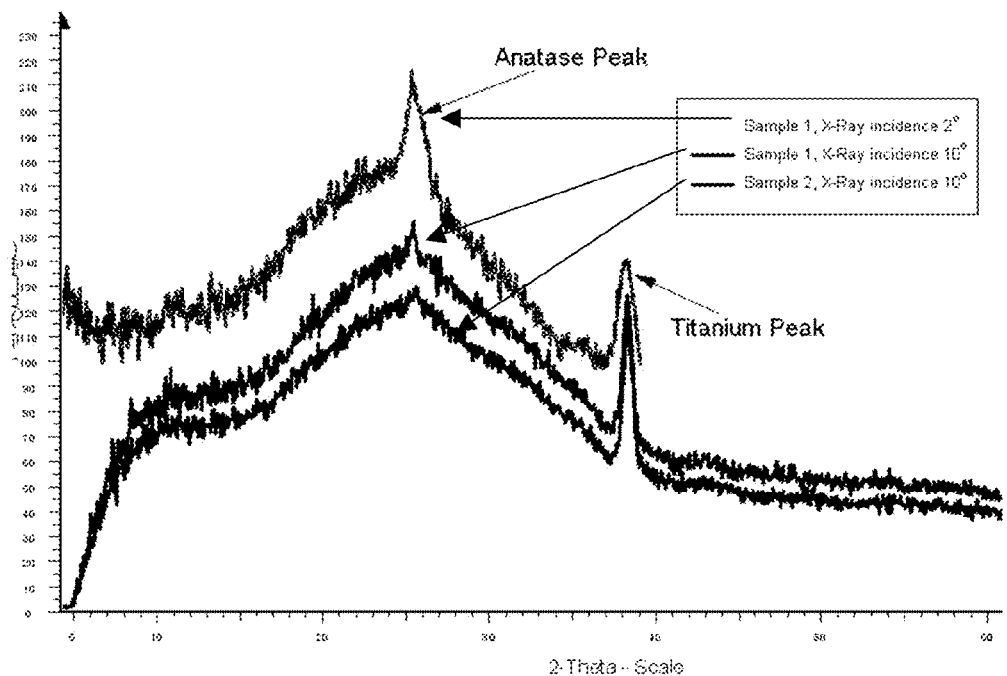
FIG. 29 shows X-ray diffraction patterns for three different anodized titanium film and illustrates the presence of anatase in all three films.

Finally, FIG. 29 shows X-ray diffraction scans of two different anodized films. All three scans confirm that both titanium metal and anatase is present in the anodized films.

As already indicated, the preferred anodizing process requires a complicated, asymptotic voltage against time profile, and to enable such a profile to be followed accurately, a software-controlled interface has been developed that that allows a conventional power supply, such as the aforementioned KEPCO ATE 150-7M power supply, to output arbitrary voltage or current waveforms. The waveforms may be designed by the user through a library of adjustable waveforms or via imported data files. The complete system allows arbitrary voltage or current waveforms to be applied to loads that require more power than commercially available arbitrary waveform generators can generally produce. Software control of the anodizing waveform is needed for two reasons:

1. The power required to produce the anodizing voltage (or current) increases proportionally with the area of the titanium to be anodized. It is desirable to retain the flexibility of arbitrary waveform generation when the load draws high power. Typically, arbitrary waveform generators are not designed for high power applications.

2. Process repeatability is enhanced through software control. It is desirable to create a system capable of reproducing the timing and magnitude of the anodizing waveform to a degree of accuracy that is more sensitive than the dynamics within the anodizing cell. Therefore, the user can be confident that different samples are produced with anodizing waveforms that are virtually identical.

Before these goals were met, the anodizing process was limited by the use of a DC power supply that could produce only constant voltage or current outputs. The optimization of the anodizing waveform was therefore restricted to the magnitude and duration of a square pulse. To achieve these goals, two commercially available instruments were integrated through custom software written in Igor Pro. The first component was the aforementioned KEPCO ATE-7M power supply equipped with controllable output by two analog voltage inputs. The second component was a Stanford Research Systems model SR830 lock-in amplifier, the auxiliary outputs of which were used to supply control voltage inputs to the power supply. The SR 830 is completely controllable via a GPIB (General Purpose Interface Bus) interface to a computer with controlling software. The complete system is therefore IGOR Pro software (WaveMetrics, Inc., 10200 SW Nimbus Ave., Suite G-7, Portland, Oreg. 97223) that controls the lock-in amplifier, that in turn controls the KEPCO power supply that produces the system output. The KEPCO power supply is rated for a maximum output of 1050 Watts at 150 volts and seven amperes, which comfortably exceeds the power required for the anodizing application. Additionally, the controllable output achieves the arbitrary waveform generation requirement. The auxiliary voltage outputs of the lock-in amplifier are software controllable to 1 mV. When controlled by an external voltage source, the KEPCO operates as an inverting amplifier with a gain of 15; the magnitude of the system output is then controllable to 15 mV. The speed of lock-in amplifier response to control commands, although not explicitly specified, exceeds the rates at which the commands can be sent. Timing of the control waveform is then limited by the computer processor, which executes the timing loops of the IGOR code. These specifications for accuracy of the output waveform meet the reproducibility objective stated earlier.

The IGOR Pro code serves as the main controller of the system output in two respects. The background tasks of the code manage the GPIB communication with the lock-in amplifier, making the code responsible for the magnitude and timing accuracy of the system output. Secondly, two user-friendly GUIs (Graphic User Interfaces) allow the generation of arbitrary waveforms for the system output. The program provides a library of waveforms that the user can appropriately alter to produce nearly any desired waveform through a piecewise concatenation process. Use of standard Igor data importing capabilities can be used as an additional source for waveforms that have been recorded to file. The overall system behaves similarly to a commercially available arbitrary waveform generator. However, it is unique in its output capabilities that are tailored to anodizing systems. The complete system provides a highly versatile, yet simple, environment for anodizing experimentation. Anodizing systems generally require higher power than is available directly from a waveform generator. By controlling the output of a KEPCO DC power supply, high frequency performance is sacrificed to gain much higher output power.

The software that generates the anodizing waveforms has unique features. The library of adjustable waveforms may be expanded programmatically to include additional waveforms that are of specific interest to anodizing systems. In addition, since the software is customized for this system, the output waveform may be automatically scaled to serve as proper control input signals for the KEPCO ATE supply. Testing the system accuracy is a simple matter of comparing the desired output to the real output. The real output is recorded by an oscilloscope or chart recorder and loaded into the Igor software. Visual inspection is generally adequate to determine if the output matches the input. The known sources of error include:

1. Timing errors from software; the main challenge of the software is to properly manage the delay between points (dt) of the output waveform. The minimum dt limits the highest frequency of the waveform achievable at the output. The output accuracy degrades as the waveform frequency increases, and manifests itself as output that appears discretized.
2. Hardware limitations; as described previously, the voltage magnitude is controllable to within 15 mV due to the 1 mV accuracy of the SR830 voltage source. Other sources of error are due to limitations of the power supply. These errors are typically negligible but may be noticeable for large step changes in voltage due to the finite response time of the supply. The power supply may be configured to have a faster response time, but the output will be more oscillatory.

Figure 30:
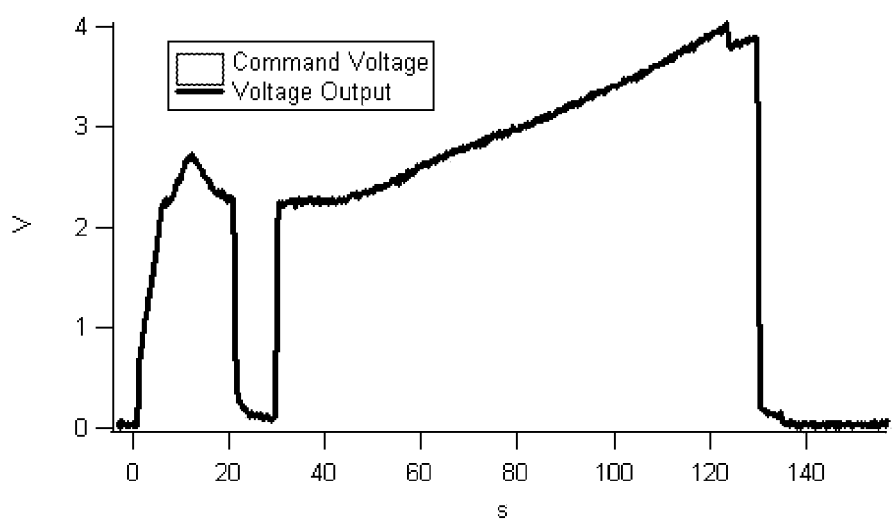
FIG. 30 shows the command voltage and the actual voltage output achieved during an anodizing process of the invention using the preferred voltage control apparatus and power supply described below.

The accuracy of the voltage control which can be achieved with the preferred system described above can be seen from FIG. 30, in which the blue line represents the (complex) recorded voltage waveform of successful anodization process derived empirically and recorded on a computer-based chart recorder, while the red area represent the results of using the same waveform to drive the preferred system described above and measuring the output of the power supply during an anodizing process. It will be seen that the original waveform and the final controlled output are identical.

Preferred processes for heat oxidation of acid etched titanium films to titania films containing anatase will now be described. One problem with heat oxidation of titanium films is that the desired anatase crystal form begins to form at about 450° C. in air, but at this temperature the rate of oxidation is too low to be practically useful. At about 700° C., the rate of oxidation becomes rapid enough for large scale production processes, but the rutile crystal form typically predominates. However, it has now been found that titania films, containing a sufficient proportion of anatase to act as efficient photoactive catalysts, can be produced by heating acid etched titanium films in air, with or without added oxygen, to about 700° C. for a relatively brief period of less than about 1 hour, and desirably in the range of about 20 to about 45 minutes; the optimum heating period appears to be typically about 30 to about 35 minutes, which results in good anatase formation. Excessive heating times tend to lead to a high proportion of the undesirable rutile crystal form. It has been found that heating to about 700° C. for a relatively brief period produces photoactive electrodes with high efficiency and long operating lifetimes. The process is highly versatile, allowing formation of titania films containing varying proportions of amorphous titania, anatase and rutile. The quality of the titania films produced is more sensitive to variations in the acid etching step and the heat oxidation step than is the case where acid etching is followed by anodization.

Such heating of acid etched titanium films will typically be carried out in a furnace; one furnace which has been found to give good results is a Barnstead Thermoline Model FB1315M, available form Barnstead International, 2555 Kerper Boulevard, Dubuque Iowa 52001-1478. A tubular furnace may alternatively be used. It is desirable that the furnace be modified to allow gases, such as nitrogen and oxygen to be introduced into the heating chamber of the furnace. The temperature and the time of heating have the most significant impact on the quality of the final photoactive electrode, and electrode quality is highly sensitive to these variables.

Figure 31:
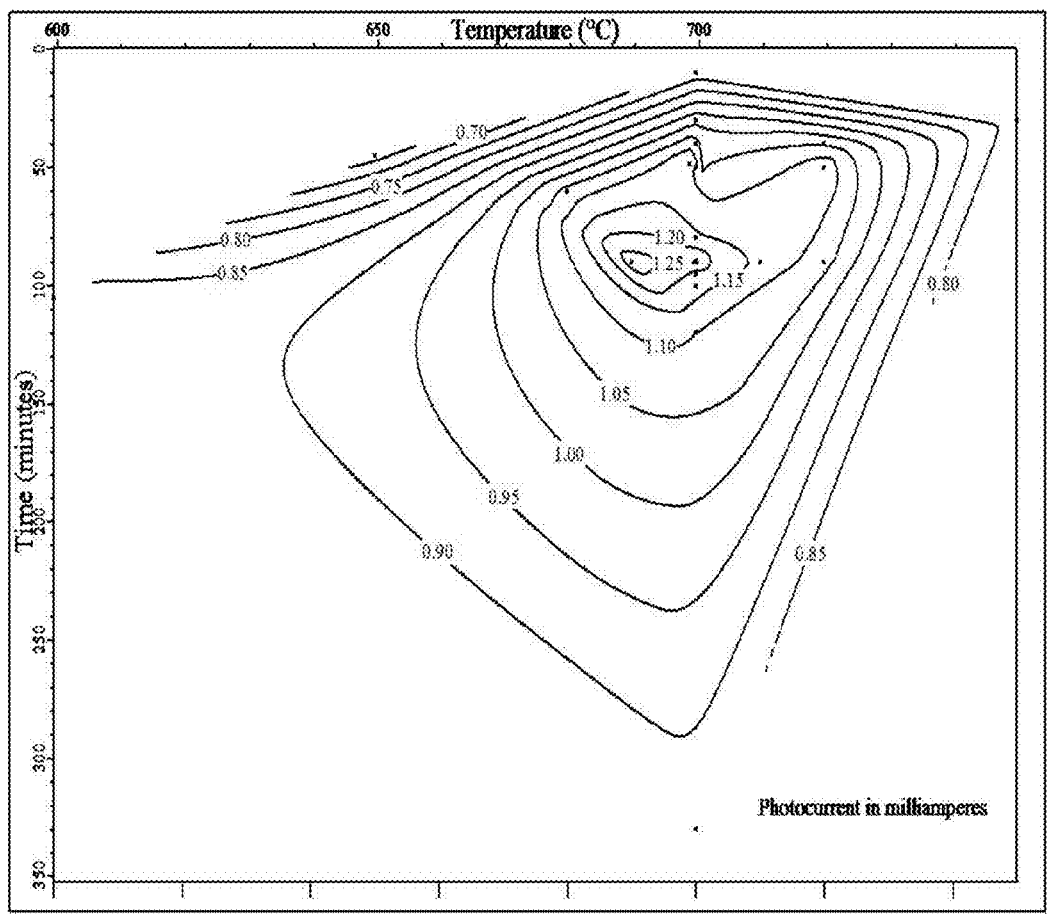
FIG. 31 is a three-dimensional graph showing the variation of photocurrent obtained from titania electrodes of the present invention as a function of the time and temperature of the thermal oxidation step of the process used to prepare the titania electrodes.

Typically, the acid etched titanium film is introduced into the furnace at a temperature lower than the actual heat treatment temperature of 690° C.; for example, the films may be added to the furnace at 500° C. The furnace temperature is then raised to the actual heat treatment temperature; the titania films produced do not appear to be very sensitive to either the temperature at which the titanium films are introduced to the furnace or the rate at which the furnace temperature is raised. Timing of the heat treatment begins only after the furnace has reached the desired heat treatment temperature. For small films of 1.5 cm by 2.5 cm, the air within the furnace provides sufficient oxygen for titania formation but with larger films, such as a coil of a 6 cm by 100 cm strip, it is desirable to introduce additional oxygen into the furnace to ensure that there is enough oxygen to form the desired thickness, uniformity and stoichiometry of the titania layer. It has been found that, in the case of the preferred commercial furnace mentioned above, introducing oxygen at a rate of 5 standard cubic feet per hour (about 142 liters per hour) provides enough oxygen to ensure proper titania formation. FIG. 31 shows that the highest photocurrent is obtained with the peak temperature at 690° C. for 90 minutes. However, since a decrease in peak photocurrent by even 25% is still commercially viable, the contour in FIG. 31 corresponding to 0.9 mA shows that the temperature can be 635 to 735° C. at corresponding times of 135 minutes to 40 minutes respectively. Allowing for a decrease in peak photocurrent of 33% to 0.8 mA includes times as short as 10 minutes at 700° C. and temperatures as high as 745° C. for 30 minutes. The full range of acceptable or commercially viable recipes of time versus temperature are shown in FIG. 31.

After the heat treatment, the films can simply be removed from the oven and allowed to stand in air to cool to ambient temperature. The rate of cooling has not been shown to have any measurable effect on the quality or efficiency of the final photoactive electrodes.

Example 1

This Example illustrates the effects of illumination conditions, bias voltage and temperature on the efficiency of hydrogen production and conversion efficiency of an apparatus as shown in FIGS. 1-2 and 7.

An apparatus as described above with reference to FIGS. 1-2 and 7 was subjected to artificial solar illumination conditions of AM 1.5 and AM 0.0, where AM means Air or Atmospheric Mass, the amount of atmosphere through which the sunlight must travel to reach the ground. So, AM 1.5 is typical for sea level conditions, while AM 0.0 is for a "space" application such as orbiting satellites. with the core assembly 116 maintained at either 25 or 80° C. and with varying bias voltages applied between the photoactive anode 226 and the cathode 220. In these tests, the bias voltage was not supplied by the photovoltaic strip 602 (FIG. 7) in order to permit the illumination of the photovoltaic strip and the bias voltage to be controlled independently. FIG. 32A shows the rate of hydrogen production (measured as the current passing between the electrodes) as a function of bias voltage at 25° C., while FIG. 32B shows the conversion efficiency as a function of bias voltage. FIGS. 32C and 32D parallel FIGS. 32A and 32B respectively but relate to measurements at 80° C.

From FIGS. 32A-32D, it will be seen that the rates of hydrogen production and conversion efficiency at 80° C. are more than double those at 25° C., and this improved performance with temperature is one major reason for constructing the apparatus so that it is able to operate at elevated temperatures. The improved performance at higher temperatures can be attributed to both bandgap shift and easier electrolysis. In all cases, hydrogen production increases with increasing bias voltage although under low illumination conditions the increase is small. Conversion efficiency tends to increase with bias voltage but eventually reaches a maximum value and thereafter declines.

Example 2

Figure 33:
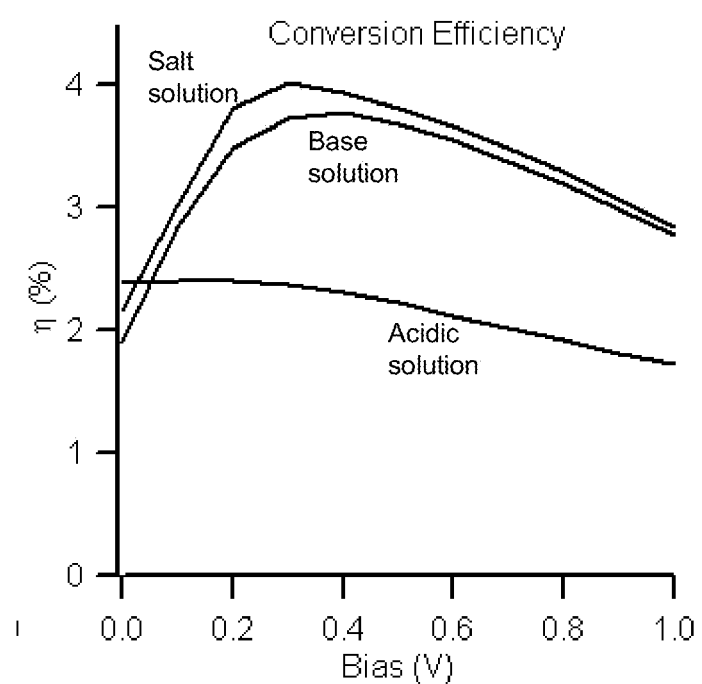
FIG. 33 is a graph showing the conversion efficiency of an apparatus as shown in FIGS. 1, 2 and 7 under varying bias voltage supplied by the photovoltaic strip therein, as a function of electrolyte recipe.

This Example illustrates (see FIG. 33) the effects of bias voltage on conversion efficiency of an apparatus as shown in FIGS. 1, 2 and 7, as a function of the electrolyte composition. The best results, i.e. highest hydrogen production efficiency, are obtained with either an acidic electrolyte or a salt water electrolyte. The basic potassium hydroxide electrolyte performs best at zero voltage bias, but underperforms at higher voltage bias.

The photoactive titania electrodes of the present invention can be used in any application in which photoactive titania electrodes have hitherto been used, as discussed in detail in the aforementioned parent application.

In summary, this invention provides for shifting the optical bandgap of a semiconductor into longer optical wavelengths by stressing the semiconductor, where the semiconductor is a thin film, and where the stress is strain caused by some or all of the following: conditions under which the thin film is formed, the shape of the substrate on a nano and micro scale, and the mechanical, chemical, and thermal properties of the substrate. Titania is the preferred semiconductor photocatalytic embodiment, but the invention applies to any semiconductor that is photo-active, such as silicon, germanium, and their alloys, and compounds that include, in addition, gallium. The stress-inducing template profiles also provide a mechanical lock to the coating so that the stress can exist without causing delamination of the coating from the substrate.

The aqueous source of hydrogen for the photoelectrolysis to act on can be water, sea water, an aqueous solution with electrolytes, or non-aqueous hydrogen-bearing liquids such as methanol or gasoline.

While the invention has been described with reference to particular embodiments, it will be understood that the present invention is by no means limited to the particular constructions, and methods herein disclosed and/or shown in the drawings, but also comprises any modifications or equivalents within the scope of the claims. For example, the apparatus of the present invention shown in FIGS. 1, 2 and 7 has a core assembly with cylindrical geometry, and tracks the sun by rotation about one axis. It will readily be apparent that this apparatus could use a core assembly with substantially spherical geometry (alternatively a planar core assembly could be used) which tracks the sun by rotation about two perpendicular axes. While a spherical core requires additional tracking of the sun, it allows for higher solar concentration than a cylindrical core so that smaller reflectors and/or core assemblies can be used. Other modifications of the specific apparatus described above will readily be apparent to those skilled in the art of light-powered photolysis and similar technologies.

The invention claimed is:

1. A process for producing a photoactive titania electrode, the process comprising:
   a. etching titanium metal to form a titanium nano-structured surface on said titanium metal, said nano-structured surface having nanostructures of mean diameter about 100 nm and with high aspect ratio of at least 1:1, the nanostructures being spaced apart from one another;
   b. forming a titania film by oxidizing said titanium nano-structured surface by at least one of
      i. anodizing in an anodizing solution, and
      ii. heating in an oxygen-containing atmosphere,
   wherein the resulting titania film is stressed by said nanostructures and where said stress causes the titania film to have a lower bandgap than unstressed titania.

2. A process according to claim 1 wherein the stress in the titania film is tensile stress.

3. A process according to claim 1 in which, in step (ii), said heating is effected by a furnace or tubular furnace which allows gases to be introduced into the heating chamber.

4. A process according to claim 1 in which Grade 1 or 2 titanium is used.

5. A process according to claim 1 where said stress in said titania film is at least about 1 gigapascal.

6. A process according to claim 1 in which said etching step (a) is effected using sulfuric acid of a concentration of from about 93 to about 98 percent by weight at a temperature in the range of about 75 to 85° C. for a period of time of from about 60 to about 600 seconds from the onset of visible bubbling.

7. A process according to claim 6 in which the etching is effected for about 210 seconds from the onset of bubbling and at a temperature of about 80° C.

8. A process according to claim 1 wherein the titanium metal used is in the form of a film, foil, or sheet from about 0.1 to about 1 mm thick.

9. A process according to claim 1 wherein the titania film obtained comprises a major proportion of anatase, with or without rutile.

10. A process according to claim 1 in which said heating step (ii) is effected at a temperature of about 690° C. for a period of about 90 minutes.

11. A process according to claim 1 in which said heating step (ii) is effected at a temperature of about 700 to about 745° C.

12. A process according to claim 1 wherein step (b) is effected by anodizing at a voltage which increases with time.

13. A process according to claim 12 wherein the voltage increases with time substantially according to the equation:

$$V = V_{Final}(1 - e^{-at})$$

where a is an arbitrary constant.

14. A process according to claim 13 in which the anodizing step (i) is effected in pH 2 dilute sulfuric acid electrolyte at a temperature of about 80° C., where $V_{Final}$ is about 80 V, a is about 0.4, and t is about one hour.

15. A process to form photoactive anatase having a lower bandgap than unstressed anatase in which a titanium surface is first imbued with stress-inducing nano-structures in an etch process, said nanostructures having a mean diameter about 100 nm and a high aspect ratio of at least 1:1, the nanostructures being spaced apart from one another, and said nano-structured titanium surface is then heat oxidized at a temperature of about 690 to about 745° C. in an oxidizing atmosphere to convert said nano-structured titanium surface into a substantially anatase layer, wherein said stress-inducing nanostructures are the cause of said lower bandgap.

* * * * *